US010347357B2

(12) United States Patent
Koker et al.

(10) Patent No.: US 10,347,357 B2
(45) Date of Patent: Jul. 9, 2019

(54) POST-PACKAGING ENVIRONMENT RECOVERY OF GRAPHICS ON-DIE MEMORY

(71) Applicant: Intel Corporation, Santa Clara, CA (US)

(72) Inventors: Altug Koker, El Dorado Hills, CA (US); Travis T. Schluessler, Hillsboro, OR (US); Ankur N. Shah, Folsom, CA (US); Abhishek R. Appu, El Dorado Hills, CA (US); Joydeep Ray, Folsom, CA (US); Jonathan Kennedy, Bristol (GB)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 15/495,143

(22) Filed: Apr. 24, 2017

(65) Prior Publication Data

US 2018/0308561 A1 Oct. 25, 2018

(51) Int. Cl.

| | |
|---|---|
| ***G11C 29/00*** | (2006.01) |
| ***G11C 29/44*** | (2006.01) |
| ***G11C 29/52*** | (2006.01) |
| *G11C 17/18* | (2006.01) |
| *G11C 29/12* | (2006.01) |
| *G11C 29/36* | (2006.01) |
| *G11C 29/04* | (2006.01) |

(52) U.S. Cl.

CPC .......... *G11C 29/4401* (2013.01); *G11C 29/52* (2013.01); *G11C 29/72* (2013.01); *G11C 29/787* (2013.01); *G11C 29/81* (2013.01); *G11C 17/18* (2013.01); *G11C 29/12* (2013.01); *G11C 29/36* (2013.01); *G11C 2029/0401* (2013.01); *G11C 2029/0403* (2013.01)

(58) Field of Classification Search

None

See application file for complete search history.

(56) References Cited

U.S. PATENT DOCUMENTS

| | | | | |
|---|---|---|---|---|
| 6,922,798 | B2 * | 7/2005 | Nemani ............... | G11C 29/808 714/710 |
| 7,346,815 | B2 * | 3/2008 | Nowicki ............... | G11C 29/38 365/201 |
| 9,129,443 | B2 | 9/2015 | Gruen et al. | |
| 9,165,399 | B2 | 10/2015 | Uralsky et al. | |

(Continued)

OTHER PUBLICATIONS

Nicholas Wilt, "The CUDA Handbook: A Comprehensive Guide to GPU Programming", 522 pages, Jun. 2013, Addison-Wesley, USA.

(Continued)

*Primary Examiner* — Daniel F. McMahon

(74) *Attorney, Agent, or Firm* — Jordan IP Law, LLC

(57) ABSTRACT

Systems, apparatuses and methods provide for technology that identifies a redundant portion of a packaged on-die memory and detects, during a field test of the packaged on-die memory, one or more failed cells in the packaged on-die memory. Additionally, the technology identifies whether the redundant portion includes one or more remaining memory cells, and in response to an identification that the redundant portion includes the one or more remaining memory cells, the one or more remaining memory cells in the redundant portion are substituted for the one or more failed memory cells.

24 Claims, 34 Drawing Sheets

(56) References Cited

U.S. PATENT DOCUMENTS 9,177,413 B2 11/2015 Tatarinov et al.
9,241,146 B2 1/2016 Neill
9,262,797 B2 2/2016 Minkin et al.
9,342,857 B2 5/2016 Kubisch et al.
9,355,483 B2 5/2016 Lum et al.
9,437,040 B2 9/2016 Lum et al.
9,646,720 B2 * 5/2017 Yang .................. H01L 25/0657
2009/0249237 A1 * 10/2009 Jundt ................ G05B 19/0426 715/769
2013/0113803 A1 5/2013 Bakedash et al.
2014/0118351 A1 5/2014 Uralsky et al.
2014/0125650 A1 5/2014 Neill
2014/0168035 A1 6/2014 Luebke et al.
2014/0168242 A1 6/2014 Kubisch et al.
2014/0168783 A1 6/2014 Luebke et al.
2014/0218390 A1 8/2014 Rouet et al.
2014/0253555 A1 9/2014 Lum et al.
2014/0267238 A1 9/2014 Lum et al.
2014/0267315 A1 9/2014 Minkin et al.
2014/0292771 A1 10/2014 Kubisch et al.
2014/0347359 A1 11/2014 Gruen et al.
2014/0354675 A1 12/2014 Lottes
2015/0002508 A1 1/2015 Tatarinov et al.
2015/0009306 A1 1/2015 Moore
2015/0022537 A1 1/2015 Lum et al.
2015/0049104 A1 2/2015 Lum et al.
2015/0130915 A1 5/2015 More et al.
2015/0138065 A1 5/2015 Alfierri
2015/0138228 A1 5/2015 Lum et al.
2015/0170408 A1 6/2015 He et al.
2015/0170409 A1 6/2015 He et al.
2015/0187129 A1 7/2015 Sloan
2015/0194128 A1 7/2015 Hicok
2015/0264299 A1 9/2015 Leech et al.
2015/0317827 A1 11/2015 Crassin et al.
2016/0048999 A1 2/2016 Patney et al.
2016/0049000 A1 2/2016 Patney et al.
2016/0071242 A1 3/2016 Uralsky et al.
2016/0071246 A1 3/2016 Uralsky et al.
2017/0371560 A1 * 12/2017 MacGarry ............. G06F 3/0604
2018/0095823 A1 * 4/2018 Fahim ................. G06F 11/1072

OTHER PUBLICATIONS

Shane Cook, "CUDA Programming: A Developer's Guide to Parallel Computing with GPUs", 591 pages, 2013, Elsevier, USA.

* cited by examiner

FIG. 8
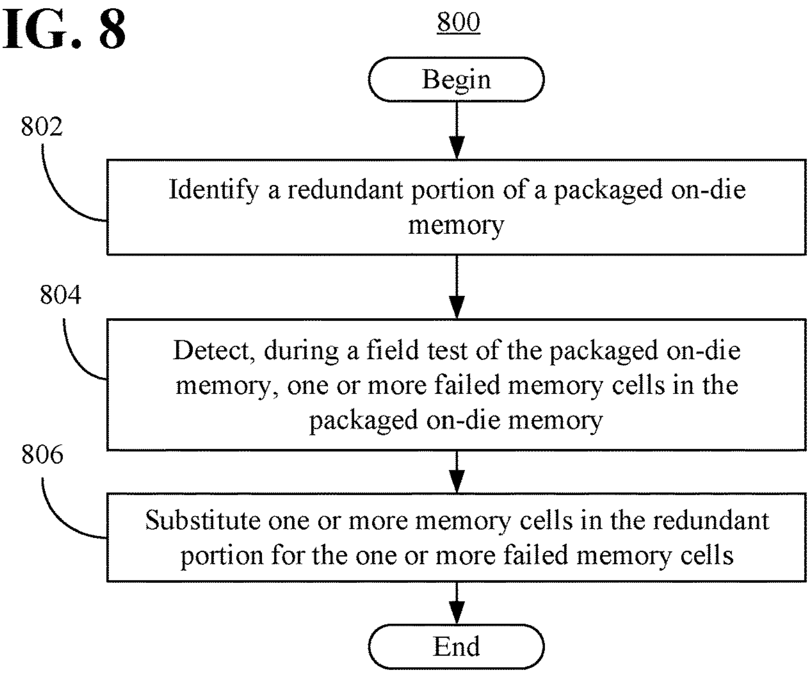
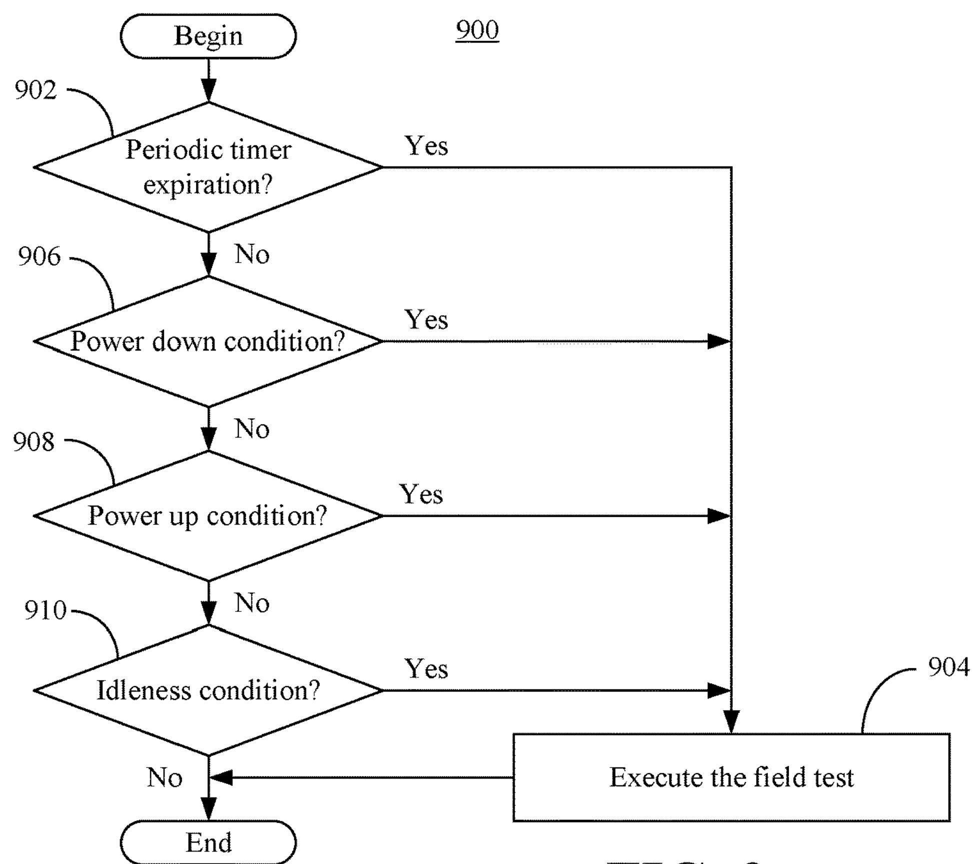
FIG. 9

IP CORE DEVELOPMENT - 2600

POST-PACKAGING ENVIRONMENT RECOVERY OF GRAPHICS ON-DIE MEMORY

TECHNICAL FIELD

Embodiments of the present application generally to graphics processing architectures. More particularly, embodiments relate to field recovery of graphics on-die memory.

BACKGROUND OF THE DESCRIPTION

Graphics processing units (GPUs) may contain relatively large and dense caches to support highly parallelized execution. The density and size of the GPU caches may make them vulnerable to failure, particularly over time (e.g., after deployment in the field). While error correction code (ECC) solutions may address GPU cache failure concerns to some extent, there remains considerable room for improvement.

BRIEF DESCRIPTION OF THE DRAWINGS

The various advantages of the embodiments will become apparent to one skilled in the art by reading the following specification and appended claims, and by referencing the following drawings, in which:

FIG. 8 is a flowchart of an example of a method of operating a semiconductor package apparatus according to an embodiment;

FIG. 9 is a flowchart of an example of a method of scheduling a field test according to an embodiment;

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
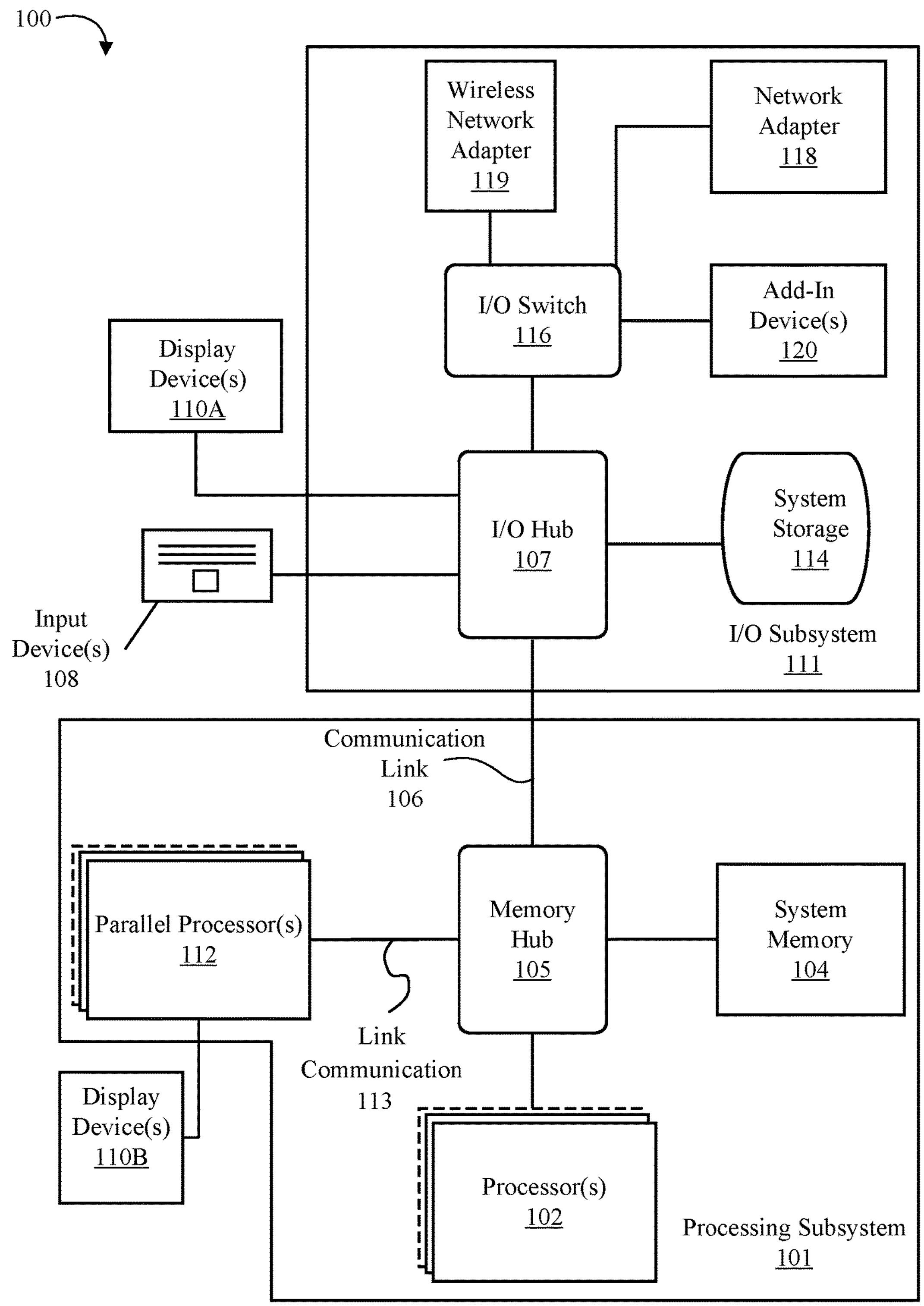
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment the one or more display device(s) 110A coupled with the I/O hub 107 can include a local, internal, or embedded display device.

In one embodiment the processing subsystem 101 includes one or more parallel processor(s) 112 coupled to memory hub 105 via a bus or other communication link 113. The communication link 113 may be one of any number of standards based communication link technologies or protocols, such as, but not limited to PCI Express, or may be a vendor specific communications interface or communications fabric. In one embodiment the one or more parallel processor(s) 112 form a computationally focused parallel or vector processing system that an include a large number of processing cores and/or processing clusters, such as a many integrated core (MIC) processor. In one embodiment the one or more parallel processor(s) 112 form a graphics processing subsystem that can output pixels to one of the one or more display device(s) 110A coupled via the I/O Hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NV-Link high-speed interconnect, or interconnect protocols known in the art.

In one embodiment, the one or more parallel processor(s) 112 incorporate circuitry optimized for graphics and video processing, including, for example, video output circuitry, and constitutes a graphics processing unit (GPU). In another embodiment, the one or more parallel processor(s) 112 incorporate circuitry optimized for general purpose processing, while preserving the underlying computational architecture, described in greater detail herein. In yet another embodiment, components of the computing system 100 may be integrated with one or more other system elements on a single integrated circuit. For example, the one or more parallel processor(s), 112 memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, in some embodiments, system memory 104 is connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. Some embodiments may include two or more sets of processor(s) 102 attached via multiple sockets, which can couple with two or more instances of the parallel processor(s) 112.

Some of the particular components shown herein are optional and may not be included in all implementations of the computing system 100. For example, any number of add-in cards or peripherals may be supported, or some components may be eliminated. Furthermore, some architectures may use different terminology for components similar to those illustrated in FIG. 1. For example, the memory hub 105 may be referred to as a Northbridge in some architectures, while the I/O hub 107 may be referred to as a Southbridge.

Figure 2A:
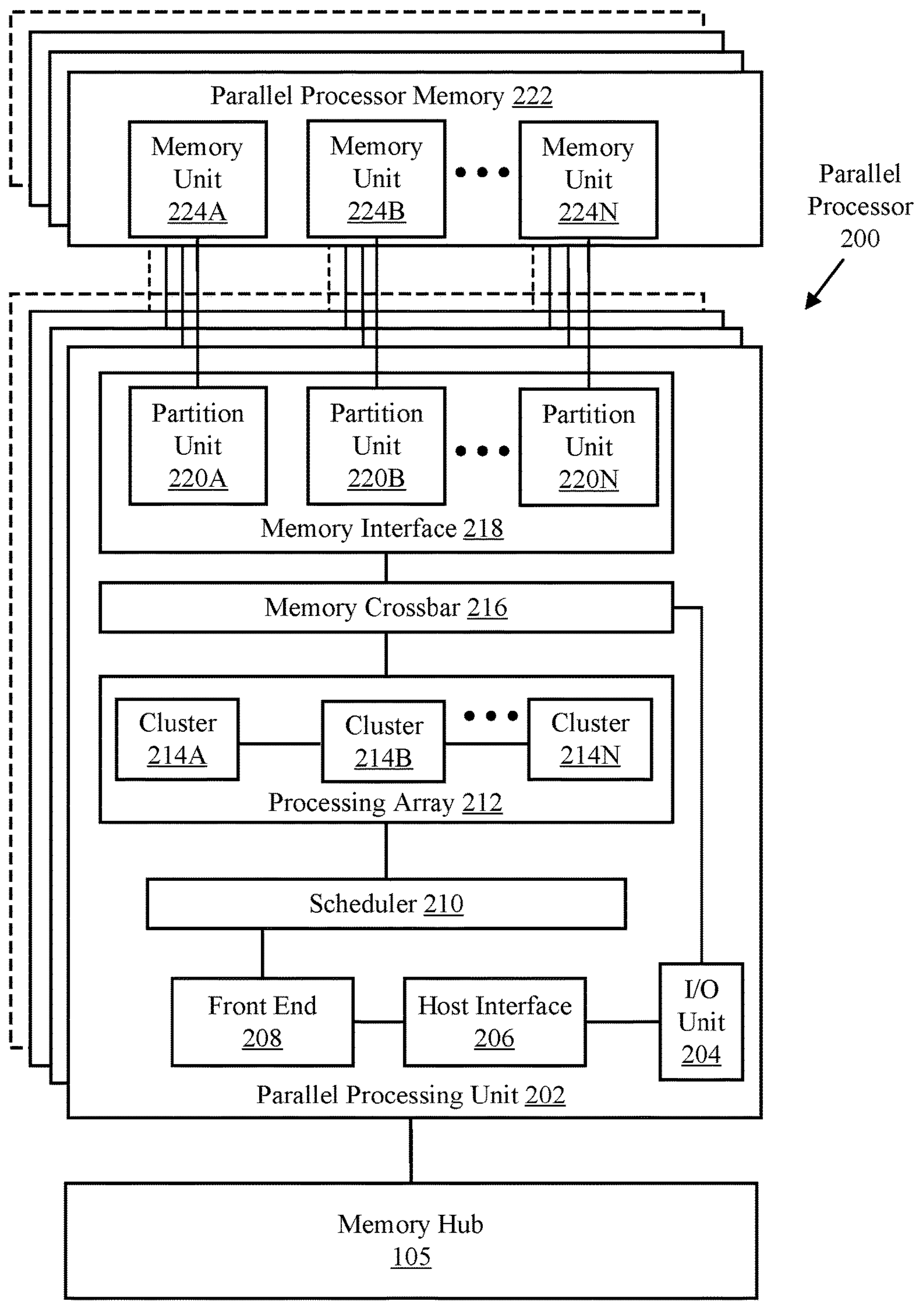
FIG. 2A-2D illustrate a parallel processor components, according to an embodiment.

FIG. 2A illustrates a parallel processor 200, according to an embodiment. The various components of the parallel processor 200 may be implemented using one or more integrated circuit devices, such as programmable processors, application specific integrated circuits (ASICs), or field programmable gate arrays (FPGA). The illustrated parallel processor 200 is a variant of the one or more parallel processor(s) 112 shown in FIG. 1, according to an embodiment.

In one embodiment the parallel processor 200 includes a parallel processing unit 202. The parallel processing unit includes an I/O unit 204 that enables communication with other devices, including other instances of the parallel processing unit 202. The I/O unit 204 may be directly connected to other devices. In one embodiment the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment the front end 208 couples with a scheduler 210, which is configured to distribute commands or other work items to a processing cluster array 212. In one embodiment the scheduler 210 ensures that the processing cluster array 212 is properly configured and in a valid state before tasks are distributed to the processing clusters of the processing cluster array 212. In one embodiment the scheduler 210 is implemented via firmware logic executing on a microcontroller. The microcontroller implemented scheduler 210 is configurable to perform complex scheduling and work distribution operations at coarse and fine granularity, enabling rapid preemption and context switching of threads executing on the processing array 212. In one embodiment, the host software can prove workloads for scheduling on the processing array 212 via one of multiple graphics processing doorbells. The workloads can then be automatically distributed across the processing array 212 by the scheduler 210 logic within the scheduler microcontroller.

The processing cluster array 212 can include up to "N" processing clusters (e.g., cluster 214A, cluster 214B, through cluster 214N). Each cluster 214A-214N of the processing cluster array 212 can execute a large number of concurrent threads. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210, or can be assisted in part by compiler logic during compilation of program logic configured for execution by the processing cluster array 212. In one embodiment, different clusters 214A-214N of the processing cluster array 212 can be allocated for processing different types of programs or for performing different types of computations.

The processing cluster array 212 can be configured to perform various types of parallel processing operations. In one embodiment the processing cluster array 212 is configured to perform general-purpose parallel compute operations. For example, the processing cluster array 212 can include logic to execute processing tasks including filtering of video and/or audio data, performing modeling operations, including physics operations, and performing data transformations.

In one embodiment the processing cluster array 212 is configured to perform parallel graphics processing operations. In embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In one embodiment, when the parallel processing unit 202 is used to perform graphics processing, the scheduler 210 can be configured to divide the processing workload into approximately equal sized tasks, to better enable distribution of the graphics processing operations to multiple clusters 214A-214N of the processing cluster array 212. In some embodiments, portions of the processing cluster array 212 can be configured to perform different types of processing. For example a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that can each couple to a portion (e.g., memory unit) of parallel processor memory 222. In one implementation the number of partition units 220A-220N is configured to be equal to the number of memory units, such that a first partition unit 220A has a corresponding first memory unit 224A, a second partition unit 220B has a corresponding memory unit 224B, and an Nth partition unit 220N has a corresponding Nth memory unit 224N. In other embodiments, the number of partition units 220A-220N may not be equal to the number of memory devices.

In various embodiments, the memory units 224A-224N can include various types of memory devices, including dynamic random access memory (DRAM) or graphics random access memory, such as synchronous graphics random access memory (SGRAM), including graphics double data rate (GDDR) memory. In one embodiment, the memory units 224A-224N may also include 3D stacked memory, including but not limited to high bandwidth memory (HBM). Persons skilled in the art will appreciate that the specific implementation of the memory units 224A-224N can vary, and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

In one embodiment, any one of the clusters 214A-214N of the processing cluster array 212 can process data that will be written to any of the memory units 224A-224N within parallel processor memory 222. The memory crossbar 216 can be configured to transfer the output of each cluster 214A-214N to any partition unit 220A-220N or to another cluster 214A-214N, which can perform additional processing operations on the output. Each cluster 214A-214N can communicate with the memory interface 218 through the memory crossbar 216 to read from or write to various external memory devices. In one embodiment the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. In one embodiment the memory crossbar 216 can use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. The different instances of the parallel processing unit 202 can be configured to inter-operate even if the different instances have different numbers of processing cores, different amounts of local parallel processor memory, and/or other configuration differences. For example and in one embodiment, some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems.

Figure 2B:
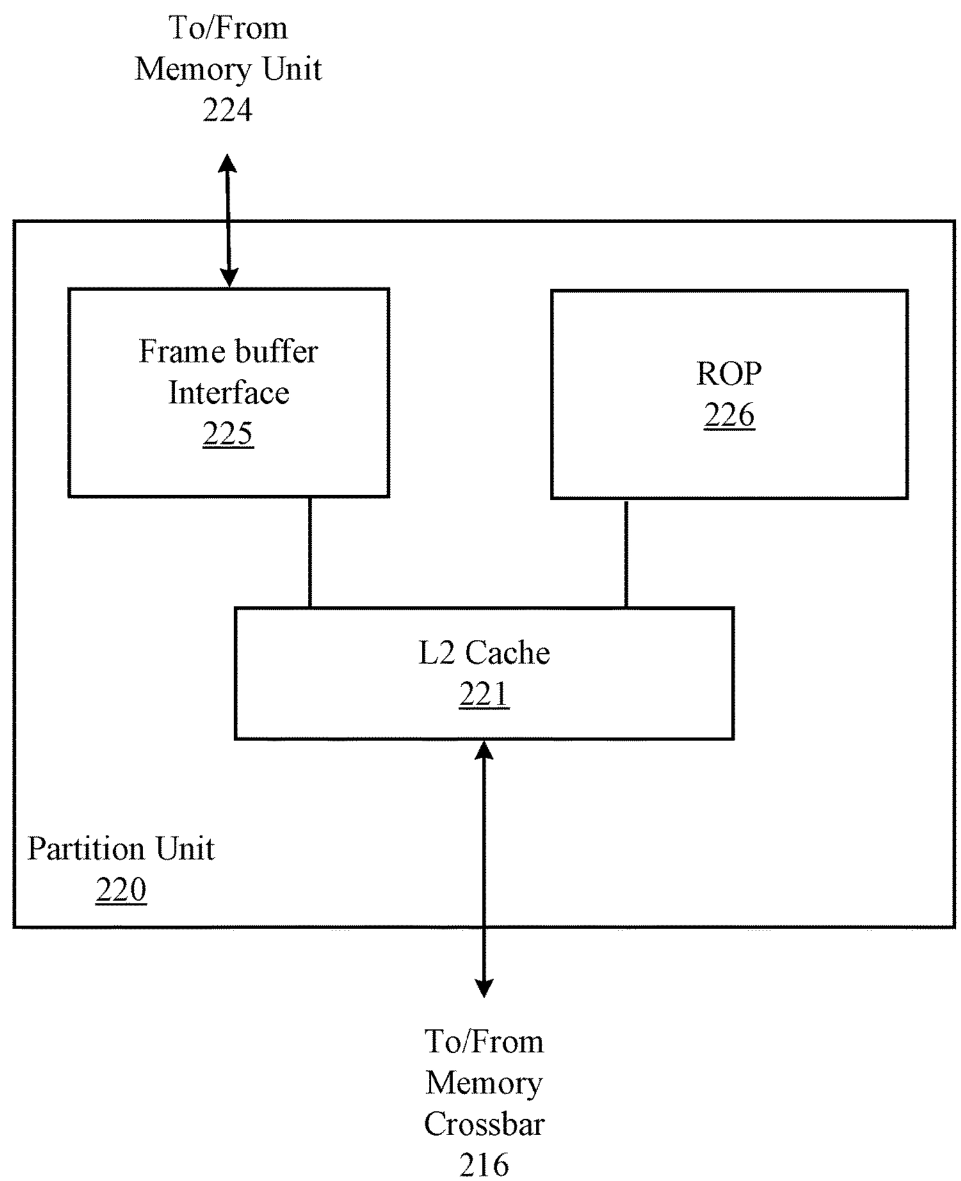

FIG. 2B is a block diagram of a partition unit 220, according to an embodiment. In one embodiment the partition unit 220 is an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Updates can also be sent to the frame buffer via the frame buffer interface 225 for processing. In one embodiment the frame buffer interface 225 interfaces with one of the memory units in parallel processor memory, such as the memory units 224A-224N of FIG. 2 (e.g., within parallel processor memory 222).

In graphics applications, the ROP 226 is a processing unit that performs raster operations such as stencil, z test, blending, and the like. The ROP 226 then outputs processed graphics data that is stored in graphics memory. In some embodiments the ROP 226 includes compression logic to compress depth or color data that is written to memory and decompress depth or color data that is read from memory. The compression logic can be lossless compression logic that makes use of one or more of multiple compression algorithms. The type of compression that is performed by the ROP 226 can vary based on the statistical characteristics of the data to be compressed. For example, in one embodiment, delta color compression is performed on depth and color data on a per-tile basis.

In some embodiments, the ROP 226 is included within each processing cluster (e.g., cluster 214A-214N of FIG. 2) instead of within the partition unit 220. In such embodiment, read and write requests for pixel data are transmitted over the memory crossbar 216 instead of pixel fragment data. The processed graphics data may be displayed on a display device, such as one of the one or more display device(s) 110 of FIG. 1, routed for further processing by the processor(s) 102, or routed for further processing by one of the processing entities within the parallel processor 200 of FIG. 2A.

Figure 2C:
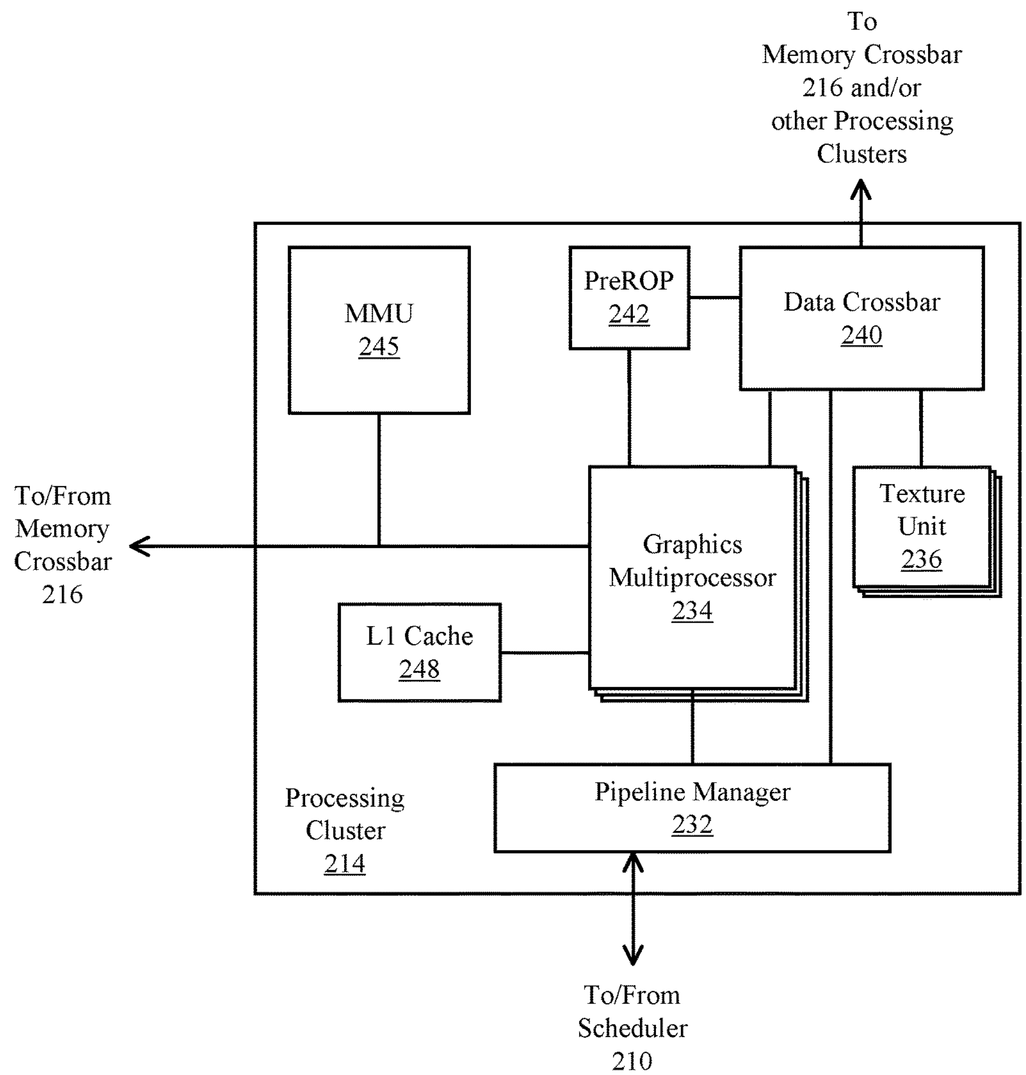

FIG. 2C is a block diagram of a processing cluster 214 within a parallel processing unit, according to an embodiment. In one embodiment the processing cluster is an instance of one of the processing clusters 214A-214N of FIG. 2. The processing cluster 214 can be configured to execute many threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2 and manages execution of those instructions via a graphics multiprocessor 234 and/or a texture unit 236. The illustrated graphics multiprocessor 234 is an exemplary instance of a SIMT parallel processor. However, various types of SIMT parallel processors of differing architectures may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed vis the data crossbar 240.

Each graphics multiprocessor 234 within the processing cluster 214 can include an identical set of functional execution logic (e.g., arithmetic logic units, load-store units, etc.). The functional execution logic can be configured in a pipelined manner in which new instructions can be issued before previous instructions are complete. The functional execution logic supports a variety of operations including integer and floating point arithmetic, comparison operations, Boolean operations, bit-shifting, and computation of various algebraic functions. In one embodiment the same functional-unit hardware can be leveraged to perform different operations and any combination of functional units may be present.

The instructions transmitted to the processing cluster 214 constitutes a thread. A set of threads executing across the set of parallel processing engines is a thread group. A thread group executes the same program on different input data. Each thread within a thread group can be assigned to a different processing engine within a graphics multiprocessor 234. A thread group may include fewer threads than the number of processing engines within the graphics multiprocessor 234. When a thread group includes fewer threads than the number of processing engines, one or more of the processing engines may be idle during cycles in which that thread group is being processed. A thread group may also include more threads than the number of processing engines within the graphics multiprocessor 234. When the thread group includes more threads than the number of processing engines within the graphics multiprocessor 234 processing can be performed over consecutive clock cycles. In one embodiment multiple thread groups can be executed concurrently on a graphics multiprocessor 234.

In one embodiment the graphics multiprocessor 234 includes an internal cache memory to perform load and store operations. In one embodiment, the graphics multiprocessor 234 can forego an internal cache and use a cache memory (e.g., L1 cache 308) within the processing cluster 214. Each graphics multiprocessor 234 also has access to L2 caches within the partition units (e.g., partition units 220A-220N of FIG. 2) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 308.

Each processing cluster 214 may include an MMU 245 (memory management unit) that is configured to map virtual addresses into physical addresses. In other embodiments, one or more instances of the MMU 245 may reside within the memory interface 218 of FIG. 2. The MMU 245 includes a set of page table entries (PTEs) used to map a virtual address to a physical address of a tile (talk more about tiling) and optionally a cache line index. The MMU 245 may include address translation lookaside buffers (TLB) or caches that may reside within the graphics multiprocessor 234 or the L1 cache or processing cluster 214. The physical address is processed to distribute surface data access locality to allow efficient request interleaving among partition units. The cache line index may be used to determine whether a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. In one embodiment, each processing cluster 214 can be configured to operate independently of other processing clusters 214 using separate and distinct processing units, L1 caches, etc.

Figure 2D:
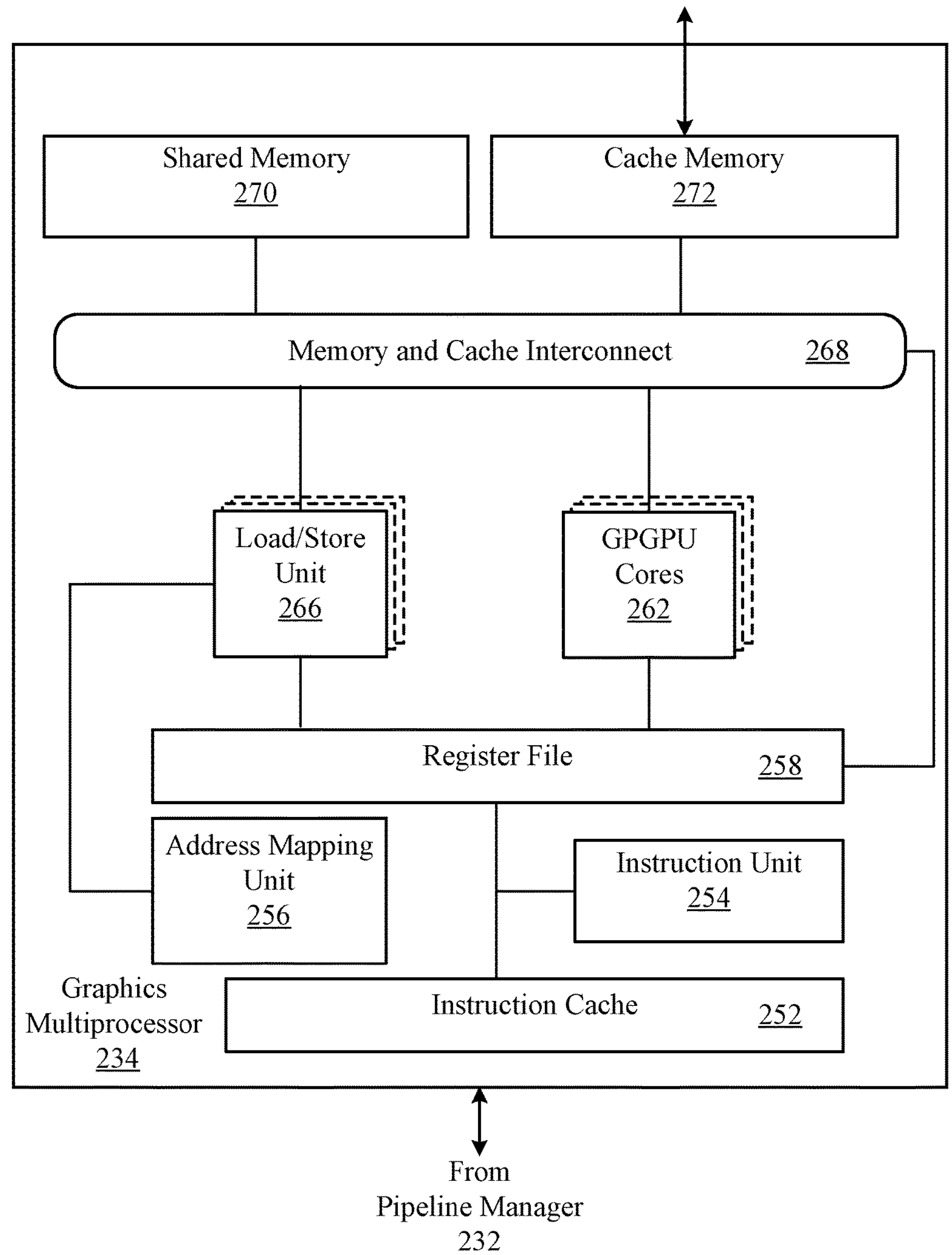

FIG. 2D shows a graphics multiprocessor 234, according to one embodiment. In such embodiment the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268.

In one embodiment, the instruction cache 252 receives a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 324. The register file 258 provides temporary storage for operands connected to the data paths of the functional units (e.g., GPGPU cores 262, load/store units 266) of the graphics multiprocessor 324. In one embodiment, the register file 258 is divided between each of the functional units such that each functional unit is allocated a dedicated portion of the register file 258. In one embodiment, the register file 258 is divided between the different warps being executed by the graphics multiprocessor 324.

The GPGPU cores 262 can each include floating point units (FPUs) and/or integer arithmetic logic units (ALUs) that are used to execute instructions of the graphics multiprocessor 324. The GPGPU cores 262 can be similar in architecture or can differ in architecture, according to embodiments. For example and in one embodiment, a first portion of the GPGPU cores 262 include a single precision FPU and an integer ALU while a second portion of the GPGPU cores include a double precision FPU. In one embodiment the FPUs can implement the IEEE 754-2008 standard for floating point arithmetic or enable variable precision floating point arithmetic. The graphics multiprocessor 324 can additionally include one or more fixed function or special function units to perform specific functions such as copy rectangle or pixel blending operations. In one embodiment one or more of the GPGPU cores can also include fixed or special function logic.

In one embodiment the GPGPU cores 262 include SIMD logic capable of performing a single instruction on multiple sets of data. In one embodiment GPGPU cores 262 can physically execute SIMD4, SIMD8, and SIMD16 instructions and logically execute SIMD1, SIMD2, and SIMD32 instructions. The SIMD instructions for the GPGPU cores can be generated at compile time by a shader compiler or automatically generated when executing programs written and compiled for single program multiple data (SPMD) or SIMT architectures. Multiple threads of a program configured for the SIMT execution model can executed via a single SIMD instruction. For example and in one embodiment, eight SIMT threads that perform the same or similar operations can be executed in parallel via a single SIMD8 logic unit.

The memory and cache interconnect 268 is an interconnect network that connects each of the functional units of the graphics multiprocessor 324 to the register file 258 and to the shared memory 270. In one embodiment, the memory and cache interconnect 268 is a crossbar interconnect that allows the load/store unit 266 to implement load and store operations between the shared memory 270 and the register file 258. The register file 258 can operate at the same frequency as the GPGPU cores 262, thus data transfer between the GPGPU cores 262 and the register file 258 is very low latency. The shared memory 270 can be used to enable communication between threads that execute on the functional units within the graphics multiprocessor 234. The cache memory 272 can be used as a data cache for example, to cache texture data communicated between the functional units and the texture unit 236. The shared memory 270 can also be used as a program managed cached. Threads executing on the GPGPU cores 262 can programmatically store data within the shared memory in addition to the automatically cached data that is stored within the cache memory 272.

Figure 3A:
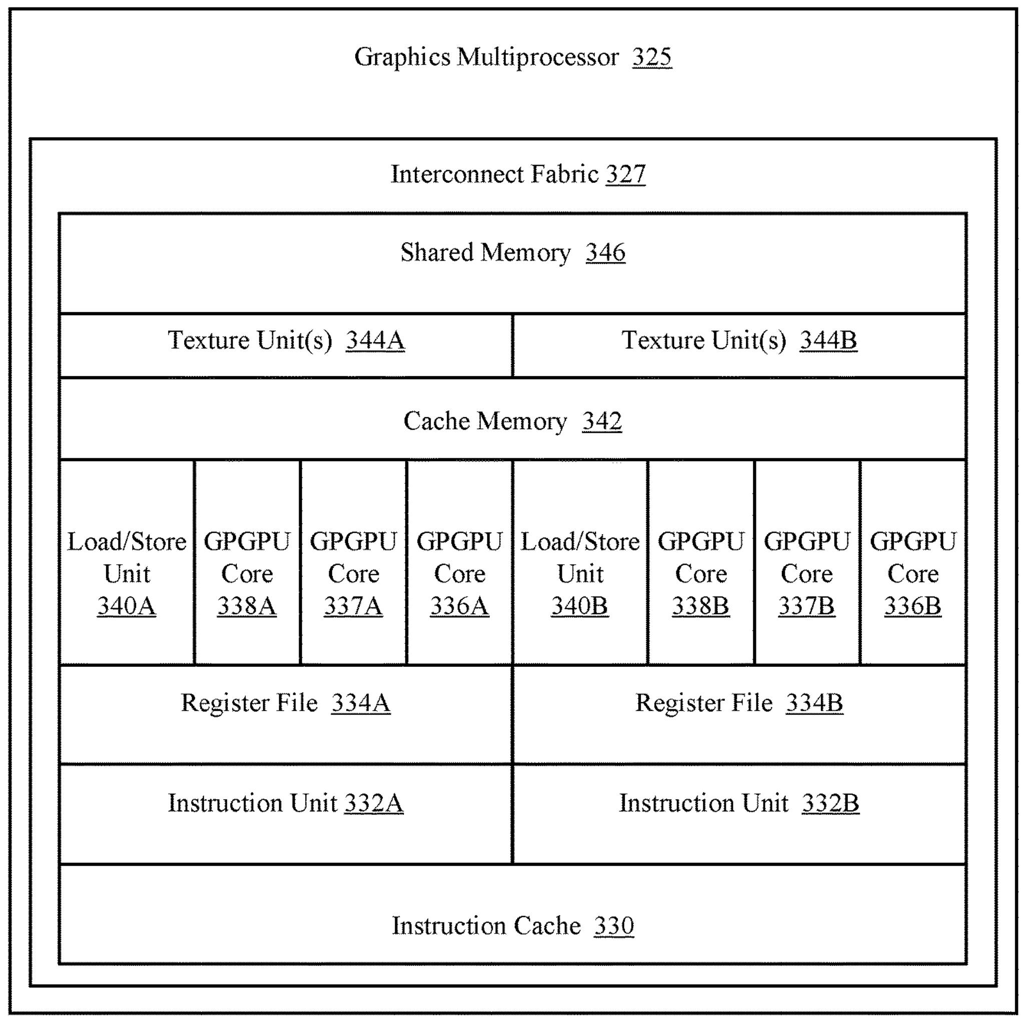
FIGS. 3A-3B are block diagrams of graphics multiprocessors, according to embodiments.
Figure 3B:
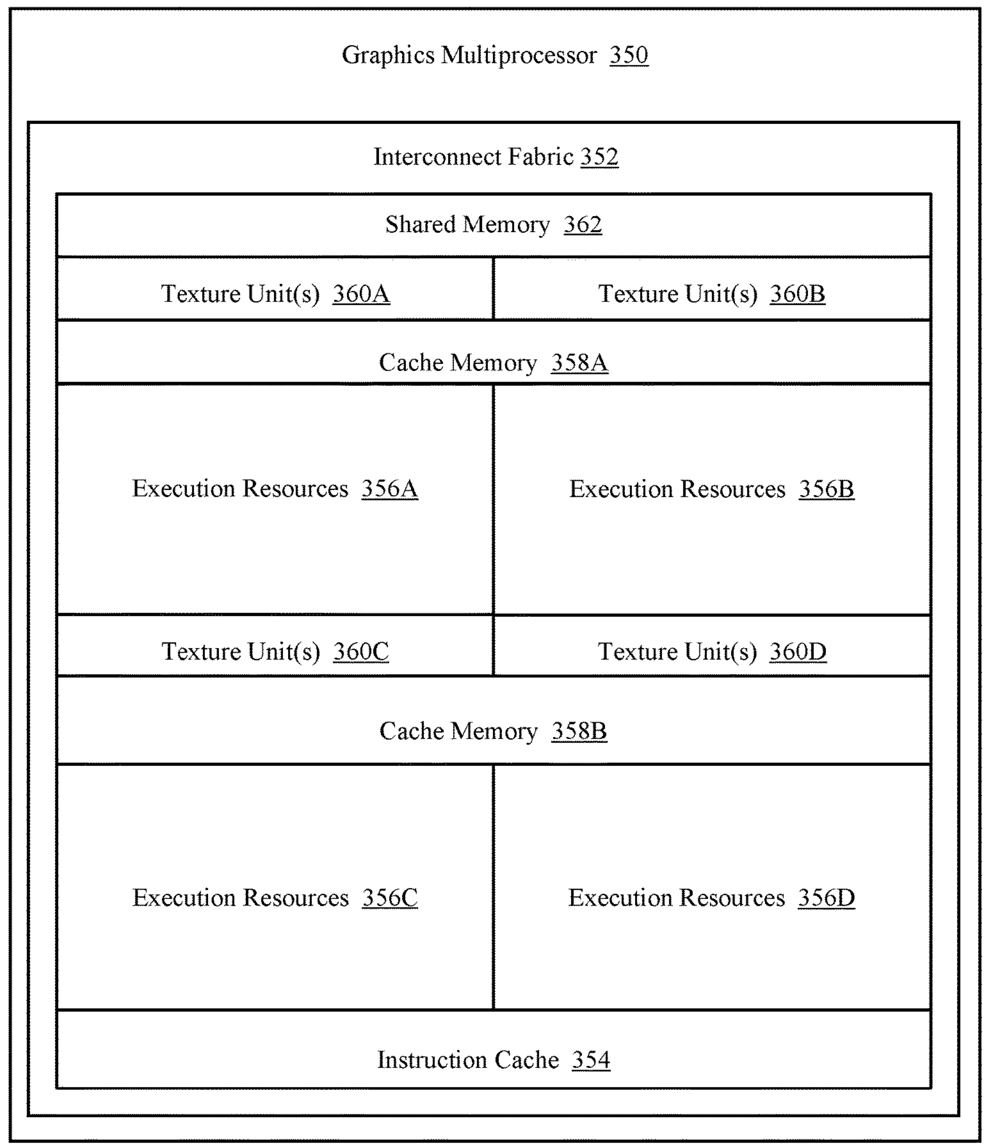

FIGS. 3A-3B illustrate additional graphics multiprocessors, according to embodiments. The illustrated graphics multiprocessors 325, 350 are variants of the graphics multiprocessor 234 of FIG. 2C. The illustrated graphics multiprocessors 325, 350 can be configured as a streaming multiprocessor (SM) capable of simultaneous execution of a large number of execution threads.

FIG. 3A shows a graphics multiprocessor 325 according to an additional embodiment. The graphics multiprocessor 325 includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, GPGPU core 337A-337B, GPGPU core 338A-338B) and multiple sets of load/store units 340A-340B. In one embodiment the execution resource units have a common instruction cache 330, texture and/or data cache memory 342, and shared memory 346.

The various components can communicate via an interconnect fabric 327. In one embodiment the interconnect fabric 327 includes one or more crossbar switches to enable communication between the various components of the graphics multiprocessor 325. In one embodiment the interconnect fabric 327 is a separate, high-speed network fabric layer upon which each component of the graphics multiprocessor 325 is stacked. The components of the graphics multiprocessor 325 communicate with remote components via the interconnect fabric 327. For example, the GPGPU cores 336A-336B, 337A-337B, and 3378A-338B can each communicate with shared memory 346 via the interconnect fabric 327. The interconnect fabric 327 can arbitrate communication within the graphics multiprocessor 325 to ensure a fair bandwidth allocation between components.

FIG. 3B shows a graphics multiprocessor 350 according to an additional embodiment. The graphics processor includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 362. In one embodiment the execution resources 356A-356D can share an instruction cache 354 and shared memory 362, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2, as well as one or more graphics processors or special purpose processing units, without departure from the scope of the embodiments described herein.

In some embodiments a parallel processor or GPGPU as described herein is communicatively coupled to host/processor cores to accelerate graphics operations, machine-learning operations, pattern analysis operations, and various general purpose GPU (GPGPU) functions. The GPU may be communicatively coupled to the host processor/cores over a bus or other interconnect (e.g., a high speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

Techniques for GPU to Host Processor Interconnection

Figure 4A:
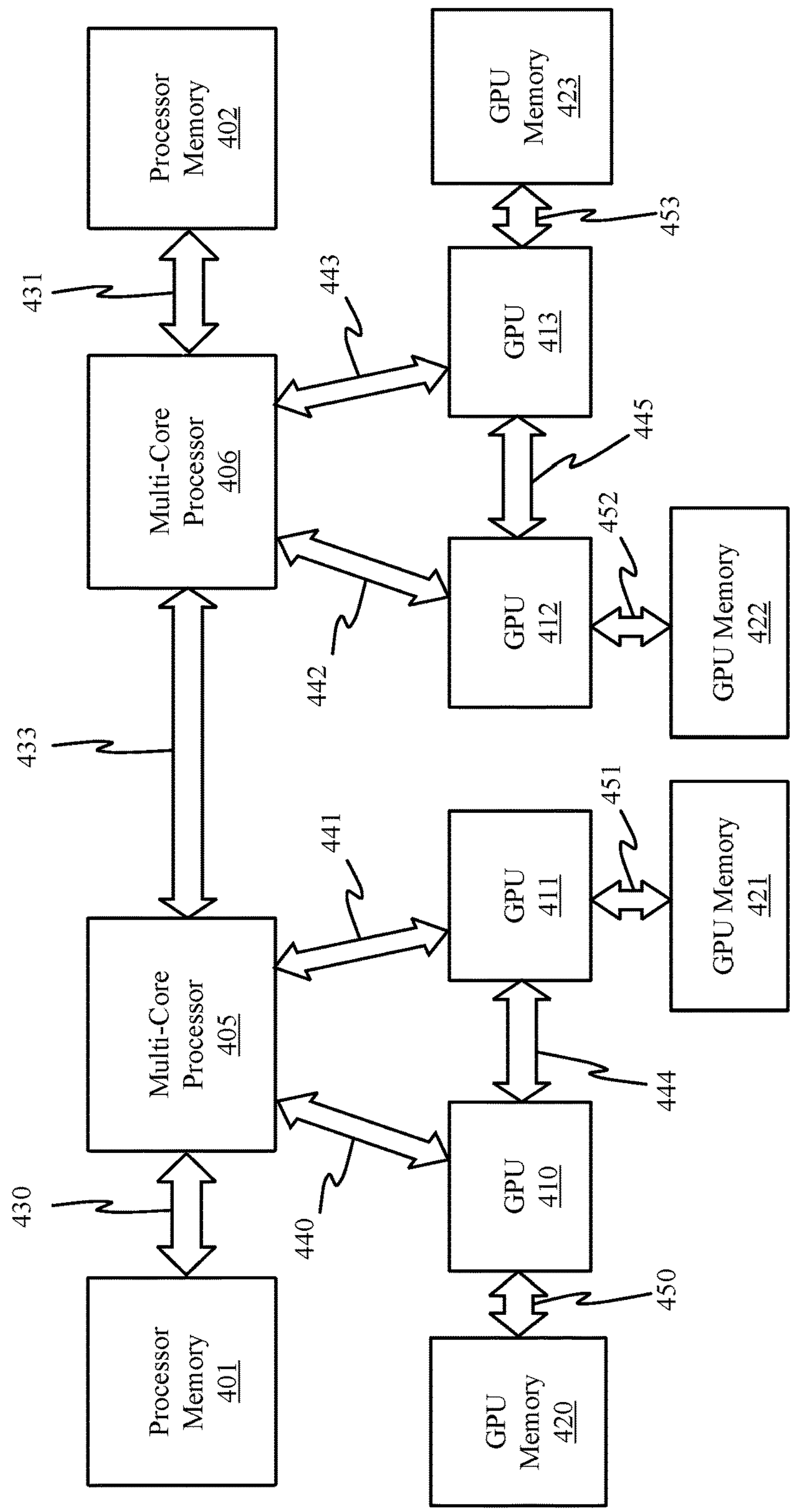
FIG. 4A-4F illustrate an exemplary architecture in which a plurality of GPUs are communicatively coupled to a plurality of multi-core processors.

FIG. 4A illustrates an exemplary architecture in which a plurality of GPUs 410-413 are communicatively coupled to a plurality of multi-core processors 405-406 over high-speed links 440-443 (e.g., buses, point-to-point interconnects, etc.). In one embodiment, the high-speed links 440-443 support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles of the invention are not limited to any particular communication protocol or throughput.

In addition, in one embodiment, two or more of the GPUs 410-413 are interconnected over high-speed links 444-445, which may be implemented using the same or different protocols/links than those used for high-speed links 440-443. Similarly, two or more of the multi-core processors 405-406 may be connected over high speed link 433 which may be symmetric multi-processor (SMP) buses operating at 20 GB/s, 30 GB/s, 120 GB/s or higher. Alternatively, all communication between the various system components shown in FIG. 4A may be accomplished using the same protocols/links (e.g., over a common interconnection fabric). As mentioned, however, the underlying principles of the invention are not limited to any particular type of interconnect technology.

In one embodiment, each multi-core processor 405-406 is communicatively coupled to a processor memory 401-402, via memory interconnects 430-431, respectively, and each GPU 410-413 is communicatively coupled to GPU memory 420-423 over GPU memory interconnects 450-453, respectively. The memory interconnects 430-431 and 450-453 may utilize the same or different memory access technologies. By way of example, and not limitation, the processor memories 401-402 and GPU memories 420-423 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of the memories may be volatile memory and another portion may be non-volatile memory (e.g., using a two-level memory (2LM) hierarchy).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
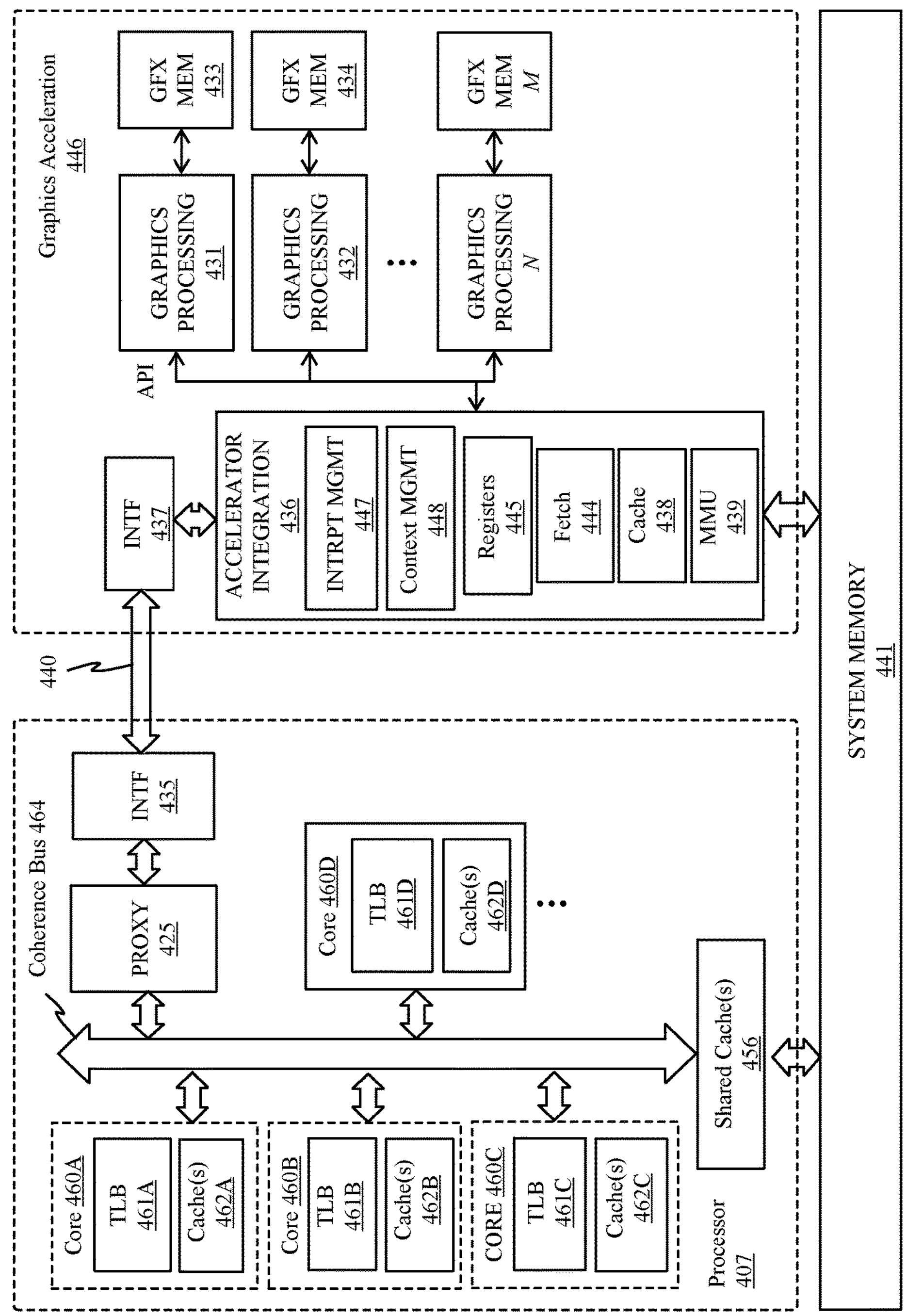

FIG. 4B illustrates additional details for an interconnection between a multi-core processor 407 and a graphics acceleration module 446 in accordance with one embodiment. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the invention (e.g., instruction fetch units, branch prediction units, decoders, execution units, reorder buffers, etc.). The caches 462A-462D may comprise level 1 (L1) and level 2 (L2) caches. In addition, one or more shared caches 426 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles of the invention.

In one embodiment, a proxy circuit 425 communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

In one embodiment, the accelerator integration circuit 436 includes a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431-432, N. In one embodiment, the data stored in cache 438 and graphics memories 433-434, N is kept coherent with the core caches 462A-462D, 456 and system memory 411. As mentioned, this may be accomplished via proxy circuit 425 which takes part in the cache coherency mechanism on behalf of cache 438 and memories 433-434, N (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is stored so that the second thread can be execute by a graphics processing engine). For example, on a context switch, the context management circuit 448 may store current register values to a designated region in memory (e.g., identified by a context pointer). It may then restore the register values when returning to the context. In one embodiment, an interrupt management circuit 447 receives and processes interrupts received from system devices.

In one implementation, virtual/effective addresses from a graphics processing engine 431 are translated to real/physical addresses in system memory 411 by the MMU 439. One embodiment of the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. In one embodiment, a virtualized graphics execution environment is presented in which the resources of the graphics processing engines 431-432, N are shared with multiple applications or virtual machines (VMs). The resources may be subdivided into "slices" which are allocated to different VMs and/or applications based on the processing requirements and priorities associated with the VMs and/or applications.

Thus, the accelerator integration circuit acts as a bridge to the system for the graphics acceleration module 446 and provides address translation and system memory cache services. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One function of the accelerator integration circuit 436, in one embodiment, is the physical separation of the graphics processing engines 431-432, N so that they appear to the system as independent units.

As mentioned, in the illustrated embodiment, one or more graphics memories 433-434, M are coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6), or HBM, and/or may be non-volatile memories such as 3D) (Point or Nano-Ram.

In one embodiment, to reduce data traffic over link 440, biasing techniques are used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 411.

Figure 4C:
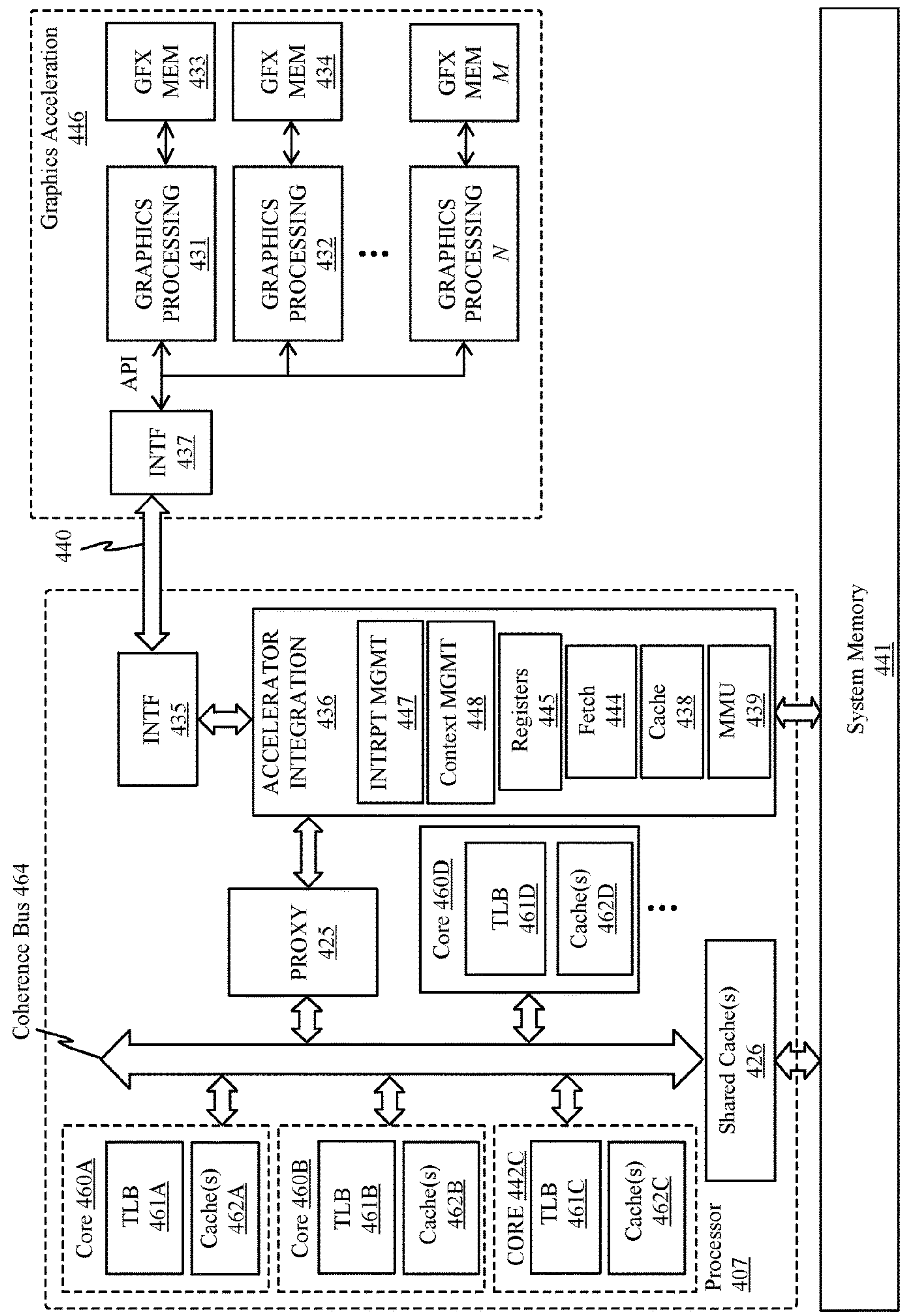

FIG. 4C illustrates another embodiment in which the accelerator integration circuit 436 is integrated within the processor 407. In this embodiment, the graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherency bus 462 and caches 462A-462D, 426.

One embodiment supports different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In one embodiment of the dedicated process model, graphics processing engines 431-432, N are dedicated to a single application or process under a single operating system. The single application can funnel other application requests to the graphics engines 431-432, N, providing virtualization within a VM/partition.

In the dedicated-process programming models, the graphics processing engines 431-432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. In one embodiment, process elements are stored in system memory 411 and are addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
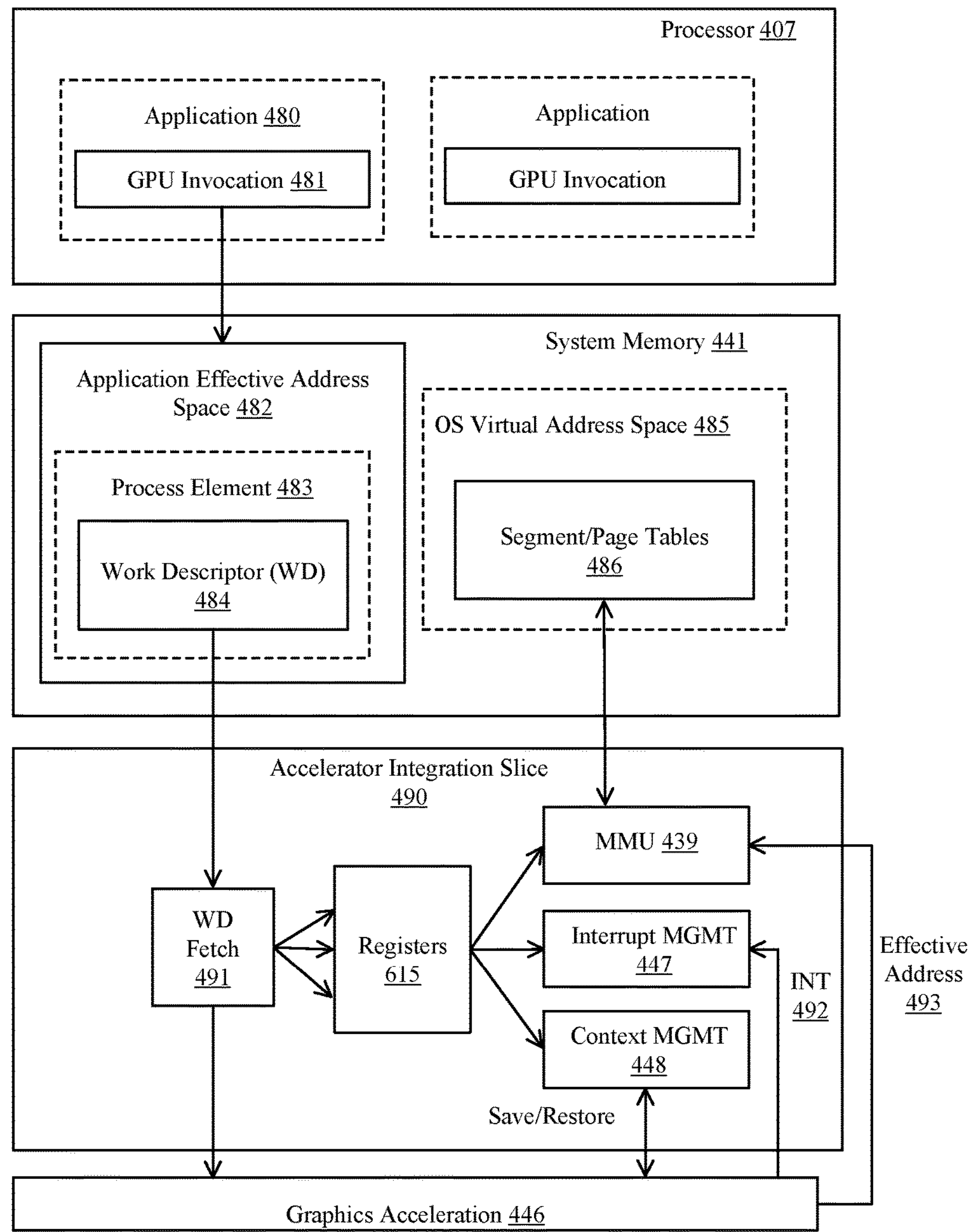

FIG. 4D illustrates an exemplary accelerator integration slice 490. As used herein, a "slice" comprises a specified portion of the processing resources of the accelerator integration circuit 436. Application effective address space 482 within system memory 411 stores process elements 483. In one embodiment, the process elements 483 are stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. Embodiments of the invention include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 446 as illustrated. For example, one embodiment of the MMU 439 includes segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

In one embodiment, the same set of registers 445 are duplicated for each graphics processing engine 431-432, N and/or graphics acceleration module 446 and may be initialized by the hypervisor or operating system. Each of these duplicated registers may be included in an accelerator integration slice 490. Exemplary registers that may be initialized by the hypervisor are shown in Table 1.

TABLE 1

| | Hypervisor Initialized Registers |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |

TABLE 1-continued

| Hypervisor Initialized Registers |
|---|
| 8 Real address (RA) Hypervisor Accelerator Utilization Record Pointer |
| 9 Storage Description Register |

Exemplary registers that may be initialized by the operating system are shown in Table 2.

TABLE 2

| Operating System Initialized Registers |
|---|
| 1 Process and Thread Identification |
| 2 Effective Address (EA) Context Save/Restore Pointer |
| 3 Virtual Address (VA) Accelerator Utilization Record Pointer |
| 4 Virtual Address (VA) Storage Segment Table Pointer |
| 5 Authority Mask |
| 6 Work descriptor |

In one embodiment, each WD 484 is specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
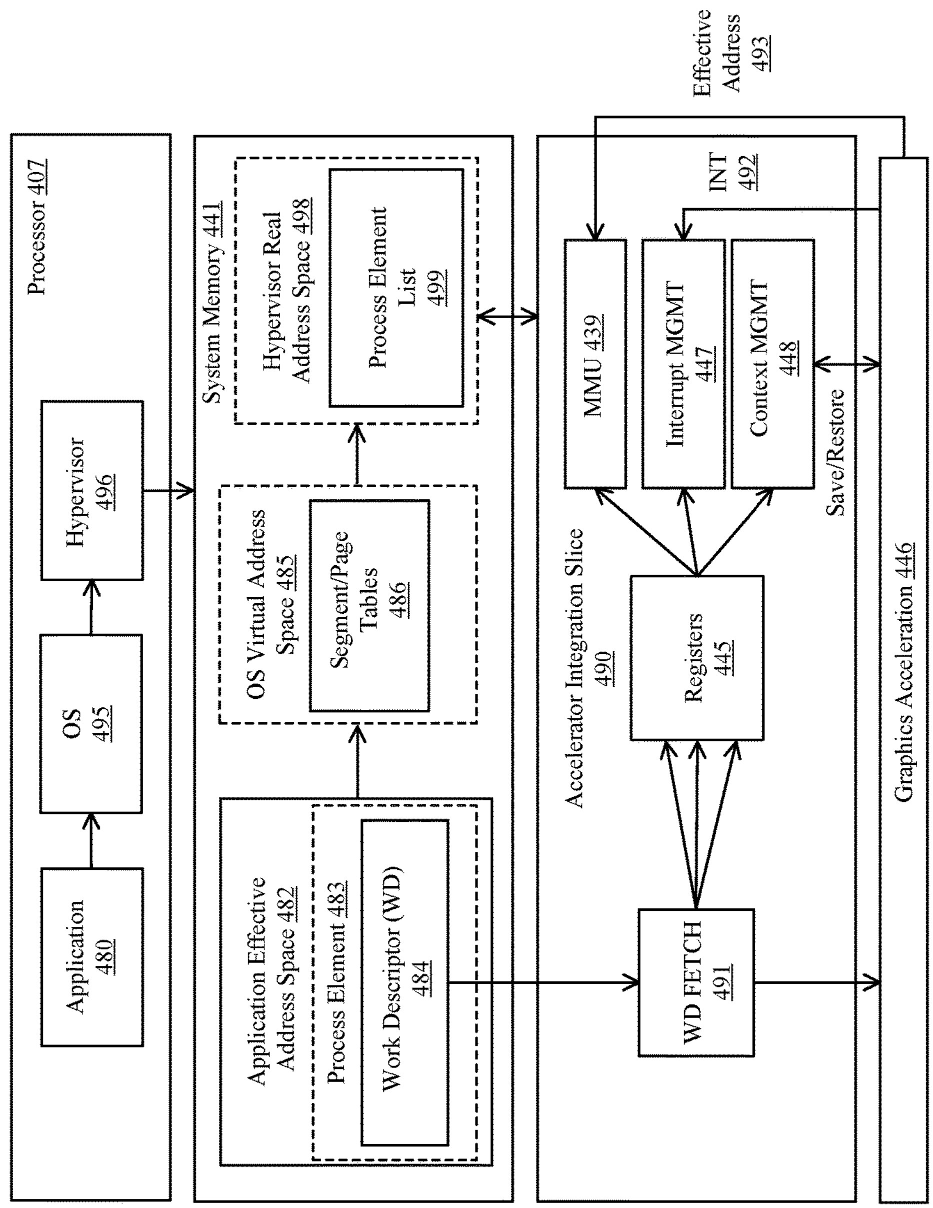

FIG. 4E illustrates additional details for one embodiment of a shared model. This embodiment includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

In one embodiment, for the shared model, the application 480 is required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. In one embodiment, the CSRP is one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

| OS to Hypervisor Call Parameters |
|---|
| 1 A work descriptor (WD) |
| 2 An Authority Mask Register (AMR) value (potentially masked). |
| 3 An effective address (EA) Context Save/Restore Area Pointer (CSRP) |
| 4 A process ID (PID) and optional thread ID (TID) |
| 5 A virtual address (VA) accelerator utilization record pointer (AURP) |
| 6 The virtual address of the storage segment table pointer (SSTP) |
| 7 A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

| Process Element Information |
|---|
| 1 A work descriptor (WD) |
| 2 An Authority Mask Register (AMR) value (potentially masked). |
| 3 An effective address (EA) Context Save/Restore Area Pointer (CSRP) |
| 4 A process ID (PID) and optional thread ID (TID) |
| 5 A virtual address (VA) accelerator utilization record pointer (AURP) |
| 6 The virtual address of the storage segment table pointer (SSTP) |
| 7 A logical interrupt service number (LISN) |
| 8 Interrupt vector table, derived from the hypervisor call parameters. |
| 9 A state register (SR) value |
| 10 A logical partition ID (LPID) |
| 11 A real address (RA) hypervisor accelerator utilization record pointer |
| 12 The Storage Descriptor Register (SDR) |

In one embodiment, the hypervisor initializes a plurality of accelerator integration slice 490 registers 445.

Figure 4F:
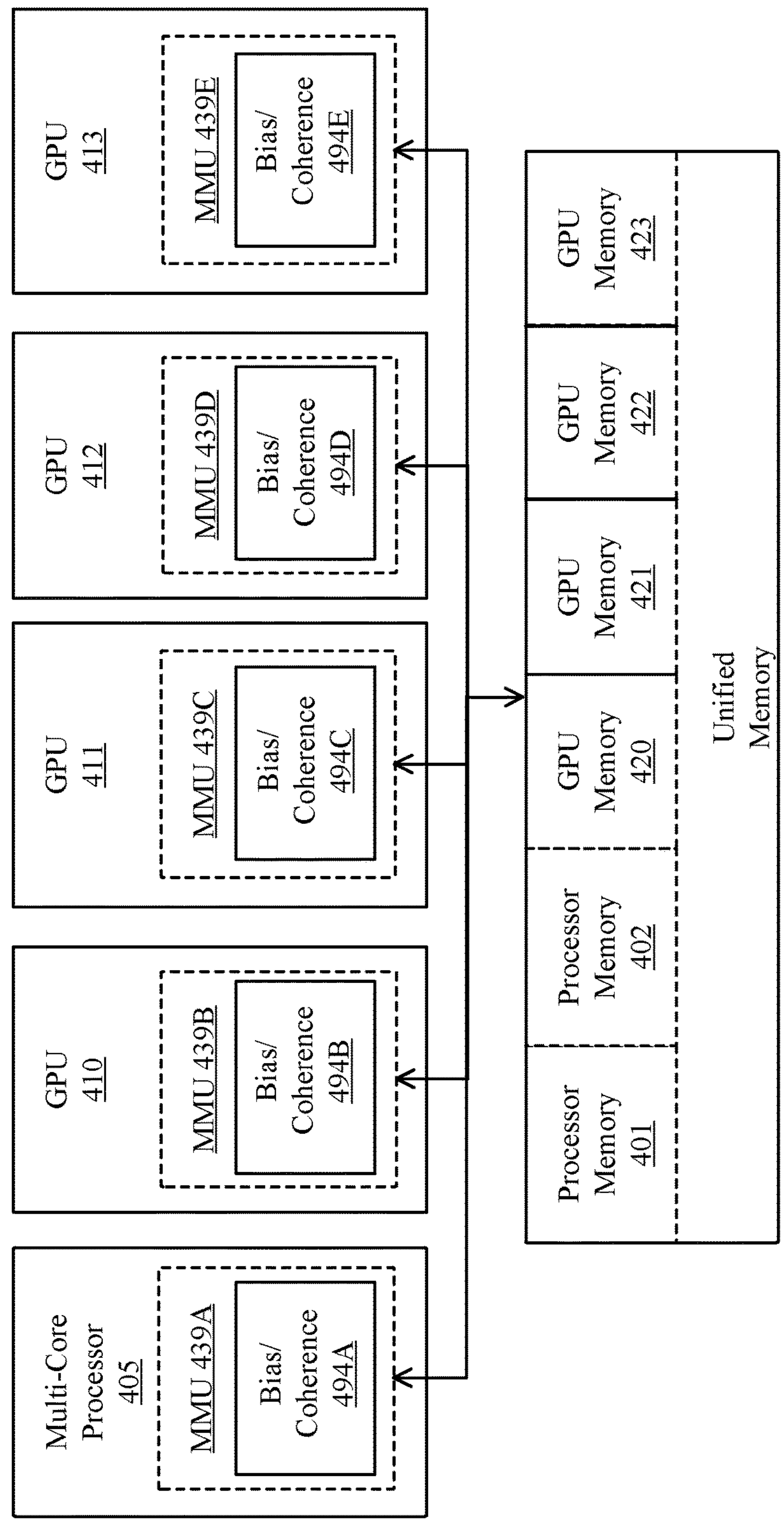

As illustrated in FIG. 4F, one embodiment of the invention employs a unified memory addressable via a common virtual memory address space used to access the physical processor memories 401-402 and GPU memories 420-423. In this implementation, operations executed on the GPUs 410-413 utilize the same virtual/effective memory address space to access the processors memories 401-402 and vice versa, thereby simplifying programmability. In one embodiment, a first portion of the virtual/effective address space is allocated to the processor memory 401, a second portion to the second processor memory 402, a third portion to the GPU memory 420, and so on. The entire virtual/effective memory space (sometimes referred to as the effective address space) is thereby distributed across each of the processor memories 401-402 and GPU memories 420-423, allowing any processor or GPU to access any physical memory with a virtual address mapped to that memory.

In one embodiment, bias/coherence management circuitry 494A-494E within one or more of the MMUs 439A-439E ensures cache coherence between the caches of the host processors (e.g., 405) and the GPUs 410-413 and implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

One embodiment allows GPU-attached memory 420-423 to be mapped as part of system memory, and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

In one implementation, the selection of between GPU bias and host processor bias is driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). In one embodiment, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g. OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias, but is not required for the opposite transition.

In one embodiment, cache coherency is maintained by temporarily rendering GPU-biased pages uncacheable by the host processor 405. To access these pages, the processor 405 may request access from the GPU 410 which may or may not grant access right away, depending on the implementation. Thus, to reduce communication between the processor 405 and GPU 410 it is beneficial to ensure that GPU-biased pages are those which are required by the GPU but not the host processor 405 and vice versa.

Graphics Processing Pipeline

Figure 5:
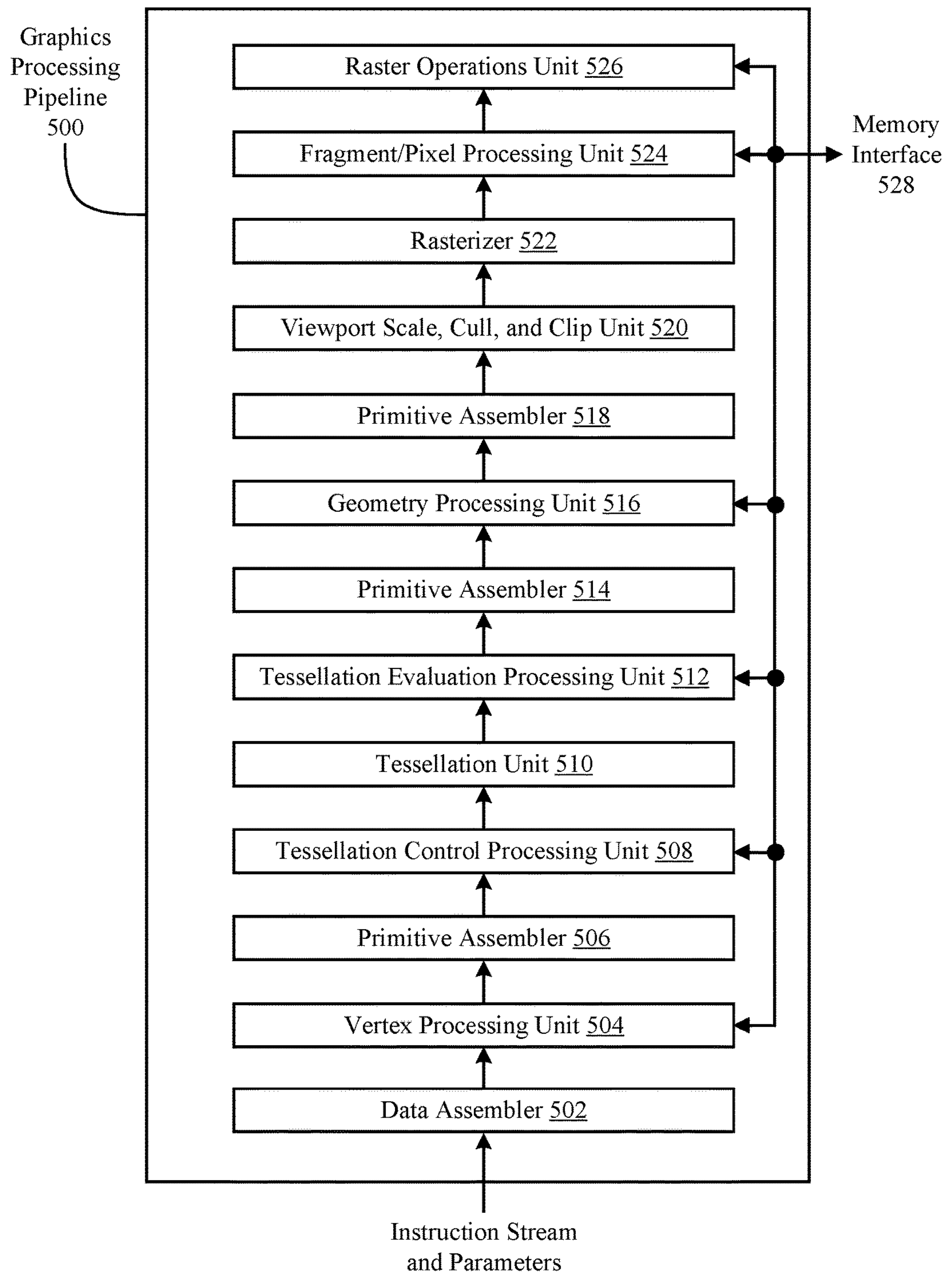
FIG. 5 illustrates a graphics processing pipeline, according to an embodiment.

FIG. 5 illustrates a graphics processing pipeline 500, according to an embodiment. In one embodiment a graphics processor can implement the illustrated graphics processing pipeline 500. The graphics processor can be included within the parallel processing subsystems as described herein, such as the parallel processor 200 of FIG. 2, which, in one embodiment, is a variant of the parallel processor(s) 112 of FIG. 1. The various parallel processing systems can implement the graphics processing pipeline 500 via one or more instances of the parallel processing unit (e.g., parallel processing unit 202 of FIG. 2) as described herein. For example, a shader unit (e.g., graphics multiprocessor 234 of FIG. 3) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 3) and a corresponding partition unit (e.g., partition unit 220A-220N of FIG. 2). The graphics processing pipeline 500 may also be implemented using dedicated processing units for one or more functions. In one embodiment, one or more portions of the graphics processing pipeline 500 can be performed by parallel processing logic within a general purpose processor (e.g., CPU). In one embodiment, one or more portions of the graphics processing pipeline 500 can access on-chip memory (e.g., parallel processor memory 222 as in FIG. 2) via a memory interface 528, which may be an instance of the memory interface 218 of FIG. 2.

In one embodiment the data assembler 502 is a processing unit that collects vertex data for surfaces and primitives. The data assembler 502 then outputs the vertex data, including the vertex attributes, to the vertex processing unit 504. The vertex processing unit 504 is a programmable execution unit that executes vertex shader programs, lighting and transforming vertex data as specified by the vertex shader programs. The vertex processing unit 504 reads data that is stored in cache, local or system memory for use in processing the vertex data and may be programmed to transform the vertex data from an object-based coordinate representation to a world space coordinate space or a normalized device coordinate space.

A first instance of a primitive assembler 506 receives vertex attributes from the vertex processing unit 504. The primitive assembler 506 readings stored vertex attributes as needed and constructs graphics primitives for processing by tessellation control processing unit 508. The graphics primitives include triangles, line segments, points, patches, and so forth, as supported by various graphics processing application programming interfaces (APIs).

The tessellation control processing unit 508 treats the input vertices as control points for a geometric patch. The control points are transformed from an input representation from the patch (e.g., the patch's bases) to a representation that is suitable for use in surface evaluation by the tessellation evaluation processing unit 512. The tessellation control processing unit 508 can also compute tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that executes geometry shader programs to transform graphics primitives received from primitive assembler 514 as specified by the geometry shader programs. In one embodiment the geometry processing unit 516 is programmed to subdivide the graphics primitives into one or more new graphics primitives and calculate parameters used to rasterize the new graphics primitives.

In some embodiments the geometry processing unit 516 can add or delete elements in the geometry stream. The geometry processing unit 516 outputs the parameters and vertices specifying new graphics primitives to primitive assembler 518. The primitive assembler 518 receives the parameters and vertices from the geometry processing unit 516 and constructs graphics primitives for processing by a viewport scale, cull, and clip unit 520. The geometry processing unit 516 reads data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 can perform depth culling and other depth-based optimizations. The rasterizer 522 also performs scan conversion on the new graphics primitives to generate fragments and output those fragments and associated coverage data to the fragment/pixel processing unit 524. The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations included but not limited to texture mapping, shading, blending, texture correction and perspective correction to produce shaded fragments or pixels that are output to a raster operations unit 526. The fragment/pixel processing unit 524 can read data that is stored in either the parallel processor memory or the system memory for use when processing the fragment data. Fragment or pixel shader programs may be configured to shade at sample, pixel, tile, or other granularities depending on the sampling rate configured for the processing units.

The raster operations unit 526 is a processing unit that performs raster operations including, but not limited to stencil, z test, blending, and the like, and outputs pixel data as processed graphics data to be stored in graphics memory (e.g., parallel processor memory 222 as in FIG. 2, and/or system memory 104 as in FIG. 1, to be displayed on the one or more display device(s) 110 or for further processing by one of the one or more processor(s) 102 or parallel processor(s) 112. In some embodiments the raster operations unit 526 is configured to compress z or color data that is written to memory and decompress z or color data that is read from memory.

Field Recovery of Graphics On-Die Memory

Figure 6:
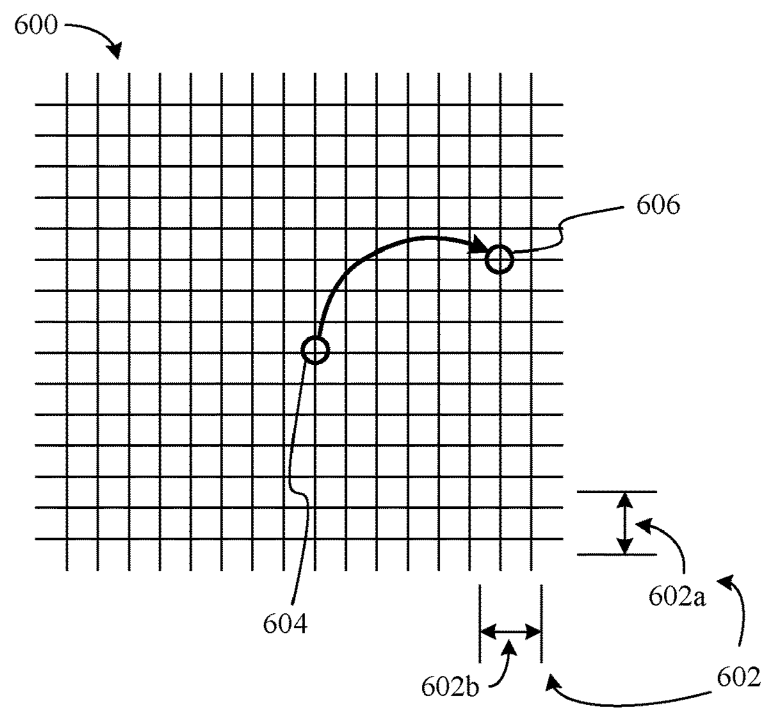
FIG. 6 is an illustration of an example of a field recovery in an on-die memory having redundant rows and columns according to an embodiment.

Turning now to FIG. 6, an on-die memory 600 is shown. The on-die memory 600, which may be part of a graphics processor that enables highly parallelized operation, may be a relatively large and dense cache, register file, etc., that is packaged and shipped/deployed in post-packaging environment (e.g., in the "field"), wherein the on-die memory 600 includes a redundant portion 602 (602*a*, 602*b*). The redundant portion 602 may include one or more redundant rows 602*a* and one or more redundant columns 602*b* that are unused (e.g., "leftover") from manufacturing testing and recovery operations. As will be discussed in greater detail, a field test of the on-die memory 600 may be conducted in response to, for example, a periodic timer expiration, a power down condition, a power up condition, an idleness condition, etc., in the graphics processor, wherein the field test may detect one or more failed memory cells 604. In such a case, one or more memory cells 606 in the redundant portion 602 may be automatically substituted for the failed memory cell 604 (e.g., "on-the-fly"). The illustrated solution therefore enhances the performance and extends the lifespan of the on-die memory 600.

Figure 7:
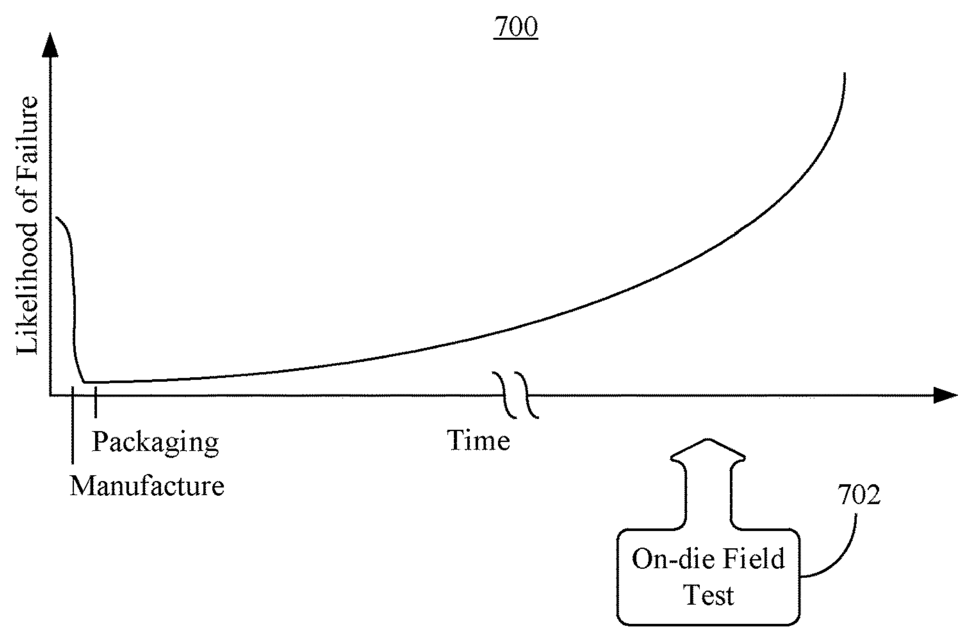
FIG. 7 is a plot of an example of a likelihood of failure curve for an on-die memory according to an embodiment.

FIG. 7 shows a plot 700 of a likelihood of failure curve for an on-die memory such as, for example, the on-die memory 600 (FIG. 6). The likelihood of failure may be relatively high during manufacture and after deployment in the field (e.g., beyond seven years of operation). In the illustrated example, a field test 702 is conducted after packaging (e.g., sorting), shipment and real-time operation of the on-die memory. As will be discussed in greater detail, the field test 702 may include built-in self-test (BIST) processes and/or other processes.

FIG. 8 shows a method 800 of operating a semiconductor package apparatus. The method 800 may be implemented as one or more modules in a set of logic instructions stored in a non-transitory machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 800 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 802 provides for identifying a redundant portion of a packaged on-die memory. Block 802 may include determining the location of one or more redundant rows and/or one or more redundant columns in the packaged on-die memory by accessing, for example, configuration data, control registers, memory maps, and so forth. Block 802 may also determine the programming state of the redundant portion (e.g., whether one or more cells, rows and/or columns of the redundant portion were used during manufacturing testing/recovery). In this regard, during the manufacturing process some redundant cells may be used to recover faulty bitcells that are detected via a BIST (built in self test) process. Given the density of the arrays, there is a higher probability of encountering "stuck at" faults. Therefore, redundancy may be added via MUX controls that replace any rows/columns of the arrays (e.g., in static random access memory/SRAM). Accordingly, to "use" or "allocate" cells during manufacturing may refer to an event when any faulty bitcell is detected and replaced to recover the part.

Block 804 may detect, during a field test of the packaged on-die memory, one or more failed memory cells (e.g., individual cells, columns and/or rows) in the packaged on-die memory. The field test may include, for example, a built-in self-test (BIST) process that rapidly programs and reads a known functional pattern (e.g., 1010101 . . . ) from the packaged on-die memory in order to determine whether the cells of the memory were programmed correctly. The failed memory cells may include shorts, deformations, etc., resulting from use of the packaged on-die memory over time, violation of minimum voltage thresholds, and so forth.

One or more memory cells in the redundant portion of the packaged on-die memory may be substituted at block 806 for the failed memory cell(s). Block 806 may include programming a fuse override to, for example, a permanent data structure. The fuse override may indicate that the failed memory cell(s) are no longer in use and that the substitute memory cell(s) in the redundant portion have replaced the failed memory cell(s). For example, the overall flow might be controlled via a trusted u-controller (microcontroller) using pre-existing BIST capabilities. All large graphics processor arrays may typically have BIST capabilities to simplify the manufacturing process and test out the arrays as fast and comprehensively as possible. The overall scheme may be conducted with a consistent ECC (error correcting code) failure, which notifies the u-controller. Upon encountering multiple failures, the u-controller will isolate the soft error vs decayed bitcell via taking the part to self-check and running the BIST patterns. After a certain number of years, bitcells have a tendency to fail. Upon re-run of BIST, if failing bitcells are detected, the u-controller may conduct a fuse override. Moreover, although fuses may be proprietary information, limited override capabilities may be exposed to trusted software (e.g., u-controller firmware and/or to ring( ) graphics driver). Additionally, substituting entire rows or columns rather than individual cells may conserve costs.

Accordingly, the illustrated solution uses on-the-fly field recoveries to extend the operational life of on-die memory. If the field test fails and there are no remaining good elements/memory cells to substitute, block 806 may alternatively reduce the size of the on-die memory (e.g., decrease available cache) and provide a warning to the user. Such an approach may be particularly useful in autonomous vehicle applications as a safety measure.

FIG. 9 shows a method 900 of scheduling field tests. The method 900 may generally be incorporated into block 804 (FIG. 8), already discussed. More particularly, the method 900 may be implemented as one or more modules in a set of logic instructions stored in a non-transitory machine- or computer-readable storage medium such as RAM, ROM, PROM, firmware, flash memory, etc., in configurable logic such as, for example, PLAs, FPGAs, CPLDs), in fixed-functionality hardware logic using circuit technology such as, for example, ASIC, CMOS or TTL technology, or any combination thereof.

Illustrated processing block 902 determines whether a periodic timer has expired. The timer may be set to expire and reset on, for example, a yearly, monthly, weekly and/or hourly basis (e.g., referencing a system clock), depending on the circumstances. If the periodic timer has expired, block 904 may execute the field test. Indeed, the timer parameters may automatically adapt over time in accordance with a likelihood of failure curve such as, for example, the curve 700 (FIG. 7). Such an approach may improve the operation of the graphics processor to an unexpectedly significant degree. As already noted, the field test may include one or more BIST processes that determine whether the cells of an on-die memory are operating properly. If the periodic timer has not expired, block 906 may determine whether a power down condition exists. The power down condition may be associated with a complete or partial (e.g., hibernation and/or sleep related) removal of power from the on-die memory. The power down condition may be pending or in-process. If the power down condition exists, block 904 may execute the field test.

Illustrated block 908 determines whether a power up condition exists. The power up condition may be associated with the application of power to or reboot of the on-die memory and/or system containing the on-die memory. The power up condition and the power down condition may be particularly relevant in automotive or other safety-related settings in which proper operation of the on-die memory may be confirmed on each start-up or shutdown, respectively. If the power up condition is detected, illustrated block 904 executes the field test. In yet another example, block 910 determines whether an idleness condition exists. The idleness condition may be associated with, for example, a lack of workload state, duty cycle operation, etc., of the on-die memory. If the idleness condition is detected, block 904 may execute the field test. The method 900 may bypass one or more of blocks 902, 906, 908 and 910, depending on the circumstances.

Figure 10A:
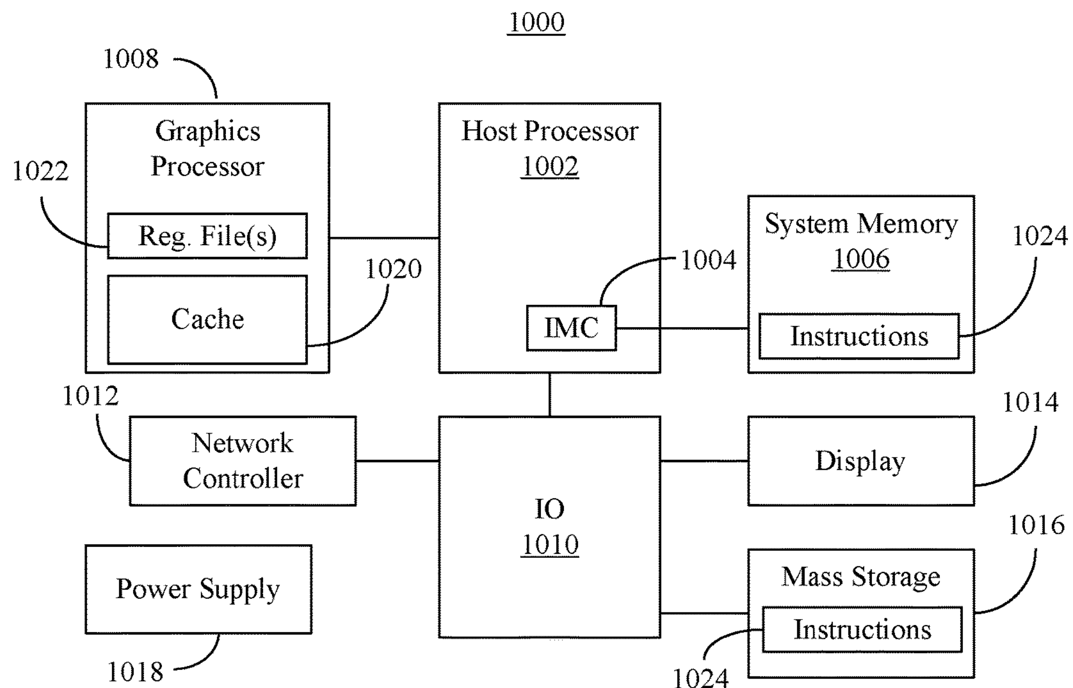
FIG. 10A is a block diagram of an example of a computing system according to an embodiment.

FIG. 10A shows a performance-enhanced computing system 1000. The computing system 1000 may be part of an advanced driver assistance system (ADAS), server, desktop computer, notebook computer, tablet computer, convertible tablet, smart phone, personal digital assistant (PDA), mobile Internet device (MID), wearable device (e.g., head mounted display/HMD system), media player, etc., or any combination thereof. In the illustrated example, a host processor 1002 includes an integrated memory controller (IMC) 1004 that communicates with a system memory 1006 (e.g., DRAM). The host processor 1002 may be coupled to a graphics processor 1008 and an input/output (IO) module 1010. The IO module 1010 may be coupled to a network controller 1012 (e.g., wireless and/or wired), a display 1014 (e.g., fixed or head mounted liquid crystal display/LCD, light emitting diode/LED display, etc., to visually present a video of a three-dimensional/3D scene), and mass storage 1016 (e.g., flash memory, optical disk, solid state drive/SSD). In the illustrated example, a power supply 1018 provides power to the system 1000 and the graphics processor 1008 includes relatively large and/or dense on-die memory such as, for example, a graphics cache 1020 and one or more register files 1022.

The system memory 1006 and/or the mass storage 1018 may include instructions 1024, which when executed by the host processor 1002 and/or the graphics processor 1008, cause the system 1000 to perform one or more aspects of the method 800 (FIG. 8) and/or the method 900 (FIG. 9). Thus, the system 1000 may be configured to identify a redundant portion of the on-die memory, detect, during a field test of the on-die memory, one or more failed memory cells in the on-die memory, and substitute one or more memory cells in the redundant portion for the one or more failed memory cells. In one example, the instructions 1024 program a fuse override to a permanent data structure to substitute the memory cell(s) in the redundant portion for the failed memory cell(s).

Figure 10B:
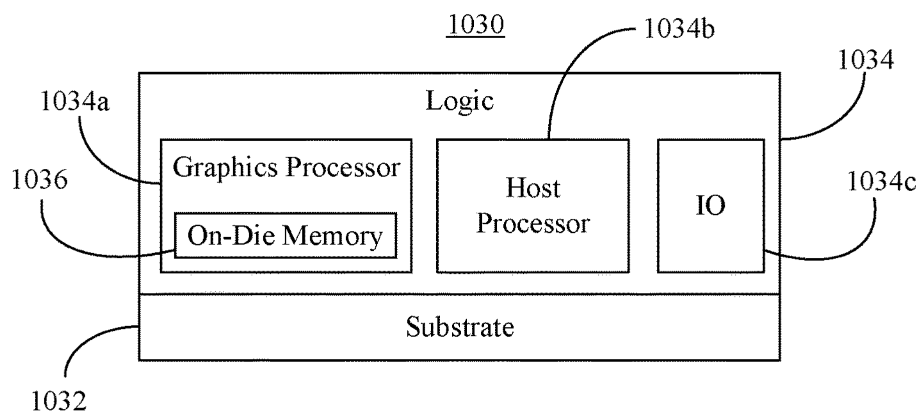
FIG. 10B is an illustration of an example of a semiconductor package apparatus according to an embodiment.

FIG. 10B shows a semiconductor package apparatus 1030 (e.g., chip) that includes a substrate 1032 (e.g., die including silicon, sapphire, gallium arsenide, etc.) and logic 1034 (1034*a*-1034*c*, e.g., transistor array and other integrated circuit/IC components) coupled to the substrate 1032. The logic 1034, which may be implemented in configurable logic (e.g., state machine) and/or fixed-functionality hardware logic (e.g., microcontroller having a dedicated kernel and data structure), includes a graphics processor 1034*a* (e.g., GPU), a host processor 1034*b* (e.g., CPU) and an IO module 1034*c*. The logic 1034 may generally implement one or more aspects of the method 800 (FIG. 8) and/or the method 900 (FIG. 9). Thus, the logic 1034 may identify a redundant portion of an on-die memory 1036, detect, during a field test of the on-die memory 1036, one or more failed memory cells in the on-die memory 1036, and substitute one or more memory cells in the redundant portion for the one or more failed memory cells. Substituting the memory cells) in the redundant portion for the failed memory cell(s) may include programming a fuse override to a permanent data structure. The permanent data structure may be located in the graphics processor 1034*a*, the host processor 1034*b* or elsewhere in the logic 1034, as appropriate.

If the field test fails and there are no remaining good elements/memory cells to substitute, the logic 1034 may alternatively reduce the size of the on-die memory 1036 and generate a user warning. Such an approach may be particularly useful in autonomous vehicle applications as a safety measure.

Head-Mounted Display System Overview

Figure 11:
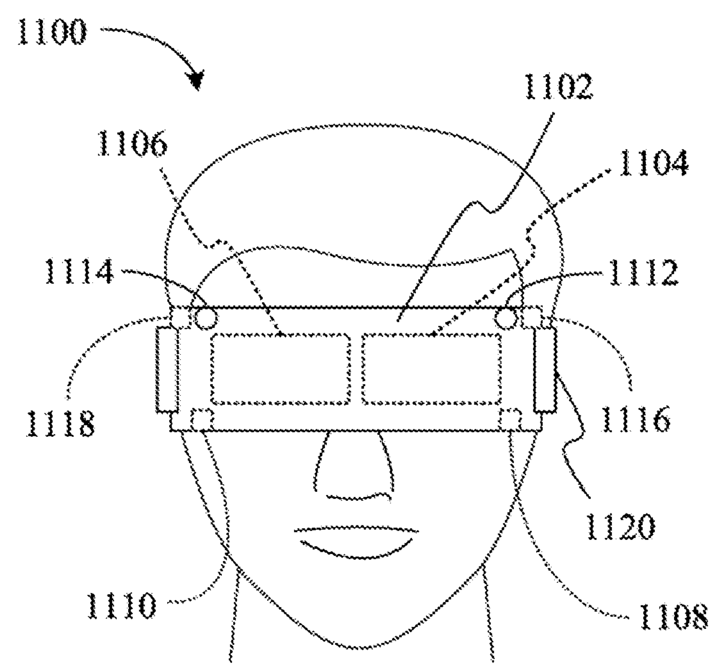
FIG. 11 is an illustration of an example of a head mounted display (HMD) system according to an embodiment.

FIG. 11 shows a head mounted display (HMD) system 1100 that is being worn by a user while experiencing an immersive environment such as, for example, a virtual reality (VR) environment, an augmented reality (AR) environment, a multi-player three-dimensional (3D) game, and so forth. In the illustrated example, one or more straps 1120 hold a frame 1102 of the HMD system 1100 in front of the eyes of the user. Accordingly, a left-eye display 1104 may be positioned to be viewed by the left eye of the user and a right-eye display 1106 may be positioned to be viewed by the right eye of the user. The left-eye display 1104 and the right-eye display 1106 may alternatively be integrated into a single display in certain examples such as, for example, a smart phone being worn by the user. In the case of AR, the displays 1104, 1106 may be view-through displays that permit the user to view the physical surroundings, with other rendered content (e.g., virtual characters, informational annotations, heads up display/HUD) being presented on top a live feed of the physical surroundings.

In one example, the frame 1102 includes a left look-down camera 1108 to capture images from an area generally in front of the user and beneath the left eye (e.g., left hand gestures). Additionally, a right look-down camera 1110 may capture images from an area generally in front of the user and beneath the right eye (e.g., right hand gestures). The illustrated frame 1102 also includes a left look-front camera 1112 and a right look-front camera 1114 to capture images in front of the left and right eyes, respectively, of the user. The frame 1102 may also include a left look-side camera 1116 to capture images from an area to the left of the user and a right look-side camera 1118 to capture images from an area to the right of the user.

The images captured by the cameras 1108, 1110, 1112, 1114, 1116, 1118, which may have overlapping fields of view, may be used to detect gestures made by the user as well as to analyze and/or reproduce the external environment on the displays 1104, 1106. In one example, the detected gestures are used by a graphics processing architecture (e.g., internal and/or external) to render and/or control a virtual representation of the user in a 3D game. Indeed, the overlapping fields of view may enable the capture of gestures made by other individuals (e.g., in a multi-player game), where the gestures of other individuals may be further used to render/control the immersive experience. The overlapping fields of view may also enable the HMD system 1100 to automatically detect obstructions or other hazards near the user. Such an approach may be particularly advantageous in advanced driver assistance system (ADAS) applications.

In one example, providing the left look-down camera 1108 and the right look-down camera 1110 with overlapping fields of view provides a stereoscopic view having an increased resolution. The increased resolution may in turn enable very similar user movements to be distinguished from one another (e.g., at sub-millimeter accuracy). The result may be an enhanced performance of the HMD system 1100 with respect to reliability. Indeed, the illustrated solution may be useful in a wide variety of applications such as, for example, coloring information in AR settings, exchanging virtual tools/devices between users in a multi-user environment, rendering virtual items (e.g., weapons, swords, staffs), and so forth. Gestures of other objects, limbs and/or body parts may also be detected and used to render/control the virtual environment. For example, myelographic signals, electroencephalographic signals, eye tracking, breathing or puffing, hand motions, etc., may be tracked in real-time, whether from the wearer or another individual in a shared environment. The images captured by the cameras 1108, 1110, 1112, 1114, 1116, 1118, may also serve as contextual input. For example, it might be determined that the user is indicating a particular word to edit or key to press in a word processing application, a particular weapon to deployed or a travel direction in a game, and so forth.

Additionally, the images captured by the cameras 1108, 1110, 1112, 1114, 1116, 1118, may be used to conduct shared communication or networked interactivity in equipment operation, medical training, and/or remote/tele-operation guidance applications. Task specific gesture libraries or neural network machine learning could enable tool identification and feedback for a task. For example, a virtual tool that translates into remote, real actions may be enabled. In yet another example, the HMD system 1100 translates the manipulation of a virtual drill within a virtual scene to the remote operation of a drill on a robotic device deployed to search a collapsed building. Moreover, the HMD system 1100 may be programmable to the extent that it includes, for example, a protocol that enables the user to add a new gesture to a list of identifiable gestures associated with user actions.

In addition, the various cameras in the HMD 1100 may be configurable to detect spectrum frequencies in addition to the visible wavelengths of the spectrum. Multi-spectral imaging capabilities in the input cameras allows position tracking of the user and/or objects by eliminating nonessential image features (e.g., background noise). For example, in augmented reality (AR) applications such as surgery, instruments and equipment may be tracked by their infrared reflectivity without the need for additional tracking aids. Moreover, HMD 1100 could be employed in situations of low visibility where a "live feed" from the various cameras could be enhanced or augmented through computer analysis and displayed to the user as visual or audio cues.

The HMD system 1100 may also forego performing any type of data communication with a remote computing system or need power cables (e.g., independent mode of operation). In this regard, the HMD system 1100 may be a "cordless" device having a power unit that enables the HMD system 1100 to operate independently of external power systems. Accordingly, the user might play a full featured game without being tethered to another device (e.g., game console) or power supply. In a word processing example, the HMD system 1100 might present a virtual keyboard and/or virtual mouse on the displays 1104 and 1106 to provide a virtual desktop or word processing scene. Thus, gesture recognition data captured by one or more of the cameras may represent user typing activities on the virtual keyboard or movements of the virtual mouse. Advantages include, but are not limited to, ease of portability and privacy of the virtual desktop from nearby individuals. The underlying graphics processing architecture may support compression and/or decompression of video and audio signals. Moreover, providing separate images to the left eye and right eye of the user may facilitate the rendering, generation and/or perception of 3D scenes. The relative positions of the left-eye display 1104 and the right-eye display 1106 may also be adjustable to match variations in eye separation between different users.

The number of cameras illustrated in FIG. 11 is to facilitate discussion only. Indeed, the HMD system 1100 may include less than six or more than six cameras, depending on the circumstances.

Functional Components of the HMD System

Figure 12:
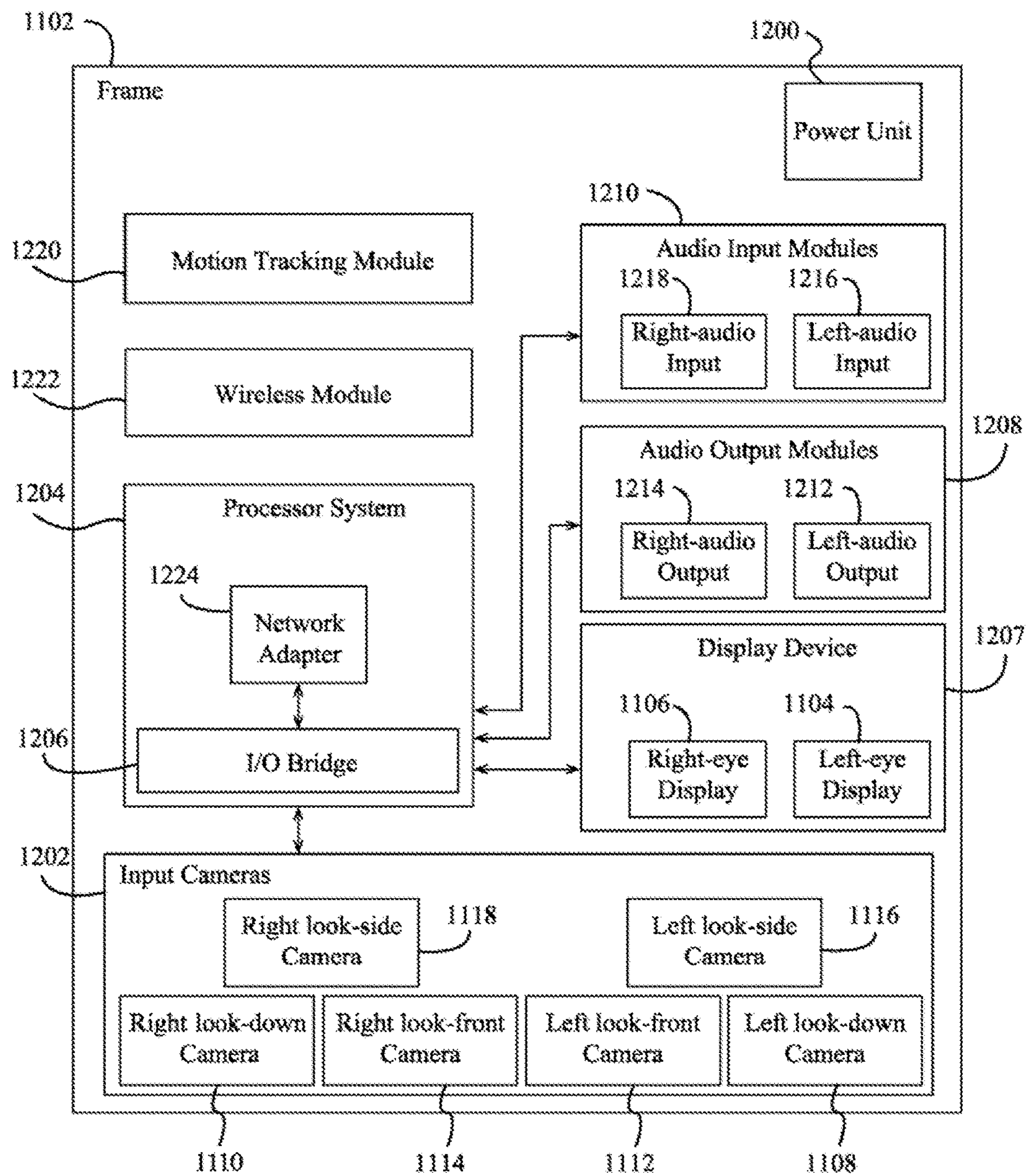
FIG. 12 is a block diagram of an example of the functional components included in the HMD system of FIG. 11 according to an embodiment.

FIG. 12 shows the HMD system in greater detail. In the illustrated example, the frame 1102 includes a power unit 1200 (e.g., battery power, adapter) to provide power to the HMD system. The illustrated frame 1102 also includes a motion tracking module 1220 (e.g., accelerometers, gyroscopes), wherein the motion tracking module 1220 provides motion tracking data, orientation data and/or position data to a processor system 1204. The processor system 1204 may include a network adapter 1224 that is coupled to an I/O bridge 1206. The I/O bridge 1206 may enable communications between the network adapter 1224 and various components such as, for example, audio input modules 1210, audio output modules 1208, a display device 1207, input cameras 1202, and so forth.

In the illustrated example, the audio input modules 1210 include a right-audio input 1218 and a left-audio input 1216, which detect sound that may be processed in order to recognize voice commands of the user as well as nearby individuals. The voice commands recognized in the captured audio signals may augment gesture recognition during modality switching and other applications. Moreover, the captured audio signals may provide 3D information that is used to enhance the immersive experience.

The audio output modules 1208 may include a right-audio output 1214 and a left-audio output 1212. The audio output modules 1208 may deliver sound to the ears of the user and/or other nearby individuals. The audio output modules 1208, which may be in the form of earbuds, on-ear speakers, over the ear speakers, loudspeakers, etc., or any combination thereof, may deliver stereo and/or 3D audio content to the user (e.g., spatial localization). The illustrated frame 1102 also includes a wireless module 1222, which may facilitate communications between the HMD system and various other systems (e.g., computers, wearable devices, game consoles). In one example, the wireless module 1222 communicates with the processor system 1204 via the network adapter 1224.

The illustrated display device 1207 includes the left-eye display 1104 and the right-eye display 1106, wherein the visual content presented on the displays 1104, 1106 may be obtained from the processor system 1204 via the I/O bridge 1206. The input cameras 1202 may include the left look-side camera 1116 the right look-side camera 1118, the left look-down camera 1108, the left look-front camera 1112, the right look-front camera 1114 and the right look-down camera 1110, already discussed.

Figure 13:
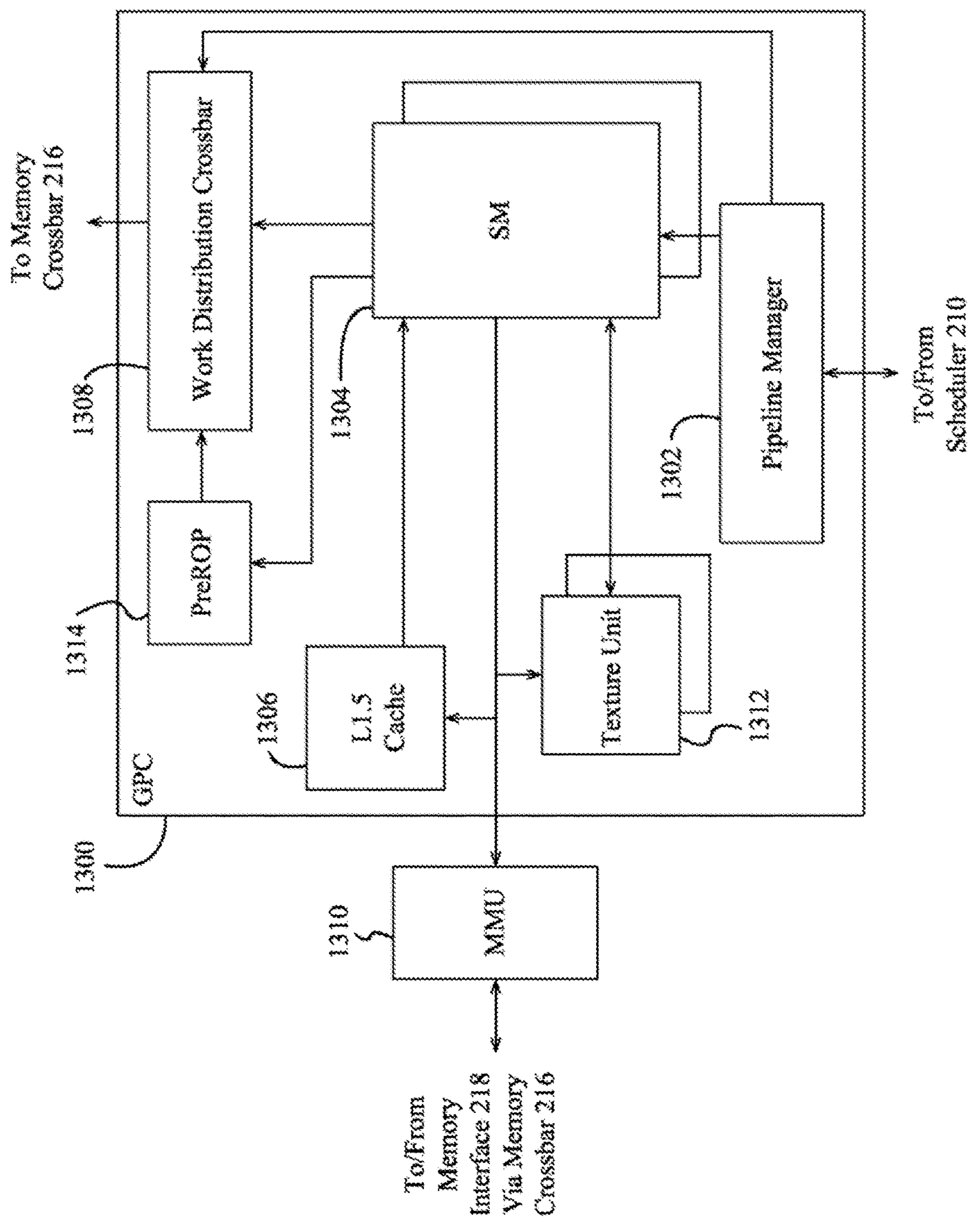
FIG. 13 is a block diagram of an example of a general processing cluster included in a parallel processing unit according to an embodiment.

Turning now FIG. 13, a general processing cluster (GPC) 1300 is shown. The illustrated GPC 1300 may be incorporated into a processing system such as, for example, the processor system 1204 (FIG. 12), already discussed. The GPC 1300 may include a pipeline manager 1302 that communicates with a scheduler. In one example, the pipeline manager 1302 receives tasks from the scheduler and distributes the tasks to one or more streaming multi-processors (SM's) 1304. Each SM 1304 may be configured to process thread groups, wherein a thread group may be considered a plurality of related threads that execute the same or similar operations on different input data. Thus, each thread in the thread group may be assigned to a particular SM 1304. In another example, the number of threads may be greater than the number of execution units in the SM 1304. In this regard, the threads of a thread group may operate in parallel. The pipeline manager 1302 may also specify processed data destinations to a work distribution crossbar 1308, which communicates with a memory crossbar.

Thus, as each SM 1304 transmits a processed task to the work distribution crossbar 1308, the processed task may be provided to another GPC 1300 for further processing. The output of the SM 1304 may also be sent to a pre-raster operations (preROP) unit 1314, which in turn directs data to one or more raster operations units, or performs other operations (e.g., performing address translations, organizing picture color data, blending color, and so forth). The SM 1304 may include an internal level one (L1) cache (not shown) to which the SM 1304 may store data. The SM 1304 may also have access to a level two (L2) cache (not shown) via a memory management unit (MMU) 1310 and a level one point five (L1.5) cache 1306. The MMU 1310 may map virtual addresses to physical addresses. In this regard, the MMU 1310 may include page table entries (PTE's) that are used to map virtual addresses to physical addresses of a tile, memory page and/or cache line index. The illustrated GPC 1300 also includes a texture unit 1312.

Graphics Pipeline Architecture

Figure 14:
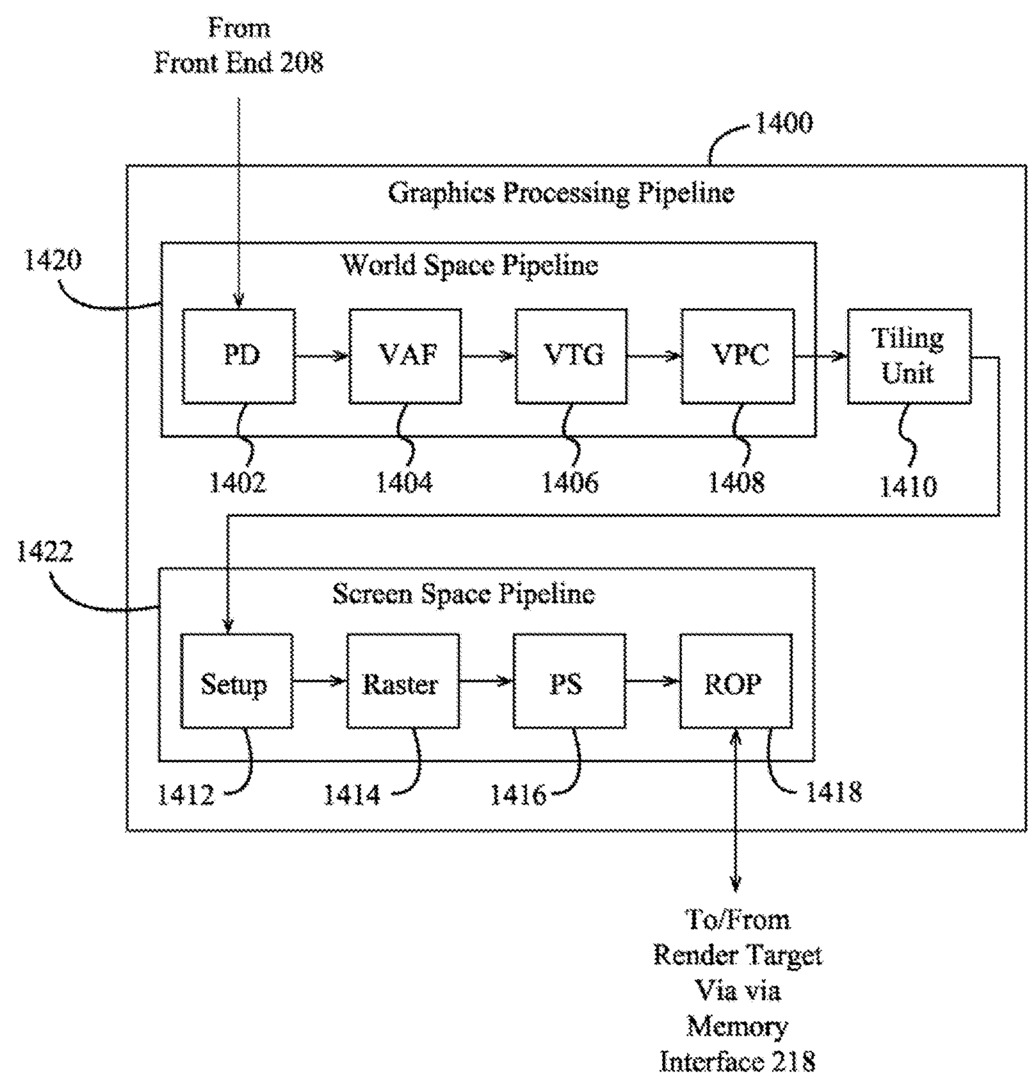
FIG. 14 is a conceptual illustration of an example of a graphics processing pipeline that may be implemented within a parallel processing unit, according to an embodiment.

Turning now to FIG. 14, a graphics pipeline 1400 is shown. In the illustrated example, a world space pipeline 1420 includes a primitive distributor (PD) 1402. The PD 1402 may collect vertex data associated with high-order services, graphics primitives, triangles, etc., and transmit the vertex data to a vertex attribute fetch unit (VAF) 1404. The VAF 1404 may retrieve vertex attributes associated with each of the incoming vertices from shared memory and store the vertex data, along with the associated vertex attributes, into shared memory.

The illustrated world space pipeline 1420 also includes a vertex, tessellation, geometry processing unit (VTG) 1406. The VTG 1406 may include, for example, a vertex processing unit, a tessellation initialization processing unit, a task distributor, a task generation unit, a topology generation unit, a geometry processing unit, a tessellation processing unit, etc., or any combination thereof. In one example, the VTG 1406 is a programmable execution unit that is configured to execute geometry programs, tessellation programs, and vertex shader programs. The programs executed by the VTG 1406 may process the vertex data and vertex attributes received from the VAF 1404. Moreover, the programs executed by the VTG 1406 may produce graphics primitives, color values, surface normal factors and transparency values at each vertex for the graphics primitives for further processing within the graphics processing pipeline 1400.

The vertex processing unit of the VTG 1406 may be a programmable execution unit that executes vertex shader programs, lighting and transforming vertex data as specified by the vertex shader programs. For example, the vertex processing unit might be programmed to transform the vertex data from an object-based coordinate representation (e.g. object space) to an alternatively based coordinate system such as world space or normalize device coordinates (NDC) space. Additionally, the vertex processing unit may read vertex data and vertex attributes that are stored in shared memory by the VAF 1404 and process the vertex data and vertex attributes. In one example, the vertex processing unit stores processed vertices in shared memory.

The tessellation initialization processing unit (e.g., hull shader, tessellation control shader) may execute tessellation initialization shader programs. In one example, the tessellation initialization processing unit processes vertices produced by the vertex processing unit and generates graphics primitives sometimes referred to as "patches". The tessellation initialization processing unit may also generate various patch attributes, wherein the patch data and the patch attributes are stored to shared memory. The task generation unit of the VTG 1406 may retrieve data and attributes for vertices and patches from shared memory. In one example, the task generation unit generates tasks for processing the vertices and patches for processing by the later stages in the graphics processing pipeline 1400.

The tasks produced by the task generation unit may be redistributed by the task distributor of the VTG 1406. For example, the tasks produced by the various instances of the vertex shader program and the tessellation initialization program may vary significantly between one graphics processing pipeline 1400 and another. Accordingly, the task distributor may redistribute these tasks such that each graphics processing pipeline 1400 has approximately the same workload during later pipeline stages.

As already noted, the VTG 1406 may also include a topology generation unit. In one example, the topology generation unit retrieves tasks distributed by the task distributor, indexes the vertices, including vertices associated with patches, and computes coordinates (UV) for tessellation vertices and the indices that connect the tessellation vertices to form graphics primitives. The indexed vertices may be stored by the topology generation unit in shared memory. The tessellation processing unit of the VTG 1406 may be configured to execute tessellation shader programs (e.g., domain shaders, tessellation evaluation shaders). The tessellation processing unit may read input data from shared memory and write output data to shared memory. The output data may be passed from the shared memory to the geometry processing unit (e.g., the next shader stage) as input data.

The geometry processing unit of the VTG 1406 may execute geometry shader programs to transform graphics primitives (e.g., triangles, line segments, points, etc.). In one example, vertices are grouped to construct graphics primitives, wherein the geometry processing unit subdivides the graphics primitives into one or more new graphics primitives. The geometry processing unit may also calculate parameters such as, for example, plain equation coefficients, that may be used to rasterize the new graphics primitives.

The illustrated world space pipeline 1420 also includes a viewport scale, cull, and clip unit (VPC) 1408 that receives the parameters and vertices specifying new graphics primitives from the VTG 1406. In one example, the VPC 1408 performs clipping, cuffing, perspective correction, and viewport transformation to identify the graphics primitives that are potentially viewable in the final rendered image. The VPC 1408 may also identify the graphics primitives that may not be viewable.

The graphics processing pipeline 1400 may also include a tiling unit 1410 coupled to the world space pipeline 1420. The tiling unit 1410 may be a graphics primitive sorting engine, wherein graphics primitives are processed in the world space pipeline 1420 and then transmitted to the tiling unit 1410. In this regard, the graphics processing pipeline 1400 may also include a screen space pipeline 1422, wherein the screen space may be divided into cache tiles. Each cache tile may therefore be associated with a portion of the screen space. For each graphics primitive, the tiling unit 1410 may identify the set of cache tiles that intersect with the graphics primitive (e.g. "tiling"). After tiling a number of graphics primitives, the tiling unit 1410 may process the graphics primitives on a cache tile basis. In one example, graphics primitives associated with a particular cache tile are transmitted to a setup unit 1412 in the screen space pipeline 1422 one tile at a time. Graphics primitives that intersect with multiple cache tiles may be processed once in the world space pipeline 1420, while being transmitted multiple times to the screen space pipeline 1422.

In one example, the setup unit 1412 receives vertex data from the VPC 1408 via the tiling unit 1410 and calculates parameters associated with the graphics primitives. The parameters may include, for example, edge equations, partial plane equations, and depth plain equations. The screen space pipeline 1422 may also include a rasterizer 1414 coupled to the setup unit 1412. The rasterizer may scan convert the new graphics primitives and transmit fragments and coverage data to a pixel shading unit (PS) 1416. The rasterizer 1414 may also perform Z culling and other Z-based optimizations.

The PS 1416, which may access shared memory, may execute fragment shader programs that transform fragments received from the rasterizer 1414. More particularly, the fragment shader programs may shade fragments at pixel-level granularity (e.g., functioning as pixel shader programs). In another example, the fragment shader programs shade fragments at sample-level granularity, where each pixel includes multiple samples, and each sample represents a portion of a pixel. Moreover, the fragment shader programs may shade fragments at any other granularity, depending on the circumstances (e.g., sampling rate). The PS 1416 may perform blending, shading, perspective correction, texture mapping, etc., to generate shaded fragments.

The illustrated screen space pipeline 1422 also includes a raster operations unit (ROP) 1418, which may perform raster operations such as, for example, stenciling, Z-testing, blending, and so forth. The ROP 1418 may then transmit pixel data as processed graphics data to one or more rendered targets (e.g., graphics memory). The ROP 1418 may be configured to compress Z or color data that is written to memory and decompress Z or color data that is read from memory. The location of the ROP 1418 may vary depending on the circumstances.

The graphics processing pipeline 1400 may be implemented by one or more processing elements. For example, the VTG 1406 and/or the PS 1416 may be implemented in one or more SM's, the PD 1402, the VAF 1404, the VPC 1408, the tiling unit 1410, the setup unit 1412, the rasterizer 1414 and/or the ROP 1418 might be implemented in processing elements of a particular GPC in conjunction with a corresponding partition unit. The graphics processing pipeline 1400 may also be implemented in fixed-functionality hardware logic. Indeed, the graphics processing pipeline 1400 may be implemented in a PPU.

Thus, the illustrated world space pipeline 1420 processes graphics objects in 3D space, where the position of each graphics object is known relative to other graphics objects and relative to a 3D coordinate system. By contrast, the screen space pipeline 1422 may process graphics objects that have been projected from the 3D coordinate system onto a 2D planar surface that represents the surface of the display device. Additionally, the world space pipeline 1420 may be divided into an alpha phase pipeline and a beta phase pipeline, wherein the alpha phase pipeline includes pipeline stages from the PD 1402 through the task generation unit. The beta phase pipeline might include pipeline stages from the topology generation unit through the VPC 1408. In such a case, the graphics processing pipeline 1400 may perform a first set of operations (e.g., a single thread, a thread group, multiple thread groups acting in unison) in the alpha phase pipeline and a second set of operations (e.g., a single thread, a thread group, multiple thread groups acting in unison) in the beta phase pipeline.

If multiple graphics processing pipelines 1400 are in use, the vertex data and vertex attributes associated with a set of graphics objects may be divided so that each graphics processing pipeline 1400 has a similar workload through the alpha phase. Accordingly, alpha phase processing may substantially expand the amount of vertex data and vertex attributes, such that the amount of vertex data and vertex attributes produced by the task generation unit is significantly larger than the amount of vertex data and vertex attributes processed by the PD 1402 and the VAF 1404. Moreover, the task generation units associated with different graphics processing pipelines 1400 may produce vertex data and vertex attributes having different levels of quality, even when beginning the alpha phase with the same quantity of attributes. In such cases, the task distributor may redistribute the attributes produced by the alpha phase pipeline so that each graphics processing pipeline 1400 has approximately the same workload at the beginning of the beta phase pipeline.

Figure 15:
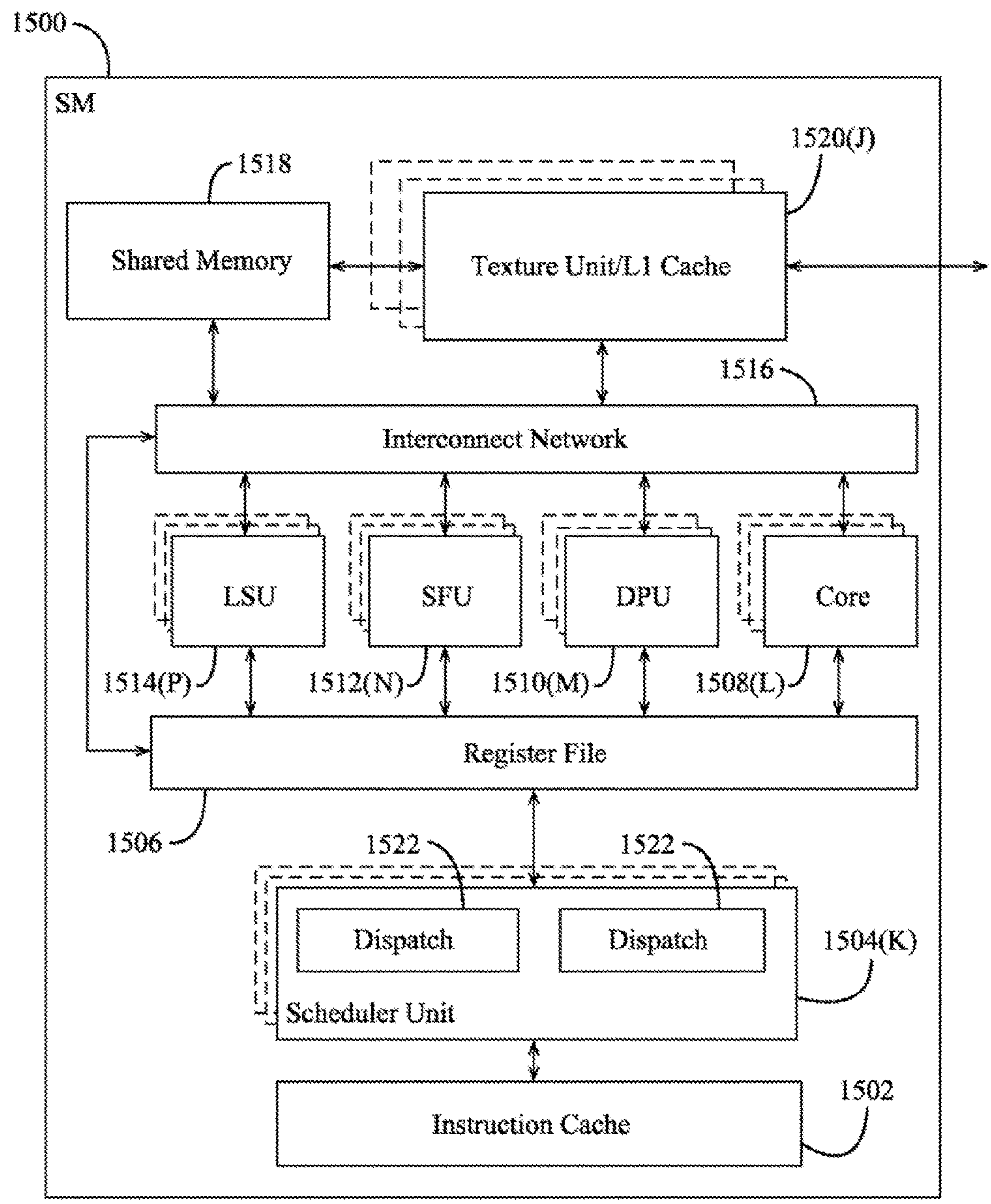
FIG. 15 is a block diagram of an example of a streaming multi-processor according to an embodiment.

Turning now to FIG. 15, a streaming multi-processor (SM) 1500 is shown. The illustrated SM 1500 includes K scheduler units 1504 coupled to an instruction cache 1502, wherein each scheduler unit 1504 receives a thread block array from a pipeline manager (not shown) and manages instruction scheduling for one or more thread blocks of each active thread block array. The scheduler unit 1504 may schedule threads for execution in groups of parallel threads, where each group may be referred to as a "warp". Thus, each warp might include, for example, sixty-four threads. Additionally, the scheduler unit 1504 may manage a plurality of different thread blocks, allocating the thread blocks to warps for execution. The scheduler unit may then schedule instructions from the plurality of different warps on various functional units during each clock cycle. Each scheduler unit 1504 may include one or more instructions dispatch units 1522, wherein each dispatch unit 1522 transmits instructions to one or more of the functional units. The number of dispatch units 1522 may vary depending on the circumstances. In the illustrated example, the scheduler unit 1504 includes two dispatch units 1522 that enable two different instructions from the same warp to be dispatched during each clock cycle.

The SM 1500 may also include a register file 1506. The register file 1506 may include a set of registers that are divided between the functional units such that each functional unit is allocated a dedicated portion of the register file 1506. The register file 1506 may also be divided between different warps being executed by the SM 1500. In one example the register file 1506 provides temporary storage for operands connected to the data paths of the functional units. The illustrated SM 1500 also includes L processing cores 1508, wherein L may be a relatively large number (e.g., 192). Each core 1508 may be a pipelined, single-precision processing unit that includes a floating point arithmetic logic unit (e.g., IEEE 754-2008) as well as an integer arithmetic logic unit.

The illustrated SM 1500 also includes M double precision units (DPU's) 1510, N special function units (SFU's) 1512 and P load/store units (LSU's) 1514. Each DPU 1510 may implement double-precision floating point arithmetic and each SFU 1512 may perform special functions such as, for example, rectangle copying pixel blending, etc. Additionally, each LSU 1514 may conduct load and store operations between a shared memory 1518 and the register file 1506. In one example, the load and store operations are conducted through J texture unit/L1 caches 1520 and an interconnected network 1516. In one example, the J texture unit/L1 caches 1520 are also coupled to a crossbar (not shown). Thus, the interconnect network 1516 may connect each of the functional units to the register file 1506 and to the shared memory 1518. In one example, the interconnect network 1516 functions as a crossbar that connects any of the functional units to any of the registers in the register file 1506.

The SM 1500 may be implemented within a graphics processor (e.g., graphics processing unit/GPU), wherein the texture unit/L1 caches 1520 may access texture maps from memory and sample the texture maps to produce sampled texture values for use in shader programs. Texture operations performed by the texture unit/L1 caches 1520 include, but are not limited to, antialiasing based on mipmaps.

Additional System Overview Example

Figure 16:
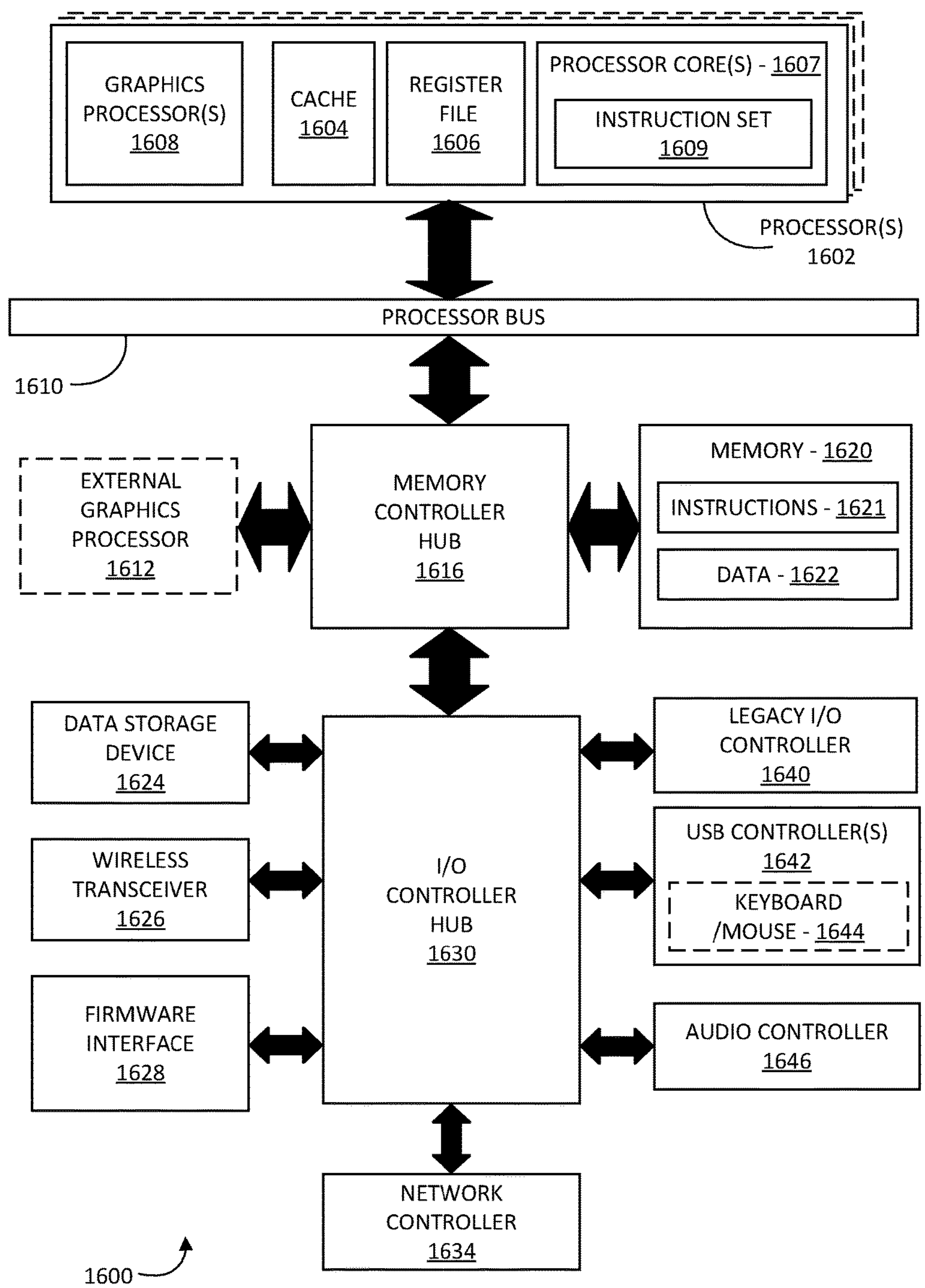
FIGS. 16-18 are block diagrams of an example of an overview of a data processing system according to an embodiment.

FIG. 16 is a block diagram of a processing system 1600, according to an embodiment. In various embodiments the system 1600 includes one or more processors 1602 and one or more graphics processors 1608, and may be a single processor desktop system, a multiprocessor workstation system, or a server system having a large number of processors 1602 or processor cores 1607. In on embodiment, the system 1600 is a processing platform incorporated within a system-on-a-chip (SoC) integrated circuit for use in mobile, handheld, or embedded devices.

An embodiment of system 1600 can include, or be incorporated within a server-based gaming platform, a game console, including a game and media console, a mobile gaming console, a handheld game console, or an online game console. In some embodiments system 1600 is a mobile phone, smart phone, tablet computing device or mobile Internet device. Data processing system 1600 can also include, couple with, or be integrated within a wearable device, such as a smart watch wearable device, smart eyewear device, augmented reality device, or virtual reality device. In some embodiments, data processing system 1600 is a television or set top box device having one or more processors 1602 and a graphical interface generated by one or more graphics processors 1608.

In some embodiments, the one or more processors 1602 each include one or more processor cores 1607 to process instructions which, when executed, perform operations for system and user software. In some embodiments, each of the one or more processor cores 1607 is configured to process a specific instruction set 1609. In some embodiments, instruction set 1609 may facilitate Complex Instruction Set Computing (CISC), Reduced Instruction Set Computing (RISC), or computing via a Very Long Instruction Word (VLIW). Multiple processor cores 1607 may each process a different instruction set 1609, which may include instructions to facilitate the emulation of other instruction sets. Processor core 1607 may also include other processing devices, such a Digital Signal Processor (DSP).

In some embodiments, the processor 1602 includes cache memory 1604. Depending on the architecture, the processor 1602 can have a single internal cache or multiple levels of internal cache. In some embodiments, the cache memory is shared among various components of the processor 1602. In some embodiments, the processor 1602 also uses an external cache (e.g., a Level-3 (L3) cache or Last Level Cache (LLC)) (not shown), which may be shared among processor cores 1607 using known cache coherency techniques. A register file 1606 is additionally included in processor 1602 which may include different types of registers for storing different types of data (e.g., integer registers, floating point registers, status registers, and an instruction pointer register). Some registers may be general-purpose registers, while other registers may be specific to the design of the processor 1602.

In some embodiments, processor 1602 is coupled to a processor bus 1610 to transmit communication signals such as address, data, or control signals between processor 1602 and other components in system 1600. In one embodiment the system 1600 uses an exemplary 'hub' system architecture, including a memory controller hub 1616 and an Input Output (I/O) controller hub 1630. A memory controller hub 1616 facilitates communication between a memory device and other components of system 1600, while an I/O Controller Hub (ICH) 1630 provides connections to I/O devices via a local I/O bus. In one embodiment, the logic of the memory controller hub 1616 is integrated within the processor.

Memory device 1620 can be a dynamic random access memory (DRAM) device, a static random access memory (SRAM) device, flash memory device, phase-change memory device, or some other memory device having suitable performance to serve as process memory. In one embodiment the memory device 1620 can operate as system memory for the system 1600, to store data 1622 and instructions 1621 for use when the one or more processors 1602 executes an application or process. Memory controller hub 1616 also couples with an optional external graphics processor 1612, which may communicate with the one or more graphics processors 1608 in processors 1602 to perform graphics and media operations.

In some embodiments, ICH 1630 enables peripherals to connect to memory device 1620 and processor 1602 via a high-speed I/O bus. The I/O peripherals include, but are not limited to, an audio controller 1646, a firmware interface 1628, a wireless transceiver 1626 (e.g., Wi-Fi, Bluetooth), a data storage device 1624 (e.g., hard disk drive, flash memory, etc.), and a legacy I/O controller 1640 for coupling legacy (e.g., Personal System 2 (PS/2)) devices to the system. One or more Universal Serial Bus (USB) controllers 1642 connect input devices, such as keyboard and mouse 1644 combinations. A network controller 1634 may also couple to ICH 1630. In some embodiments, a high-performance network controller (not shown) couples to processor bus 1610. It will be appreciated that the system 1600 shown is exemplary and not limiting, as other types of data processing systems that are differently configured may also be used. For example, the I/O controller hub 1630 may be integrated within the one or more processor 1602, or the memory controller hub 1616 and I/O controller hub 1630 may be integrated into a discreet external graphics processor, such as the external graphics processor 1612.

Figure 17:
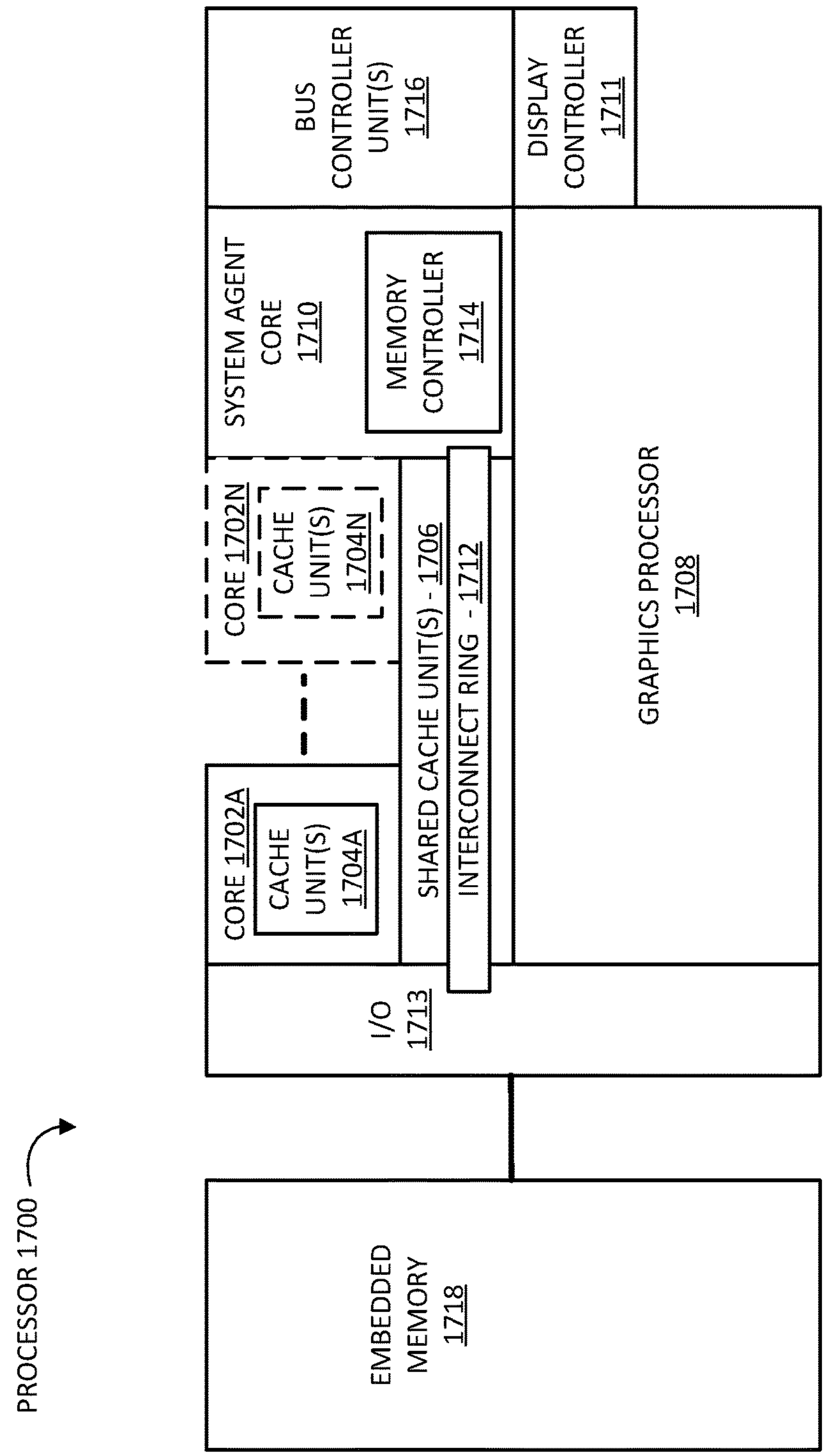

FIG. 17 is a block diagram of an embodiment of a processor 1700 having one or more processor cores 1702A-1702N, an integrated memory controller 1714, and an integrated graphics processor 1708. Those elements of FIG. 17 having the same reference numbers (or names) as the elements of any other figure herein can operate or function in any manner similar to that described elsewhere herein, but are not limited to such. Processor 1700 can include additional cores up to and including additional core 1702N represented by the dashed lined boxes. Each of processor cores 1702A-1702N includes one or more internal cache units 1704A-1704N. In some embodiments each processor core also has access to one or more shared cached units 1706.

The internal cache units 1704A-1704N and shared cache units 1706 represent a cache memory hierarchy within the processor 1700. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1706 and 1704A-1704N.

In some embodiments, processor 1700 may also include a set of one or more bus controller units 1716 and a system agent core 1710. The one or more bus controller units 1716 manage a set of peripheral buses, such as one or more Peripheral Component Interconnect buses (e.g., PCI, PCI Express). System agent core 1710 provides management functionality for the various processor components. In some embodiments, system agent core 1710 includes one or more integrated memory controllers 1714 to manage access to various external memory devices (not shown).

In some embodiments, one or more of the processor cores 1702A-1702N include support for simultaneous multi-threading. In such embodiment, the system agent core 1710 includes components for coordinating and operating cores 1702A-1702N during multi-threaded processing. System agent core 1710 may additionally include a power control unit (PCU), which includes logic and components to regulate the power state of processor cores 1702A-1702N and graphics processor 1708.

In some embodiments, processor 1700 additionally includes graphics processor 1708 to execute graphics processing operations. In some embodiments, the graphics processor 1708 couples with the set of shared cache units 1706, and the system agent core 1710, including the one or more integrated memory controllers 1714. In some embodiments, a display controller 1711 is coupled with the graphics processor 1708 to drive graphics processor output to one or more coupled displays. In some embodiments, display controller 1711 may be a separate module coupled with the graphics processor via at least one interconnect, or may be integrated within the graphics processor 1708 or system agent core 1710.

In some embodiments, a ring based interconnect unit 1712 is used to couple the internal components of the processor 1700. However, an alternative interconnect unit may be used, such as a point-to-point interconnect, a switched interconnect, or other techniques, including techniques well known in the art. In some embodiments, graphics processor 1708 couples with the ring interconnect 1712 via an I/O link 1713.

The exemplary I/O link 1713 represents at least one of multiple varieties of I/O interconnects, including an on package I/O interconnect which facilitates communication between various processor components and a high-performance embedded memory module 1718, such as an eDRAM module. In some embodiments, each of the processor cores 1702-1702N and graphics processor 1708 use embedded memory modules 1718 as a shared Last Level Cache.

In some embodiments, processor cores 1702A-1702N are homogenous cores executing the same instruction set architecture. In another embodiment, processor cores 1702A-1702N are heterogeneous in terms of instruction set architecture (ISA), where one or more of processor cores 1702A-N execute a first instruction set, while at least one of the other cores executes a subset of the first instruction set or a different instruction set. In one embodiment processor cores 1702A-1702N are heterogeneous in terms of microarchitecture, where one or more cores having a relatively higher power consumption couple with one or more power cores having a lower power consumption. Additionally, processor 1700 can be implemented on one or more chips or as an SoC integrated circuit having the illustrated components, in addition to other components.

Figure 18:
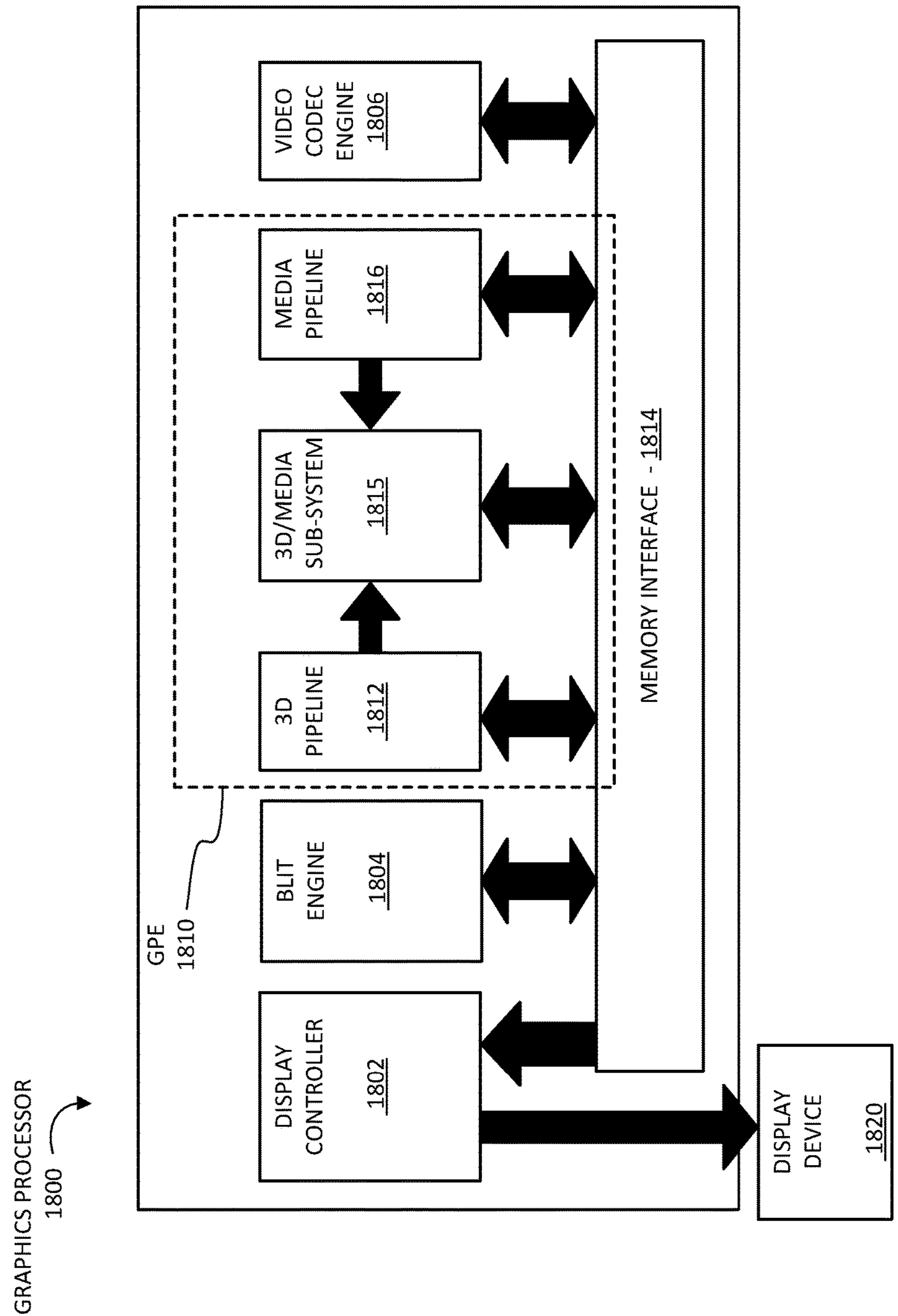

FIG. 18 is a block diagram of a graphics processor 1800, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1800 includes a memory interface 1814 to access memory. Memory interface 1814 can be an interface to local memory, one or more internal caches, one or more shared external caches, and/or to system memory.

In some embodiments, graphics processor 1800 also includes a display controller 1802 to drive display output data to a display device 1820. Display controller 1802 includes hardware for one or more overlay planes for the display and composition of multiple layers of video or user interface elements. In some embodiments, graphics processor 1800 includes a video codec engine 1806 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 1800 includes a block image transfer (BLIT) engine 1804 to perform two-dimensional (2D) rasterizer operations including, for example, bit-boundary block transfers. However, in one embodiment, 2D graphics operations are performed using one or more components of graphics processing engine (GPE) 1810. In some embodiments, graphics processing engine 1810 is a compute engine for performing graphics operations, including three-dimensional (3D) graphics operations and media operations.

In some embodiments, GPE 1810 includes a 3D pipeline 1812 for performing 3D operations, such as rendering three-dimensional images and scenes using processing functions that act upon 3D primitive shapes (e.g., rectangle, triangle, etc.). The 3D pipeline 1812 includes programmable and fixed function elements that perform various tasks within the element and/or spawn execution threads to a 3D/Media sub-system 1815. While 3D pipeline 1812 can be used to perform media operations, an embodiment of GPE 1810 also includes a media pipeline 1816 that is specifically used to perform media operations, such as video post-processing and image enhancement.

In some embodiments, media pipeline 1816 includes fixed function or programmable logic units to perform one or more specialized media operations, such as video decode acceleration, video de-interlacing, and video encode acceleration in place of, or on behalf of video codec engine 1806. In some embodiments, media pipeline 1816 additionally includes a thread spawning unit to spawn threads for execution on 3D/Media sub-system 1815. The spawned threads perform computations for the media operations on one or more graphics execution units included in 3D/Media subsystem 1815.

In some embodiments, 3D/Media subsystem 1815 includes logic for executing threads spawned by 3D pipeline 1812 and media pipeline 1816. In one embodiment, the pipelines send thread execution requests to 3D/Media subsystem 1815, which includes thread dispatch logic for arbitrating and dispatching the various requests to available thread execution resources. The execution resources include an array of graphics execution units to process the 3D and media threads. In some embodiments, 3D/Media subsystem 1815 includes one or more internal caches for thread instructions and data. In some embodiments, the subsystem also includes shared memory, including registers and addressable memory, to share data between threads and to store output data.

3D/Media Processing

Figure 19:
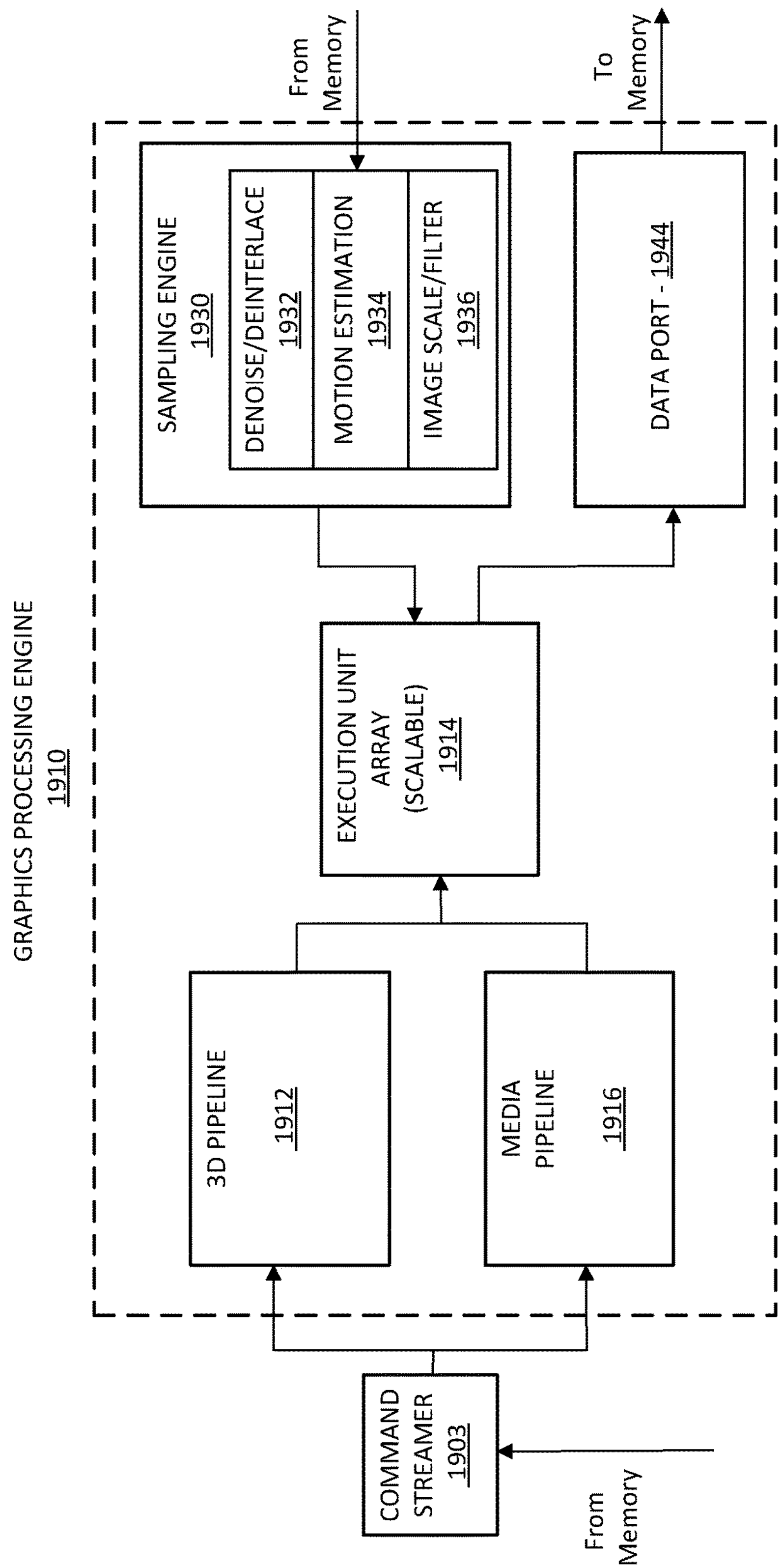
FIG. 19 is a block diagram of an example of a graphics processing engine according to an embodiment.

FIG. 19 is a block diagram of a graphics processing engine 1910 of a graphics processor in accordance with some embodiments. In one embodiment, the GPE 1910 is a version of the GPE 1810 shown in FIG. 18. Elements of FIG. 19 having the same reference numbers (or names) as the elements of any other figure herein can operate or function in any manner similar to that described elsewhere herein, but are not limited to such.

In some embodiments, GPE 1910 couples with a command streamer 1903, which provides a command stream to the GPE 3D and media pipelines 1912, 1916. In some embodiments, command streamer 1903 is coupled to memory, which can be system memory, or one or more of internal cache memory and shared cache memory. In some embodiments, command streamer 1903 receives commands from the memory and sends the commands to 3D pipeline 1912 and/or media pipeline 1916. The commands are directives fetched from a ring buffer, which stores commands for the 3D and media pipelines 1912, 1916. In one embodiment, the ring buffer can additionally include batch command buffers storing batches of multiple commands. The 3D and media pipelines 1912, 1916 process the commands by performing operations via logic within the respective pipelines or by dispatching one or more execution threads to an execution unit array 1914. In some embodiments, execution unit array 1914 is scalable, such that the array includes a variable number of execution units based on the target power and performance level of GPE 1910.

In some embodiments, a sampling engine 1930 couples with memory (e.g., cache memory or system memory) and execution unit array 1914. In some embodiments, sampling engine 1930 provides a memory access mechanism for execution unit array 1914 that allows execution array 1914 to read graphics and media data from memory. In some embodiments, sampling engine 1930 includes logic to perform specialized image sampling operations for media.

In some embodiments, the specialized media sampling logic in sampling engine 1930 includes a de-noise/de-interlace module 1932, a motion estimation module 1934, and an image scaling and filtering module 1936. In some embodiments, de-noise/de-interlace module 1932 includes logic to perform one or more of a de-noise or a de-interlace algorithm on decoded video data. The de-interlace logic combines alternating fields of interlaced video content into a single fame of video. The de-noise logic reduces or removes data noise from video and image data. In some embodiments, the de-noise logic and de-interlace logic are motion adaptive and use spatial or temporal filtering based on the amount of motion detected in the video data. In some embodiments, the de-noise/de-interlace module 1932 includes dedicated motion detection logic (e.g., within the motion estimation engine 1934).

In some embodiments, motion estimation engine 1934 provides hardware acceleration for video operations by performing video acceleration functions such as motion vector estimation and prediction on video data. The motion estimation engine determines motion vectors that describe the transformation of image data between successive video frames. In some embodiments, a graphics processor media codec uses video motion estimation engine 1934 to perform operations on video at the macro-block level that may otherwise be too computationally intensive to perform with a general-purpose processor. In some embodiments, motion estimation engine 1934 is generally available to graphics processor components to assist with video decode and processing functions that are sensitive or adaptive to the direction or magnitude of the motion within video data.

In some embodiments, image scaling and filtering module 1936 performs image-processing operations to enhance the visual quality of generated images and video. In some embodiments, scaling and filtering module 1936 processes image and video data during the sampling operation before providing the data to execution unit array 1914.

In some embodiments, the GPE 1910 includes a data port 1944, which provides an additional mechanism for graphics subsystems to access memory. In some embodiments, data port 1944 facilitates memory access for operations including render target writes, constant buffer reads, scratch memory space reads/writes, and media surface accesses. In some embodiments, data port 1944 includes cache memory space to cache accesses to memory. The cache memory can be a single data cache or separated into multiple caches for the multiple subsystems that access memory via the data port (e.g., a render buffer cache, a constant buffer cache, etc.). In some embodiments, threads executing on an execution unit in execution unit array 1914 communicate with the data port by exchanging messages via a data distribution interconnect that couples each of the sub-systems of GPE 1910.

Execution Units

Figure 20:
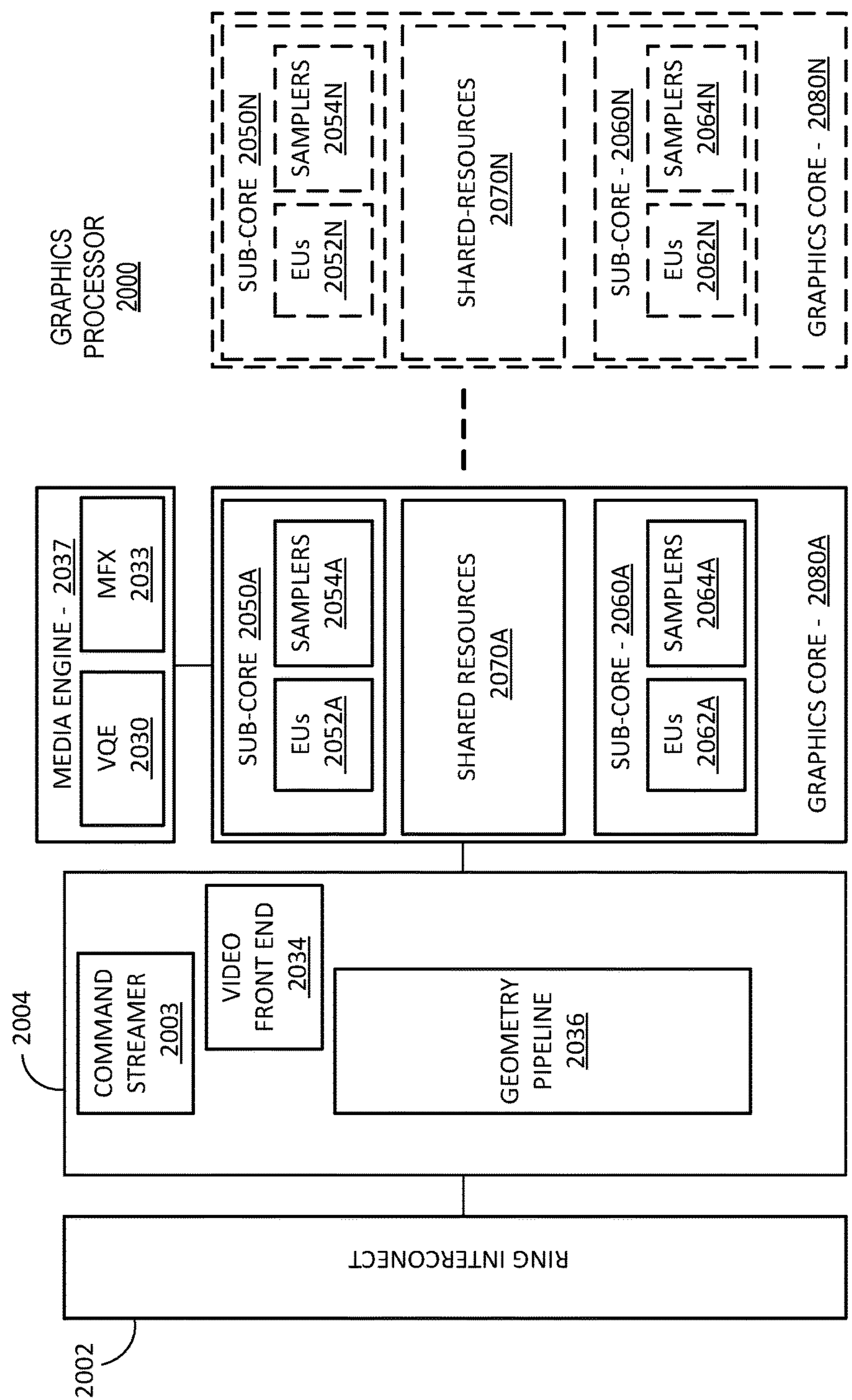
FIGS. 20-22 are block diagrams of examples of execution units according to an embodiment.

FIG. 20 is a block diagram of another embodiment of a graphics processor 2000. Elements of FIG. 20 having the same reference numbers (or names) as the elements of any other figure herein can operate or function in any manner similar to that described elsewhere herein, but are not limited to such.

In some embodiments, graphics processor 2000 includes a ring interconnect 2002, a pipeline front-end 2004, a media engine 2037, and graphics cores 2080A-2080N. In some embodiments, ring interconnect 2002 couples the graphics processor to other processing units, including other graphics processors or one or more general-purpose processor cores. In some embodiments, the graphics processor is one of many processors integrated within a multi-core processing system.

In some embodiments, graphics processor 2000 receives batches of commands via ring interconnect 2002. The incoming commands are interpreted by a command streamer 2003 in the pipeline front-end 2004. In some embodiments, graphics processor 2000 includes scalable execution logic to perform 3D geometry processing and media processing via the graphics core(s) 2080A-2080N. For 3D geometry processing commands, command streamer 2003 supplies commands to geometry pipeline 2036. For at least some media processing commands, command streamer 2003 supplies the commands to a video front end 2034, which couples with a media engine 2037. In some embodiments, media engine 2037 includes a Video Quality Engine (VQE) 2030 for video and image post-processing and a multi-format encode/decode (MFX) 2033 engine to provide hardware-accelerated media data encode and decode. In some embodiments, geometry pipeline 2036 and media engine 2037 each generate execution threads for the thread execution resources provided by at least one graphics core 2080A.

In some embodiments, graphics processor 2000 includes scalable thread execution resources featuring modular cores 2080A-2080N (sometimes referred to as core slices), each having multiple sub-cores 2050A-2050N, 2060A-2060N (sometimes referred to as core sub-slices). In some embodiments, graphics processor 2000 can have any number of graphics cores 2080A through 2080N. In some embodiments, graphics processor 2000 includes a graphics core 2080A having at least a first sub-core 2050A and a second core sub-core 2060A. In other embodiments, the graphics processor is a low power processor with a single sub-core (e.g., 2050A). In some embodiments, graphics processor 2000 includes multiple graphics cores 2080A-2080N, each including a set of first sub-cores 2050A-2050N and a set of second sub-cores 2060A-2060N. Each sub-core in the set of first sub-cores 2050A-2050N includes at least a first set of execution units 2052A-2052N and media/texture samplers 2054A-2054N. Each sub-core in the set of second sub-cores 2060A-2060N includes at least a second set of execution units 2062A-2062N and samplers 2064A-2064N. In some embodiments, each sub-core 2050A-2050N, 2060A-2060N shares a set of shared resources 2070A-2070N. In some embodiments, the shared resources include shared cache memory and pixel operation logic. Other shared resources may also be included in the various embodiments of the graphics processor.

Figure 21:
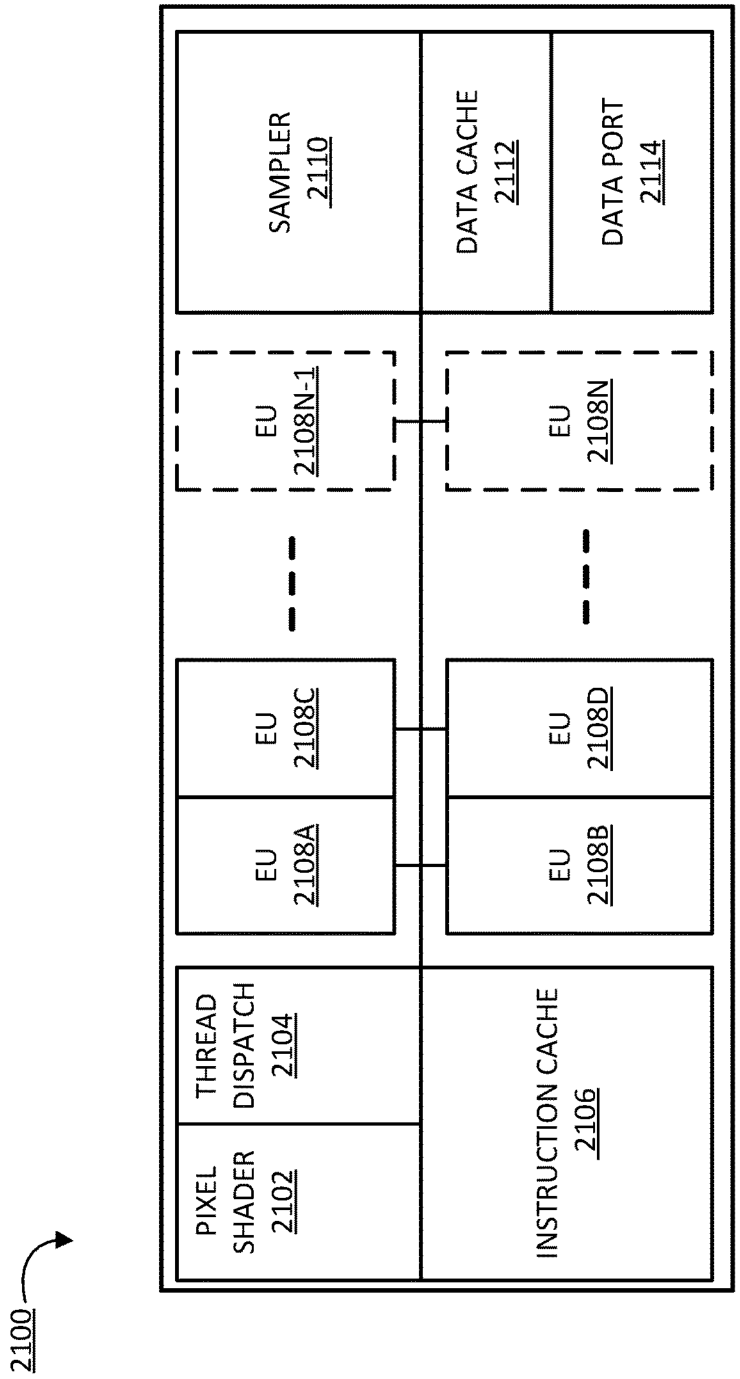

FIG. 21 illustrates thread execution logic 2100 including an array of processing elements employed in some embodiments of a GPE. Elements of FIG. 21 having the same reference numbers (or names) as the elements of any other figure herein can operate or function in any manner similar to that described elsewhere herein, but are not limited to such.

In some embodiments, thread execution logic 2100 includes a pixel shader 2102, a thread dispatcher 2104, instruction cache 2106, a scalable execution unit array including a plurality of execution units 2108A-2108N, a sampler 2110, a data cache 2112, and a data port 2114. In one embodiment the included components are interconnected via an interconnect fabric that links to each of the components. In some embodiments, thread execution logic 2100 includes one or more connections to memory, such as system memory or cache memory, through one or more of instruction cache 2106, data port 2114, sampler 2110, and execution unit array 2108A-2108N. In some embodiments, each execution unit (e.g. 2108A) is an individual vector processor capable of executing multiple simultaneous threads and processing multiple data elements in parallel for each thread. In some embodiments, execution unit array 2108A-2108N includes any number individual execution units.

In some embodiments, execution unit array 2108A-2108N is primarily used to execute "shader" programs. In some embodiments, the execution units in array 2108A-2108N execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in execution unit array 2108A-2108N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 2108A-2108N support integer and floating-point data types.

The execution unit instruction set includes single instruction multiple data (SIMD) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

One or more internal instruction caches (e.g., 2106) are included in the thread execution logic 2100 to cache thread instructions for the execution units. In some embodiments, one or more data caches (e.g., 2112) are included to cache thread data during thread execution. In some embodiments, sampler 2110 is included to provide texture sampling for 3D operations and media sampling for media operations. In some embodiments, sampler 2110 includes specialized texture or media sampling functionality to process texture or media data during the sampling process before providing the sampled data to an execution unit.

During execution, the graphics and media pipelines send thread initiation requests to thread execution logic 2100 via thread spawning and dispatch logic. In some embodiments, thread execution logic 2100 includes a local thread dispatcher 2104 that arbitrates thread initiation requests from the graphics and media pipelines and instantiates the requested threads on one or more execution units 2108A-2108N. For example, the geometry pipeline (e.g., 2036 of FIG. 20) dispatches vertex processing, tessellation, or geometry processing threads to thread execution logic 2100 (FIG. 21). In some embodiments, thread dispatcher 2104 can also process runtime thread spawning requests from the executing shader programs.

Once a group of geometric objects has been processed and rasterized into pixel data, pixel shader 2102 is invoked to further compute output information and cause results to be written to output surfaces (e.g., color buffers, depth buffers, stencil buffers, etc.). In some embodiments, pixel shader 2102 calculates the values of the various vertex attributes that are to be interpolated across the rasterized object. In some embodiments, pixel shader 2102 then executes an application programming interface (API)-supplied pixel shader program. To execute the pixel shader program, pixel shader 2102 dispatches threads to an execution unit (e.g., 2108A) via thread dispatcher 2104. In some embodiments, pixel shader 2102 uses texture sampling logic in sampler 2110 to access texture data in texture maps stored in memory. Arithmetic operations on the texture data and the input geometry data compute pixel color data for each geometric fragment, or discards one or more pixels from further processing.

In some embodiments, the data port 2114 provides a memory access mechanism for the thread execution logic 2100 output processed data to memory for processing on a graphics processor output pipeline. In some embodiments, the data port 2114 includes or couples to one or more cache memories (e.g., data cache 2112) to cache data for memory access via the data port.

Figure 22:
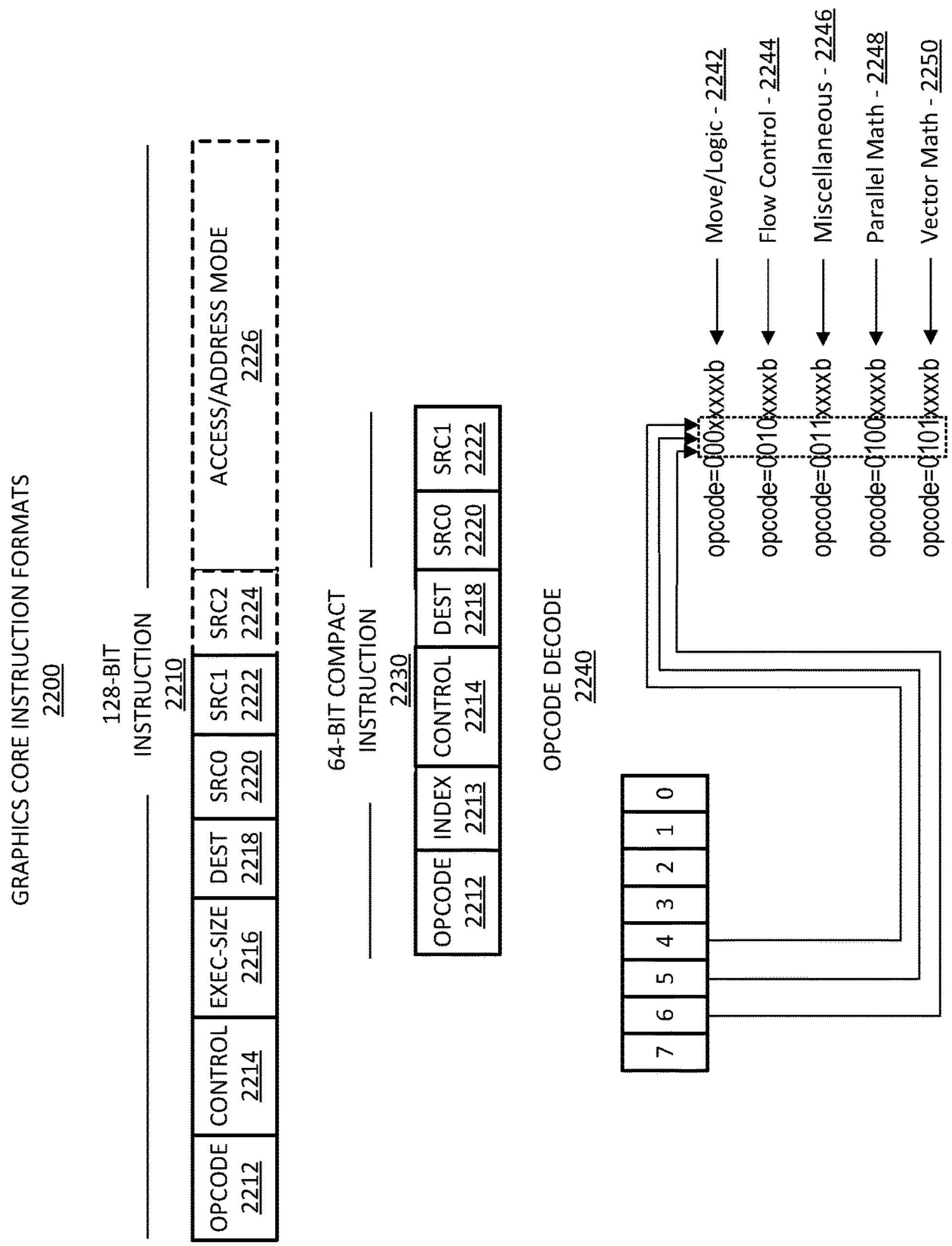

FIG. 22 is a block diagram illustrating a graphics processor instruction formats 2200 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 2200 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit format 2210. A 64-bit compacted instruction format 2230 is available for some instructions based on the selected instruction, instruction options, and number of operands. The native 128-bit format 2210 provides access to all instruction options, while some options and operations are restricted in the 64-bit format 2230. The native instructions available in the 64-bit format 2230 vary by embodiment. In some embodiments, the instruction is compacted in part using a set of index values in an index field 2213. The execution unit hardware references a set of compaction tables based on the index values and uses the compaction table outputs to reconstruct a native instruction in the 128-bit format 2210.

For each format, instruction opcode 2212 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 2214 enables control over certain execution options, such as channels selection (e.g., predication) and data channel order (e.g., swizzle). For 128-bit instructions 2210 an exec-size field 2216 limits the number of data channels that will be executed in parallel. In some embodiments, exec-size field 2216 is not available for use in the 64-bit compact instruction format 2230.

Some execution unit instructions have up to three operands including two source operands, src0 2220, src1 2222, and one destination 2218. In some embodiments, the execution units support dual destination instructions, where one of the destinations is implied. Data manipulation instructions can have a third source operand (e.g., SRC2 2224), where the instruction opcode 2212 determines the number of source operands. An instruction's last source operand can be an immediate (e.g., hard-coded) value passed with the instruction.

In some embodiments, the 128-bit instruction format 2210 includes an access/address mode information 2226 specifying, for example, whether direct register addressing mode or indirect register addressing mode is used. When direct register addressing mode is used, the register address of one or more operands is directly provided by bits in the instruction 2210.

In some embodiments, the 128-bit instruction format 2210 includes an access/address mode field 2226, which specifies an address mode and/or an access mode for the instruction. In one embodiment the access mode to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction 2210 may use byte-aligned addressing for source and destination operands and when in a second mode, the instruction 2210 may use 16-byte-aligned addressing for all source and destination operands.

In one embodiment, the address mode portion of the access/address mode field 2226 determines whether the instruction is to use direct or indirect addressing. When direct register addressing mode is used bits in the instruction 2210 directly provide the register address of one or more operands. When indirect register addressing mode is used, the register address of one or more operands may be computed based on an address register value and an address immediate field in the instruction.

In some embodiments instructions are grouped based on opcode 2212 bit-fields to simplify Opcode decode 2240. For an 8-bit opcode, bits 4, 5, and 6 allow the execution unit to determine the type of opcode. The precise opcode grouping shown is merely an example. In some embodiments, a move and logic opcode group 2242 includes data movement and logic instructions (e.g., move (mov), compare (cmp)). In some embodiments, move and logic group 2242 shares the five most significant bits (MSB), where move (mov) instructions are in the form of 0000xxxxb and logic instructions are in the form of 0001xxxxb. A flow control instruction group 2244 (e.g., call, jump (jmp)) includes instructions in the form of 0010xxxxb (e.g., 0x20). A miscellaneous instruction group 2246 includes a mix of instructions, including synchronization instructions (e.g., wait, send) in the form of 0011xxxxb (e.g., 0x30). A parallel math instruction group 2248 includes component-wise arithmetic instructions (e.g., add, multiply (mul)) in the form of 0100xxxxb (e.g., 0x40). The parallel math group 2248 performs the arithmetic operations in parallel across data channels. The vector math group 2250 includes arithmetic instructions (e.g., dp4) in the form of 0101xxxxb (e.g., 0x50). The vector math group performs arithmetic such as dot product calculations on vector operands.

Graphics Pipeline

Figure 23:
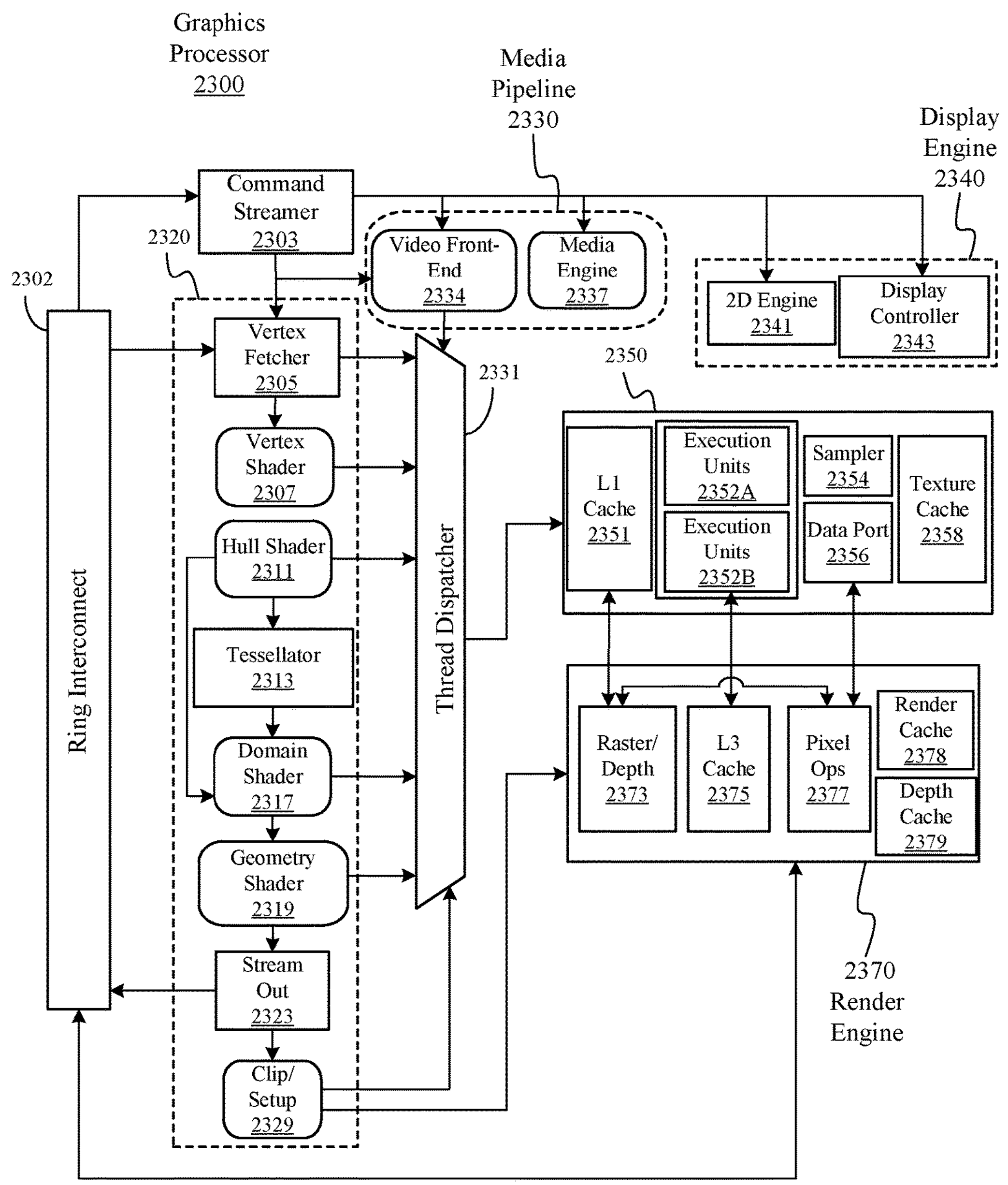
FIG. 23 is a block diagram of an example of a graphics pipeline according to an embodiment.

FIG. 23 is a block diagram of another embodiment of a graphics processor 2300. Elements of FIG. 23 having the same reference numbers (or names) as the elements of any other figure herein can operate or function in any manner similar to that described elsewhere herein, but are not limited to such.

In some embodiments, graphics processor 2300 includes a graphics pipeline 2320, a media pipeline 2330, a display engine 2340, thread execution logic 2350, and a render output pipeline 2370. In some embodiments, graphics processor 2300 is a graphics processor within a multi-core processing system that includes one or more general purpose processing cores. The graphics processor is controlled by register writes to one or more control registers (not shown) or via commands issued to graphics processor 2300 via a ring interconnect 2302. In some embodiments, ring interconnect 2302 couples graphics processor 2300 to other processing components, such as other graphics processors or general-purpose processors. Commands from ring interconnect 2302 are interpreted by a command streamer 2303, which supplies instructions to individual components of graphics pipeline 2320 or media pipeline 2330.

In some embodiments, command streamer 2303 directs the operation of a vertex fetcher 2305 that reads vertex data from memory and executes vertex-processing commands provided by command streamer 2303. In some embodiments, vertex fetcher 2305 provides vertex data to a vertex shader 2307, which performs coordinate space transformation and lighting operations to each vertex. In some embodiments, vertex fetcher 2305 and vertex shader 2307 execute vertex-processing instructions by dispatching execution threads to execution units 2352A, 2352B via a thread dispatcher 2331.

In some embodiments, execution units 2352A, 2352B are an array of vector processors having an instruction set for performing graphics and media operations. In some embodiments, execution units 2352A, 2352B have an attached L1 cache 2351 that is specific for each array or shared between the arrays. The cache can be configured as a data cache, an instruction cache, or a single cache that is partitioned to contain data and instructions in different partitions.

In some embodiments, graphics pipeline 2320 includes tessellation components to perform hardware-accelerated tessellation of 3D objects. In some embodiments, a programmable hull shader 2311 configures the tessellation operations. A programmable domain shader 2317 provides back-end evaluation of tessellation output. A tessellator 2313 operates at the direction of hull shader 2311 and contains special purpose logic to generate a set of detailed geometric objects based on a coarse geometric model that is provided as input to graphics pipeline 2320. In some embodiments, if tessellation is not used, tessellation components 2311, 2313, 2317 can be bypassed.

In some embodiments, complete geometric objects can be processed by a geometry shader 2319 via one or more threads dispatched to execution units 2352A, 2352B, or can proceed directly to the clipper 2329. In some embodiments, the geometry shader operates on entire geometric objects, rather than vertices or patches of vertices as in previous stages of the graphics pipeline. If the tessellation is disabled the geometry shader 2319 receives input from the vertex shader 2307. In some embodiments, geometry shader 2319 is programmable by a geometry shader program to perform geometry tessellation if the tessellation units are disabled.

Before rasterization, a clipper 2329 processes vertex data. The clipper 2329 may be a fixed function clipper or a programmable clipper having clipping and geometry shader functions. In some embodiments, a rasterizer 2373 (e.g., depth test component) in the render output pipeline 2370 dispatches pixel shaders to convert the geometric objects into their per pixel representations. In some embodiments, pixel shader logic is included in thread execution logic 2350. In some embodiments, an application can bypass the rasterizer 2373 and access un-rasterized vertex data via a stream out unit 2323.

The graphics processor 2300 has an interconnect bus, interconnect fabric, or some other interconnect mechanism that allows data and message passing amongst the major components of the processor. In some embodiments, execution units 2352A, 2352B and associated cache(s) 2351, texture and media sampler 2354, and texture/sampler cache 2358 interconnect via a data port 2356 to perform memory access and communicate with render output pipeline components of the processor. In some embodiments, sampler 2354, caches 2351, 2358 and execution units 2352A, 2352B each have separate memory access paths.

In some embodiments, render output pipeline 2370 contains a rasterizer 2373 that converts vertex-based objects into an associated pixel-based representation. In some embodiments, the rasterizer logic includes a windower/masker unit to perform fixed function triangle and line rasterization. An associated render cache 2378 and depth cache 2379 are also available in some embodiments. A pixel operations component 2377 performs pixel-based operations on the data, though in some instances, pixel operations associated with 2D operations (e.g. bit block image transfers with blending) are performed by the 2D engine 2341, or substituted at display time by the display controller 2343 using overlay display planes. In some embodiments, a shared L3 cache 2375 is available to all graphics components, allowing the sharing of data without the use of main system memory.

In some embodiments, graphics processor media pipeline 2330 includes a media engine 2337 and a video front end 2334. In some embodiments, video front end 2334 receives pipeline commands from the command streamer 2303. In some embodiments, media pipeline 2330 includes a separate command streamer. In some embodiments, video front-end 2334 processes media commands before sending the command to the media engine 2337. In some embodiments, media engine 2337 includes thread spawning functionality to spawn threads for dispatch to thread execution logic 2350 via thread dispatcher 2331.

In some embodiments, graphics processor 2300 includes a display engine 2340. In some embodiments, display engine 2340 is external to processor 2300 and couples with the graphics processor via the ring interconnect 2302, or some other interconnect bus or fabric. In some embodiments, display engine 2340 includes a 2D engine 2341 and a display controller 2343. In some embodiments, display engine 2340 contains special purpose logic capable of operating independently of the 3D pipeline. In some embodiments, display controller 2343 couples with a display device (not shown), which may be a system integrated display device, as in a laptop computer, or an external display device attached via a display device connector.

In some embodiments, graphics pipeline 2320 and media pipeline 2330 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL) and Open Computing Language (OpenCL) from the Khronos Group, the Direct3D library from the Microsoft Corporation, or support may be provided to both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 24A:
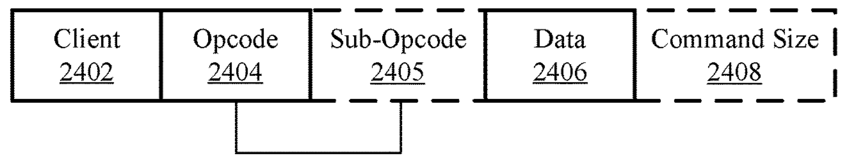
FIGS. 24A-24B are block diagrams of examples of graphics pipeline programming according to an embodiment.
Figure 24B:
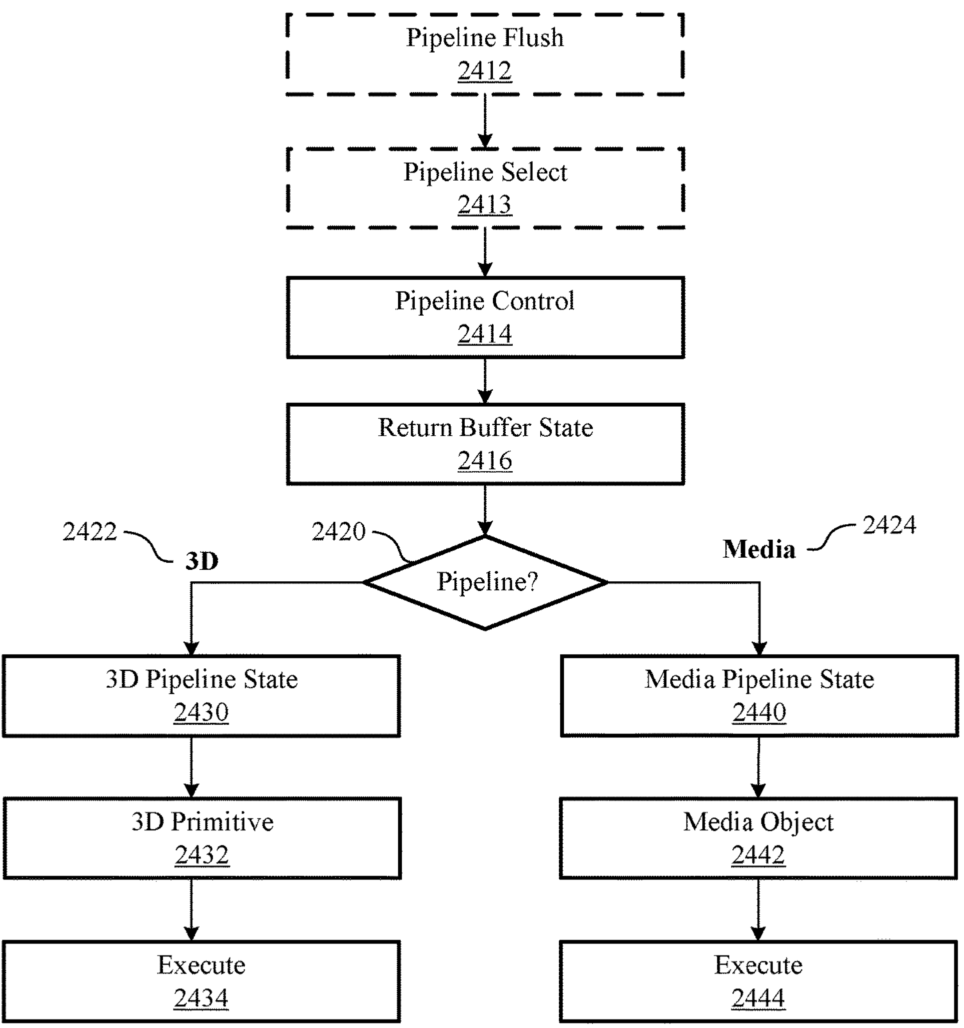

FIG. 24A is a block diagram illustrating a graphics processor command format 2400 according to some embodiments. FIG. 24B is a block diagram illustrating a graphics processor command sequence 2410 according to an embodiment. The solid lined boxes in FIG. 24A illustrate the components that are generally included in a graphics command while the dashed lines include components that are optional or that are only included in a sub-set of the graphics commands. The exemplary graphics processor command format 2400 of FIG. 24A includes data fields to identify a target client 2402 of the command, a command operation code (opcode) 2404, and the relevant data 2406 for the command. A sub-opcode 2405 and a command size 2408 are also included in some commands.

In some embodiments, client 2402 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 2404 and, if present, sub-opcode 2405 to determine the operation to perform. The client unit performs the command using information in data field 2406. For some commands an explicit command size 2408 is expected to specify the size of the command. In some embodiments, the command parser automatically determines the size of at least some of the commands based on the command opcode. In some embodiments commands are aligned via multiples of a double word.

The flow diagram in FIG. 24B shows an exemplary graphics processor command sequence 2410. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 2410 may begin with a pipeline flush command 2412 to cause any active graphics pipeline to complete the currently pending commands for the pipeline. In some embodiments, the 3D pipeline 2422 and the media pipeline 2424 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 2412 can be used for pipeline synchronization or before placing the graphics processor into a low power state.

In some embodiments, a pipeline select command 2413 is used when a command sequence requires the graphics processor to explicitly switch between pipelines. In some embodiments, a pipeline select command 2413 is required only once within an execution context before issuing pipeline commands unless the context is to issue commands for both pipelines. In some embodiments, a pipeline flush command is 2412 is required immediately before a pipeline switch via the pipeline select command 2413.

In some embodiments, a pipeline control command 2414 configures a graphics pipeline for operation and is used to program the 3D pipeline 2422 and the media pipeline 2424. In some embodiments, pipeline control command 2414 configures the pipeline state for the active pipeline. In one embodiment, the pipeline control command 2414 is used for pipeline synchronization and to clear data from one or more cache memories within the active pipeline before processing a batch of commands.

In some embodiments, return buffer state commands 2416 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 2416 includes selecting the size and number of return buffers to use for a set of pipeline operations.

The remaining commands in the command sequence differ based on the active pipeline for operations. Based on a pipeline determination 2420, the command sequence is tailored to the 3D pipeline 2422 beginning with the 3D pipeline state 2430, or the media pipeline 2424 beginning at the media pipeline state 2440.

The commands for the 3D pipeline state 2430 include 3D state setting commands for vertex buffer state, vertex element state, constant color state, depth buffer state, and other state variables that are to be configured before 3D primitive commands are processed. The values of these commands are determined at least in part based the particular 3D API in use. In some embodiments, 3D pipeline state 2430 commands are also able to selectively disable or bypass certain pipeline elements if those elements will not be used.

In some embodiments, 3D primitive 2432 command is used to submit 3D primitives to be processed by the 3D pipeline. Commands and associated parameters that are passed to the graphics processor via the 3D primitive 2432 command are forwarded to the vertex fetch function in the graphics pipeline. The vertex fetch function uses the 3D primitive 2432 command data to generate vertex data structures. The vertex data structures are stored in one or more return buffers. In some embodiments, 3D primitive 2432 command is used to perform vertex operations on 3D primitives via vertex shaders. To process vertex shaders, 3D pipeline 2422 dispatches shader execution threads to graphics processor execution units.

In some embodiments, 3D pipeline 2422 is triggered via an execute 2434 command or event. In some embodiments, a register write triggers command execution. In some embodiments execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 2410 follows the media pipeline 2424 path when performing media operations. In general, the specific use and manner of programming for the media pipeline 2424 depends on the media or compute operations to be performed. Specific media decode operations may be offloaded to the media pipeline during media decode. In some embodiments, the media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 2424 is configured in a similar manner as the 3D pipeline 2422. A set of media pipeline state commands 2440 are dispatched or placed into in a command queue before the media object commands 2442. In some embodiments, media pipeline state commands 2440 include data to configure the media pipeline elements that will be used to process the media objects. This includes data to configure the video decode and video encode logic within the media pipeline, such as encode or decode format. In some embodiments, media pipeline state commands 2440 also support the use one or more pointers to "indirect" state elements that contain a batch of state settings.

In some embodiments, media object commands 2442 supply pointers to media objects for processing by the media pipeline. The media objects include memory buffers containing video data to be processed. In some embodiments, all media pipeline states must be valid before issuing a media object command 2442. Once the pipeline state is configured and media object commands 2442 are queued, the media pipeline 2424 is triggered via an execute command 2444 or an equivalent execute event (e.g., register write). Output from media pipeline 2424 may then be post processed by operations provided by the 3D pipeline 2422 or the media pipeline 2424. In some embodiments, GPGPU operations are configured and executed in a similar manner as media operations.

Graphics Software Architecture

Figure 25:
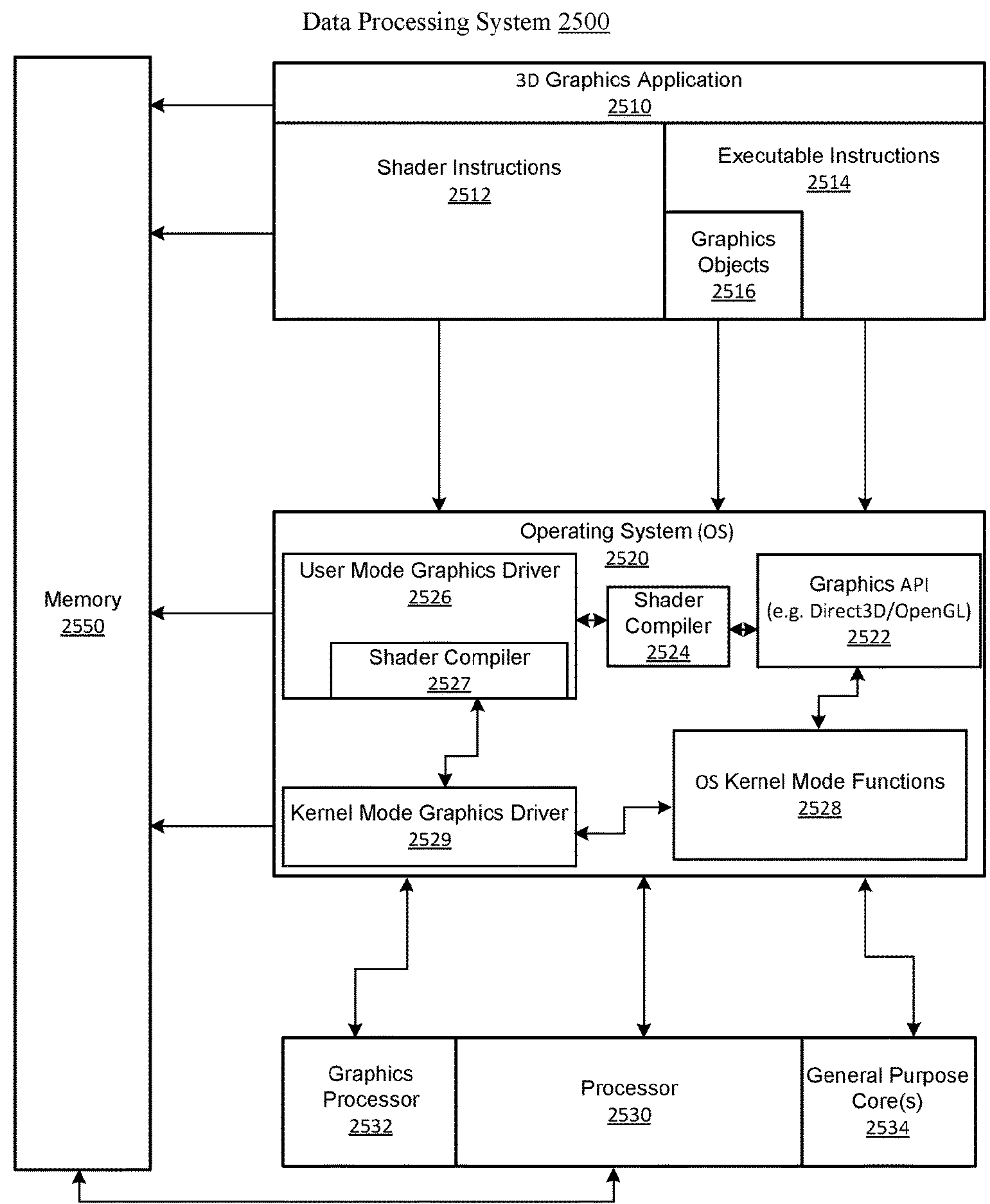
FIG. 25 is a block diagram of an example of a graphics software architecture according to an embodiment.

FIG. 25 illustrates exemplary graphics software architecture for a data processing system 2500 according to some embodiments. In some embodiments, software architecture includes a 3D graphics application 2510, an operating system 2520, and at least one processor 2530. In some embodiments, processor 2530 includes a graphics processor 2532 and one or more general-purpose processor core(s) 2534. The graphics application 2510 and operating system 2520 each execute in the system memory 2550 of the data processing system.

In some embodiments, 3D graphics application 2510 contains one or more shader programs including shader instructions 2512. The shader language instructions may be in a high-level shader language, such as the High Level Shader Language (HLSL) or the OpenGL Shader Language (GLSL). The application also includes executable instructions 2514 in a machine language suitable for execution by the general-purpose processor core 2534. The application also includes graphics objects 2516 defined by vertex data.

In some embodiments, operating system 2520 is a Microsoft® Windows® operating system from the Microsoft Corporation, a proprietary UNIX-like operating system, or an open source UNIX-like operating system using a variant of the Linux kernel. When the Direct3D API is in use, the operating system 2520 uses a front-end shader compiler 2524 to compile any shader instructions 2512 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 2510.

In some embodiments, user mode graphics driver 2526 contains a back-end shader compiler 2527 to convert the shader instructions 2512 into a hardware specific representation. When the OpenGL API is in use, shader instructions 2512 in the GLSL high-level language are passed to a user mode graphics driver 2526 for compilation. In some embodiments, user mode graphics driver 2526 uses operating system kernel mode functions 2528 to communicate with a kernel mode graphics driver 2529. In some embodiments, kernel mode graphics driver 2529 communicates with graphics processor 2532 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 26:
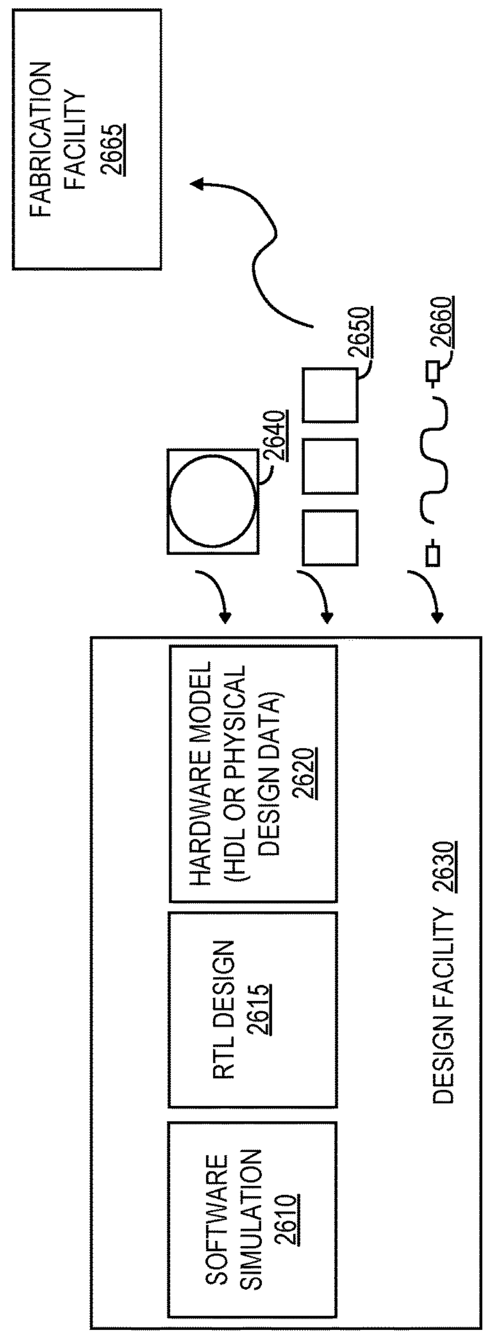
FIG. 26 is a block diagram of an example of an intellectual property (IP) core development system according to an embodiment.

FIG. 26 is a block diagram illustrating an IP core development system 2600 that may be used to manufacture an integrated circuit to perform operations according to an embodiment. The IP core development system 2600 may be used to generate modular, reusable designs that can be incorporated into a larger design or used to construct an entire integrated circuit (e.g., an SOC integrated circuit). A design facility 2630 can generate a software simulation 2610 of an IP core design in a high level programming language (e.g., C/C++). The software simulation 2610 can be used to design, test, and verify the behavior of the IP core. A register transfer level (RTL) design can then be created or synthesized from the simulation model 2600. The RTL design 2615 is an abstraction of the behavior of the integrated circuit that models the flow of digital signals between hardware registers, including the associated logic performed using the modeled digital signals. In addition to an RTL design 2615, lower-level designs at the logic level or transistor level may also be created, designed, or synthesized. Thus, the particular details of the initial design and simulation may vary.

The RTL design 2615 or equivalent may be further synthesized by the design facility into a hardware model 2620, which may be in a hardware description language (HDL), or some other representation of physical design data. The HDL may be further simulated or tested to verify the IP core design. The IP core design can be stored for delivery to a $3^{rd}$ party fabrication facility 2665 using non-volatile memory 2640 (e.g., hard disk, flash memory, or any non-volatile storage medium). Alternatively, the IP core design may be transmitted (e.g., via the Internet) over a wired connection 2650 or wireless connection 2660. The fabrication facility 2665 may then fabricate an integrated circuit that is based at least in part on the IP core design. The fabricated integrated circuit can be configured to perform operations in accordance with at least one embodiment described herein.

Figure 27:
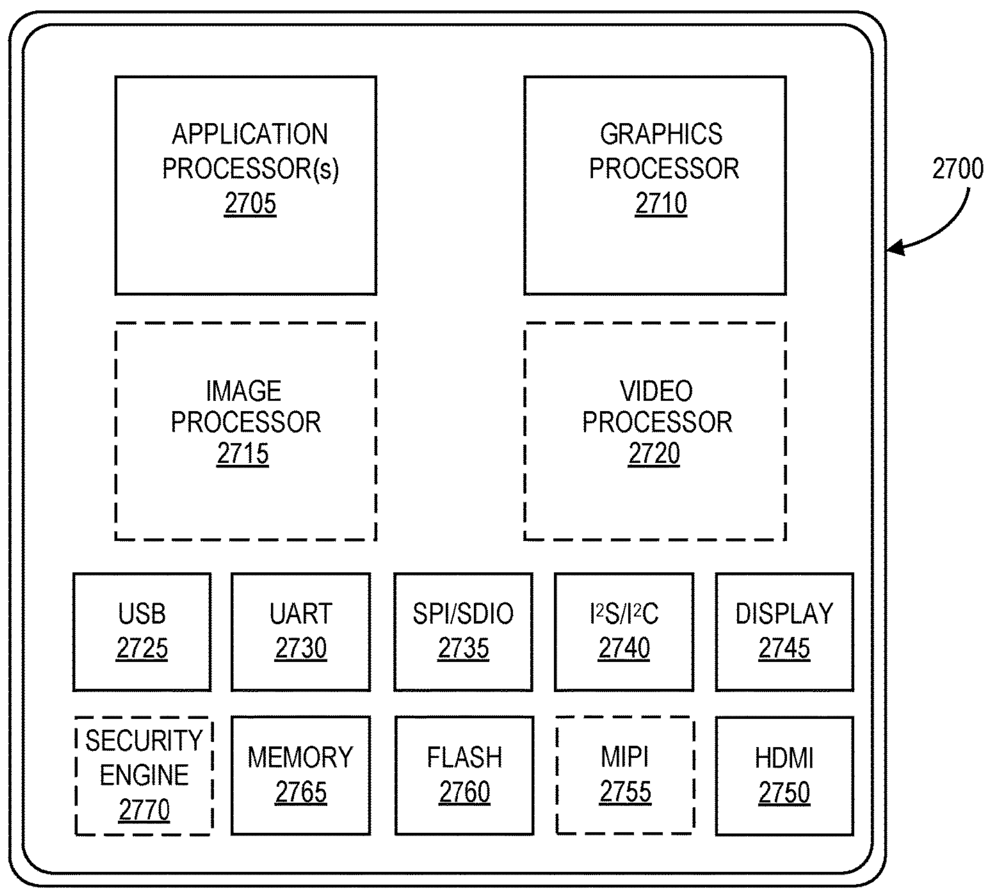
FIG. 27 is a block diagram of an example of a system on a chip integrated circuit according to an embodiment.

FIG. 27 is a block diagram illustrating an exemplary system on a chip integrated circuit 2700 that may be fabricated using one or more IP cores, according to an embodiment. The exemplary integrated circuit includes one or more application processors 2705 (e.g., CPUs), at least one graphics processor 2710, and may additionally include an image processor 2715 and/or a video processor 2720, any of which may be a modular IP core from the same or multiple different design facilities. The integrated circuit includes peripheral or bus logic including a USB controller 2725, UART controller 2730, an SPI/SDIO controller 2735, and an $I^2S/I^2C$ controller 2740. Additionally, the integrated circuit can include a display device 2745 coupled to one or more of a high-definition multimedia interface (HDMI) controller 2750 and a mobile industry processor interface (MIPI) display interface 2755. Storage may be provided by a flash memory subsystem 2760 including flash memory and a flash memory controller. Memory interface may be provided via a memory controller 2765 for access to SDRAM or SRAM memory devices. Some integrated circuits additionally include an embedded security engine 2770.

Additionally, other logic and circuits may be included in the processor of integrated circuit 2700, including additional graphics processors/cores, peripheral interface controllers, or general purpose processor cores.

In one example, the L1 cache 308 (FIG. 3) and/or the L2 cache 450 (FIG. 4) may support field recovery of graphics on-die memory as described with respect to FIGS. 6-10B and in the Examples below.

ADDITIONAL NOTES AND EXAMPLES

Example 1 may include a performance-enhanced computing system comprising a display, a power supply to provide power to the system, and a semiconductor apparatus including a substrate, an on-die memory coupled to the substrate, the on-die memory including a redundant portion, and logic coupled to the substrate, wherein the logic is implemented in one or more of configurable logic or fixed-functionality hardware logic, the logic to identify the redundant portion of the on-die memory, detect, during a field test of the on-die memory, one or more failed memory cells in the on-die memory, and substitute one or more memory cells in the redundant portion for the one or more failed memory cells.

Example 2 may include the system of Example 1, wherein the logic is to program a fuse override to a permanent data structure to substitute the one or memory cells in the redundant portion for the one or more failed memory cells.

Example 3 may include the system of Example 1, wherein the field test is to include a built-in self-test process.

Example 4 may include the system of Example 1, wherein the logic is to execute the field test in response to one or more of a periodic timer expiration, a power down condition, a power up condition or an idleness condition.

Example 5 may include the system of Example 1, wherein redundant portion includes one or more of redundant rows or redundant columns.

Example 6 may include the system of any one of Examples 1 to 5, wherein the on-die memory includes one or more of a graphics cache or a graphics register file.

Example 7 may include a semiconductor package apparatus comprising a substrate, an on-die memory coupled to the substrate, the on-die memory including a redundant portion, and logic coupled to the substrate, wherein the logic is implemented in one or more of configurable logic or fixed-functionality hardware logic, the logic to identify the redundant portion of the on-die memory, detect, during a field test of the on-die memory, one or more failed memory cells in the on-die memory, and substitute one or more memory cells in the redundant portion for the one or more failed memory cells.

Example 8 may include the apparatus of Example 7, wherein the logic is to program a fuse override to a permanent data structure to substitute the one or memory cells in the redundant portion for the one or more failed memory cells.

Example 9 may include the apparatus of Example 7, wherein the field test is to include a built-in self-test process.

Example 10 may include the apparatus of Example 7, wherein the logic is to execute the field test in response to one or more of a periodic timer expiration, a power down condition, a power up condition or an idleness condition.

Example 11 may include the apparatus of Example 7, wherein redundant portion includes one or more of redundant rows or redundant columns.

Example 12 may include the apparatus of any one of Examples 7 to 11, wherein the on-die memory includes one or more of a graphics cache or a graphics register file.

Example 13 may include a method of operating a semiconductor package apparatus, comprising identifying a redundant portion of a packaged on-die memory, detecting, during a field test of the packaged on-die memory, one or more failed memory cells in the packaged on-die memory, and substituting one or more memory cells in the redundant portion for the one or more failed memory cells.

Example 14 may include the method of Example 13, wherein substituting the one or more memory cells in the redundant portion for the one or more failed memory cells includes programming a fuse override to a permanent data structure.

Example 15 may include the method of Example 13, wherein the field test includes a built-in self-test (BIST) process.

Example 16 may include the method of Example 13, further including executing the field test in response to one or more of a periodic timer expiration, a power down condition, a power up condition or an idleness condition.

Example 17 may include the method of Example 13, wherein the redundant portion includes one or more of redundant rows or redundant columns.

Example 18 may include the method of any one of Examples 13 to 17, wherein the packaged on-die memory includes one or more of a graphics cache or a graphics register file.

Example 19 may include at least one computer readable storage medium comprising a set of instructions, which when executed by a computing system, cause the computing system to identify a redundant portion of a packaged on-die memory, detect, during a field test of the packaged on-die memory, one or more failed memory cells in the packaged on-die memory, and substitute one or more memory cells in the redundant portion for the one or more failed memory cells.

Example 20 may include the at least one computer readable storage medium of Example 19, wherein the instructions, when executed, cause the computing system to program a fuse override to a permanent data structure to substitute the one or memory cells in the redundant portion for the one or more failed memory cells.

Example 21 may include the at least one computer readable storage medium of Example 19, wherein the field test is to include a built-in self-test process.

Example 22 may include the at least one computer readable storage medium of Example 19, wherein the instructions, when executed, cause the computing system to execute the field test in response to one or more of a periodic timer expiration, a power down condition, a power up condition or an idleness condition.

Example 23 may include the at least one computer readable storage medium of Example 19, wherein the redundant portion is to include one or more of redundant rows or redundant columns.

Example 24 may include the at least one computer readable storage medium of any one of Examples 19 to 23, wherein the packaged on-die memory is to include one or more of a graphics cache or a graphics register file.

Example 25 may include a semiconductor package apparatus comprising means for identifying a redundant portion of a packaged on-die memory, means for detecting, during a field test of the packaged on-die memory, one or more failed memory cells in the packaged on-die memory, and means for substituting one or more memory cells in the redundant portion for the one or more failed memory cells.

Example 26 may include the apparatus of Example 25, wherein the means for substituting the one or more memory cells in the redundant portion for the one or more failed memory cells includes means for programming a fuse override to a permanent data structure.

Example 27 may include the apparatus of Example 25, wherein the field test is to include a built-in self-test (BIST) process.

Example 28 may include the apparatus of Example 25, further including means for executing the field test in response to one or more of a periodic timer expiration, a power down condition, a power up condition or an idleness condition.

Example 29 may include the apparatus of Example 25, wherein the redundant portion is to include one or more of redundant rows or redundant columns.

Example 30 may include the apparatus of any one of Examples 25 to 29, wherein the packaged on-die memory is to include one or more of a graphics cache or a graphics register file.

Technology described herein may therefore fully utilize redundant portions of memory when recovering from field failures during the lifetime of silicon. Accordingly, reliance solely on error correction code (ECC) solutions may be avoided. As a result, greater performance and extended lifespans may be achieved.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated. Additionally, it is understood that the indefinite articles "a" or "an" carries the meaning of "one or more" or "at least one".

As used in this application and in the claims, a list of items joined by the term "one or more of" may mean any combination of the listed terms. For example, the phrases "one or more of A, B or C" may mean A, B, C; A and B; A and C; B and C; or A, B and C.

The embodiments have been described above with reference to specific embodiments. Persons skilled in the art, however, will understand that various modifications and changes may be made thereto without departing from the broader spirit and scope of the embodiments as set forth in the appended claims. The foregoing description and drawings are, accordingly, to be regarded in an illustrative rather than a restrictive sense.

What is claimed is:

1. A system comprising:

a display;

a power supply to provide power to the system; and a semiconductor package apparatus including a substrate, an on-die memory coupled to the substrate, the on-die memory including a redundant portion, and logic coupled to the substrate, wherein the logic is implemented in one or more of configurable logic or fixed-functionality hardware logic, the logic to:

identify the redundant portion of the on-die memory, detect, during a field test of the on-die memory, one or more failed memory cells in the on-die memory, identify whether the redundant portion includes one or more remaining memory cells, in response to an identification that the redundant portion includes the one or more remaining memory cells, substitute the one or more remaining memory cells for the one or more failed memory cells, and in response to an identification that the redundant portion does not include the one or more remaining memory cells, reduce a size of the on-die memory.

2. The system of claim 1, wherein in response to the identification that the redundant portion includes the one or more remaining memory cells, the logic is to program a fuse override to a permanent data structure to substitute the one or more remaining memory cells in the redundant portion for the one or more failed memory cells.

3. The system of claim 1, wherein the field test is to include a built-in self-test process.

4. The system of claim 1, wherein:

the logic is to execute the field test in response to one or more of a periodic timer expiration associated with the on-die memory, each power down condition associated with the on-die memory, each power up condition associated with the on-die memory or an idleness condition associated with the on-die memory; and the periodic timer is to adapt over time in accordance with a likelihood of failure of the on-die memory.

5. The system of claim 1, wherein the redundant portion includes one or more of redundant rows or redundant columns.

6. The system of claim 1, wherein:

the on-die memory includes a graphics cache; and in response to the identification that the redundant portion does not include the one or more remaining memory cells, the logic is to decrease an available size of the graphics cache.

7. An apparatus comprising:

a substrate;

an on-die memory coupled to the substrate, the on-die memory including a redundant portion; and logic coupled to the substrate, wherein the logic is implemented in one or more of configurable logic or fixed-functionality hardware logic, the logic to:

identify the redundant portion of the on-die memory, detect, during a field test of the on-die memory, one or more failed memory cells in the on-die memory, identify whether the redundant portion includes one or more remaining memory cells, in response to an identification that the redundant portion includes the one or more remaining memory cells, substitute the one or more remaining memory cells in the redundant portion for the one or more failed memory cells, and in response to an identification that the redundant portion does not include the one or more remaining memory cells, reduce a size of the on-die memory.

8. The apparatus of claim 7, wherein in response to the identification that the redundant portion includes the one or more remaining memory cells, the logic is to program a fuse override to a permanent data structure to substitute the one or more remaining memory cells in the redundant portion for the one or more failed memory cells.

9. The apparatus of claim 7, wherein the field test is to include a built-in self-test process.

10. The apparatus of claim 7, wherein:

the logic is to execute the field test in response to one or more of a periodic timer expiration associated with the on-die memory, each power down condition associated with the on-die memory, each power up condition associated with the on-die memory or an idleness condition associated with the on-die memory; and the periodic timer is to adapt over time in accordance with a likelihood of failure of the on-die memory.

11. The apparatus of claim 7, wherein the redundant portion includes one or more of redundant rows or redundant columns.

12. The apparatus of claim 7, wherein:

the on-die memory includes a graphics cache; and in response to the identification that the redundant portion does not include the one or more remaining memory cells, the logic is to decrease an available size of the graphics cache.

13. A method comprising:

identifying a redundant portion of a packaged on-die memory;

detecting, during a field test of the packaged on-die memory, one or more failed memory cells in the packaged on-die memory;

identifying whether the redundant portion includes one or more remaining memory cells;

in response to an identification that the redundant portion includes the one or more remaining memory cells, substituting the one or more remaining memory cells for the one or more failed memory cells; and in response to an identification that the redundant portion does not include the one or more remaining memory cells, reducing a size of the packaged on-die memory.

14. The method of claim 13, wherein substituting the one or more remaining memory cells in the redundant portion for the one or more failed memory cells includes programming a fuse override to a permanent data structure.

15. The method of claim 13, wherein the field test includes a built-in self-test (BIST) process.

16. The method of claim 13, further including:

executing the field test in response to one or more of a periodic timer expiration associated with the packaged on-die memory, each power down condition associated with the packaged on-die memory, each power up condition associated with the packaged on-die memory or an idleness condition associated with the packaged on-die memory; and adapting the periodic timer over time in accordance with a likelihood of failure of the packaged on-die memory.

17. The method of claim 13, wherein the redundant portion includes one or more of redundant rows or redundant columns.

18. The method of claim 13, wherein:

the packaged on-die memory includes a graphics cache; and reducing the size of the packaged on-die memory includes decreasing an available size of the graphics cache.

19. At least one non-transitory computer readable storage medium comprising a set of instructions, which when executed by a computing system, cause the computing system to:

identify a redundant portion of a packaged on-die memory;

detect, during a field test of the packaged on-die memory, one or more failed memory cells in the packaged on-die memory;

identify whether the redundant portion includes one or more remaining memory cells; in response to an identification that the redundant portion includes the one or more remaining memory cells, substitute the one or more remaining memory cells for the one or more failed memory cells; and in response to an identification that the redundant portion does not include the one or more remaining memory cells, reduce a size of the packaged on-die memory.

20. The at least one non-transitory computer readable storage medium of claim 19, wherein in response to the identification that the redundant portion includes the one or more remaining memory cells, the instructions, when executed, cause the computing system to program a fuse override to a permanent data structure to substitute the one or more remaining memory cells in the redundant portion for the one or more failed memory cells.

21. The at least one non-transitory computer readable storage medium of claim 19, wherein the field test is to include a built-in self-test process.

22. The at least one non-transitory computer readable storage medium of claim 19, wherein the instructions, when executed, cause the computing system to:

execute the field test in response to one or more of a periodic timer expiration associated with the packaged on-die memory, each power down condition associated with the packaged on-die memory, each power up condition associated with the packaged on-die memory or an idleness condition associated with the packaged on-die memory; and adapt the periodic timer over time in accordance with a likelihood of failure of the packaged on-die memory.

23. The at least one non-transitory computer readable storage medium of claim 19, wherein the redundant portion is to include one or more of redundant rows or redundant columns.

24. The at least one non-transitory computer readable storage medium of claim 19, wherein:

the packaged on-die memory is to include a graphics cache; and in response to the identification that the redundant portion does not include the one or more remaining memory cells, the instructions, when executed, cause the computing system to decrease an available size of the graphics cache.

* * * * *